US012628427B2

(12) United States Patent
Shima et al.

(10) Patent No.: US 12,628,427 B2
(45) Date of Patent: May 12, 2026

(54) SEMICONDUCTOR DEVICE

(71) Applicant: Semiconductor Energy Laboratory Co., Ltd., Kanagawa-ken (JP)

(72) Inventors: Yukinori Shima, Tatebayashi (JP); Kenichi Okazaki, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 119 days.

(21) Appl. No.: 18/387,691

(22) Filed: Nov. 7, 2023

(65) Prior Publication Data

US 2024/0072073 A1     Feb. 29, 2024

Related U.S. Application Data

(63) Continuation of application No. 17/911,751, filed as application No. PCT/IB2021/051895 on Mar. 8, 2021, now Pat. No. 12,501,707.

(30) Foreign Application Priority Data

Mar. 20, 2020     (JP) ................................. 2020-050364

(51) Int. Cl.
  *H01L 27/12*          (2006.01)
  *H10D 86/01*          (2025.01)
        (Continued)

(52) U.S. Cl.
  CPC ........... *H10D 86/60* (2025.01); *H10D 86/021* (2025.01); *H10D 86/425* (2025.01); *H10D 86/471* (2025.01)

(58) Field of Classification Search
  CPC ............... H10D 30/6755; H10D 30/67; H10D 30/6739; H10D 30/6704; H10D 86/60;
        (Continued)

(56) References Cited

U.S. PATENT DOCUMENTS 7,061,565 B2    6/2006  Kwon et al.
8,389,989 B2    3/2013  Yamazaki et al.
        (Continued)

FOREIGN PATENT DOCUMENTS

CN        107623015 A        1/2018
CN        107785380 A        3/2018
        (Continued)

OTHER PUBLICATIONS

Taiwanese Office Action (Application No. 112145540) dated Oct. 29, 2024.
        (Continued)

*Primary Examiner* — Nikolay K Yushin
(74) *Attorney, Agent, or Firm* — Husch Blackwell LLP

(57)                    ABSTRACT

A semiconductor device having favorable electrical characteristics is provided. A highly reliable semiconductor device is provided. The semiconductor device includes a first transistor, a second transistor, a first insulating layer, and a second insulating layer. The first transistor includes a first semiconductor layer, a first gate insulating layer, and a first gate electrode. The first semiconductor layer includes a metal oxide. The second transistor includes a second semiconductor layer, a second gate insulating layer, and a second gate electrode. The second semiconductor layer includes crystalline silicon. The first insulating layer includes a region overlapping with the first transistor with the second insulating layer therebetween. The second insulating layer includes a region overlapping with the second transistor with the first insulating layer therebetween. The second insulating layer has higher film density than the first insulating layer.

18 Claims, 40 Drawing Sheets

(51) Int. Cl.
    *H10D 86/40*       (2025.01)
    *H10D 86/60*       (2025.01)

(58) Field of Classification Search
    CPC .... H10D 86/021; H10D 86/01; H10D 86/425;
               H10D 86/40; H10D 86/471; H10D
             86/423; H10D 86/451; H10K 59/1213;
             H10K 59/121; H10K 59/00; H10K
             77/111; H10K 77/10; H10K 2102/311
    See application file for complete search history.

(56)              References Cited

U.S. PATENT DOCUMENTS

| | | | |
|---|---|---|---|
| 8,514,340 | B2 | 8/2013 | Kwon et al. |
| 8,710,499 | B2 | 4/2014 | Yamazaki et al. |
| 9,105,735 | B2 | 8/2015 | Yamazaki et al. |
| 9,368,641 | B2 | 6/2016 | Yamazaki et al. |
| 9,437,594 | B2 | 9/2016 | Yamazaki et al. |
| 9,496,408 | B2 | 11/2016 | Yamazaki et al. |
| 9,640,670 | B2 | 5/2017 | Yamazaki et al. |
| 9,741,865 | B2 | 8/2017 | Yamazaki et al. |
| 9,793,295 | B2 | 10/2017 | Yamazaki et al. |
| 9,887,212 | B2 | 2/2018 | Kimura et al. |
| 9,899,536 | B2 | 2/2018 | Yamazaki et al. |
| 9,954,007 | B2 | 4/2018 | Yamazaki et al. |
| 9,985,055 | B2 | 5/2018 | Makita et al. |
| 10,134,785 | B2 | 11/2018 | Makita et al. |
| 10,141,337 | B2 | 11/2018 | Yamazaki et al. |
| 10,276,601 | B2 | 4/2019 | Kanda et al. |
| 10,418,384 | B2 | 9/2019 | Yamazaki et al. |
| 10,476,020 | B2 | 11/2019 | Kurata et al. |
| 10,651,209 | B2 | 5/2020 | Saitoh et al. |
| 10,665,615 | B2 | 5/2020 | Yamazaki et al. |
| 10,811,445 | B2 * | 10/2020 | Murai .................. H10D 86/423 |
| 10,826,008 | B2 | 11/2020 | Kurata et al. |
| 11,094,717 | B2 | 8/2021 | Yamazaki et al. |
| 11,404,447 | B2 | 8/2022 | Takahashi et al. |
| 11,862,643 | B2 | 1/2024 | Yamazaki et al. |
| 2005/0018097 | A1 | 1/2005 | Kwon et al. |
| 2006/0192907 | A1 | 8/2006 | Kwon et al. |
| 2009/0227053 | A1 | 9/2009 | Kwon et al. |
| 2012/0230114 | A1 | 9/2012 | Sekine |
| 2013/0320334 | A1 | 12/2013 | Yamazaki et al. |
| 2014/0027764 | A1 | 1/2014 | Yamazaki et al. |
| 2015/0263047 | A1 | 9/2015 | Kimura et al. |
| 2017/0033229 | A1 | 2/2017 | Yamazaki et al. |
| 2017/0309751 | A1 | 10/2017 | Yamazaki et al. |
| 2018/0019431 | A1 | 1/2018 | Kurata et al. |
| 2018/0061857 | A1 | 3/2018 | Kanda et al. |
| 2018/0158848 | A1 * | 6/2018 | Murai .................. H10D 86/423 |
| 2019/0035824 | A1 | 1/2019 | Saitoh et al. |
| 2020/0111816 | A1 | 4/2020 | Yamazaki et al. |
| 2020/0326571 | A1 * | 10/2020 | Hanada .................. H05B 33/02 |
| 2020/0357828 | A1 | 11/2020 | Takahashi et al. |
| 2024/0105733 | A1 | 3/2024 | Yamazaki et al. |

FOREIGN PATENT DOCUMENTS

| | | | |
|---|---|---|---|
| CN | 108172583 | A | 6/2018 |
| CN | 108496244 | A | 9/2018 |
| CN | 111587453 | A | 8/2020 |
| JP | 05-299653 | A | 11/1993 |
| JP | 2004-163901 | A | 6/2004 |
| JP | 2013-225620 | A | 10/2013 |
| JP | 2014-007399 | A | 1/2014 |
| JP | 2015-187904 | A | 10/2015 |
| JP | 2018-010234 | A | 1/2018 |
| JP | 2018-011086 | A | 1/2018 |
| JP | 2018-031976 | A | 3/2018 |
| JP | 2018-064020 | A | 4/2018 |
| JP | 2018-093082 | A | 6/2018 |
| KR | 2015-0107642 | A | 9/2015 |
| KR | 2018-0008266 | A | 1/2018 |
| TW | 201733127 | | 9/2017 |
| TW | 201804535 | | 2/2018 |
| TW | 201804623 | | 2/2018 |
| WO | WO-2011/027656 | | 3/2011 |
| WO | WO-2015/052991 | | 4/2015 |
| WO | WO-2017/130776 | | 8/2017 |
| WO | WO-2019/138734 | | 7/2019 |

OTHER PUBLICATIONS

International Search Report (Application No. PCT/IB2021/051895) dated Jun. 15, 2021.
Written Opinion (Application No. PCT/IB2021/051895) dated Jun. 15, 2021.
Taiwanese Office Action (Application No. 112145540), dated Apr. 30, 2025.
German Office Action (Application No. 112021001732.2), dated Oct. 30, 2025.

\* cited by examiner

604

634  341a 320a 306 320b 341b      141a 120a 112      120b 141b      624

118
110
103d
103c    }103
103b
103a
135

308n 308i  306                108n 108i  105      102
308                          108

604A 634A  341a 320a 306 320b 341b      141a 120a 112      120b 141b      624A 118
110
103d
103c    }103
103b
103a
135

308n 308i  306                108n 108i  106      102
308                          108

308a      315                                        102        133

308p      315                                        102        133

308      315                                         102        133

306

308      315                                         102        135
                                                                133

308  306  315                                        102        135
                                                                133

FIG. 28A
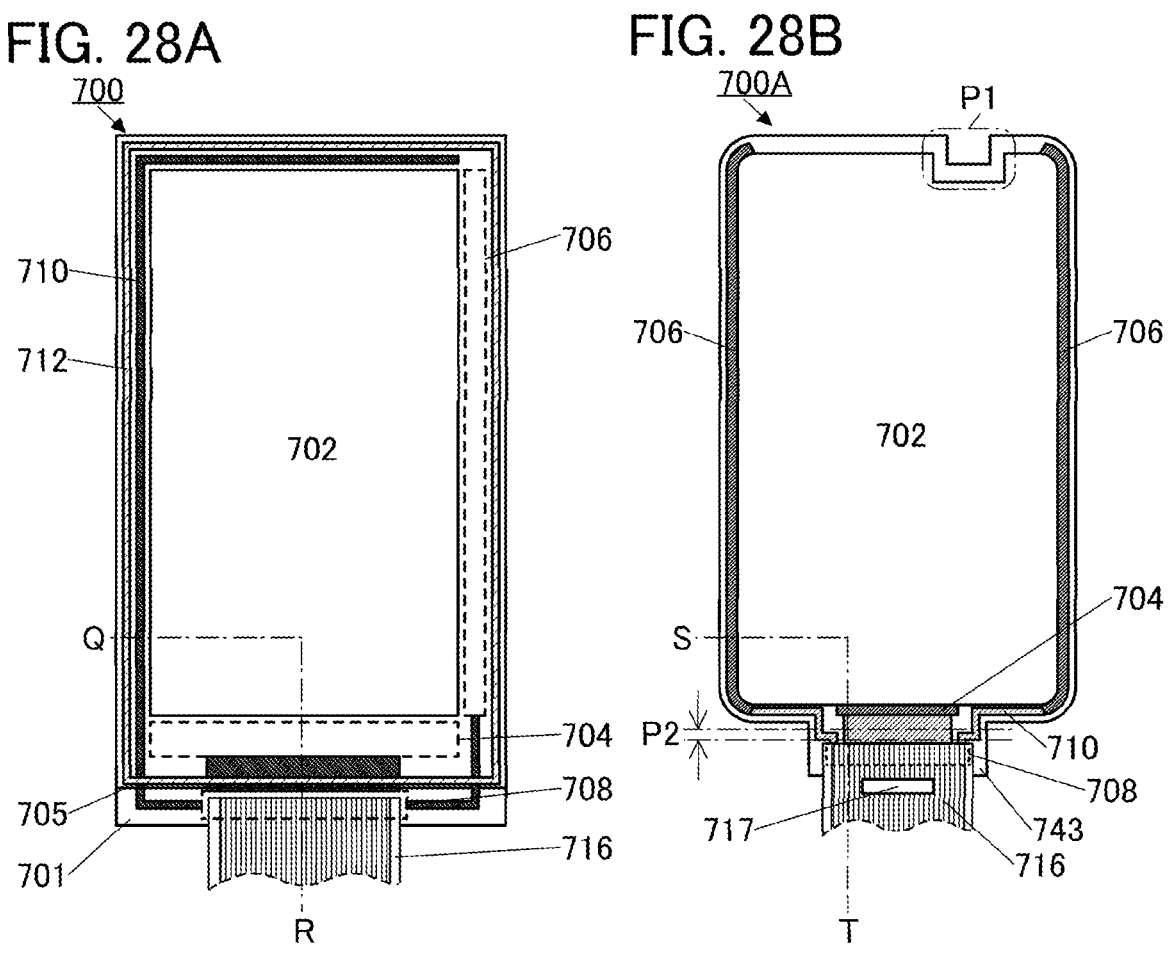
FIG. 28B
FIG. 28C
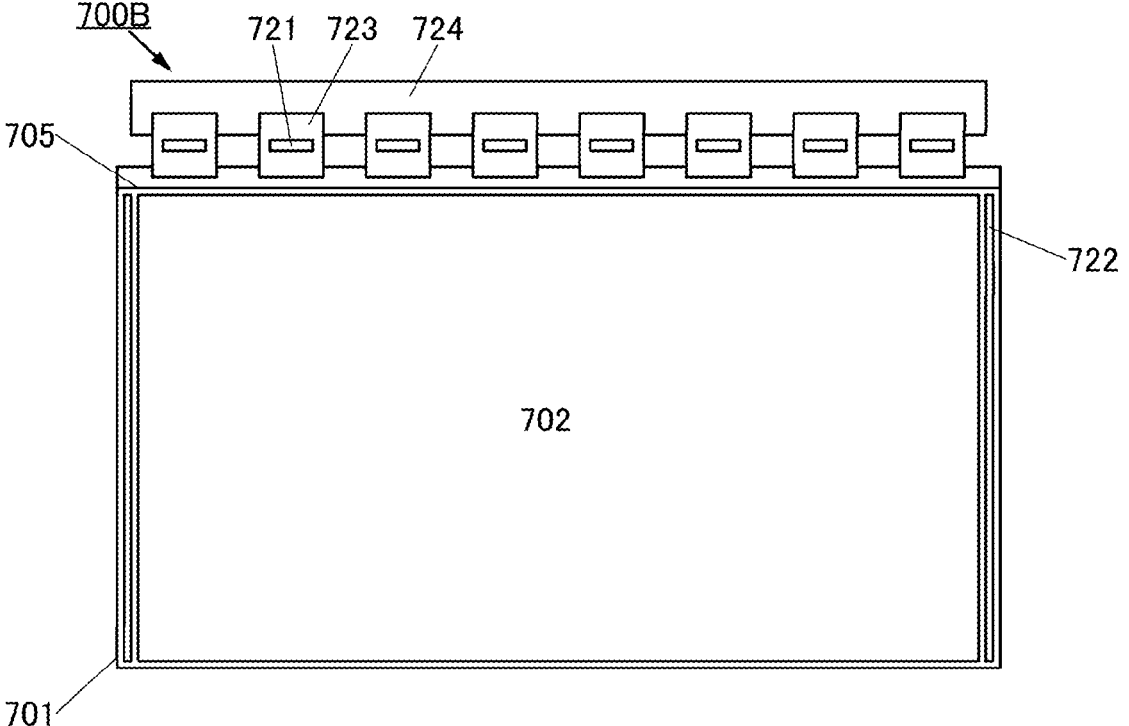

FIG. 34A
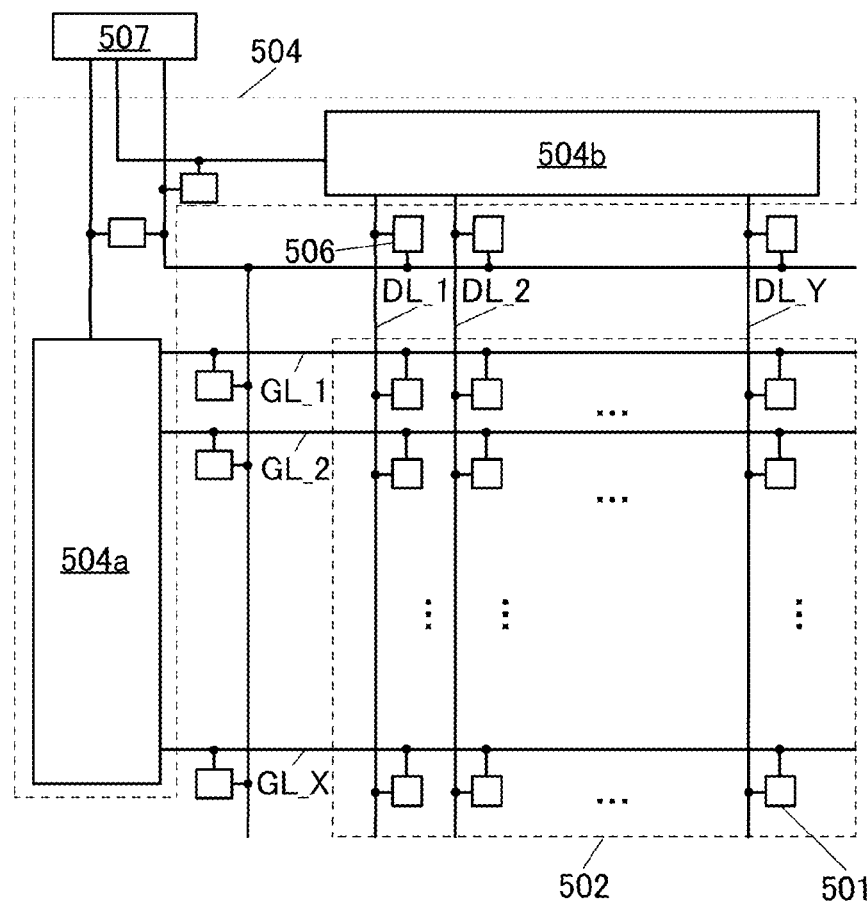
FIG. 34B
FIG. 34C
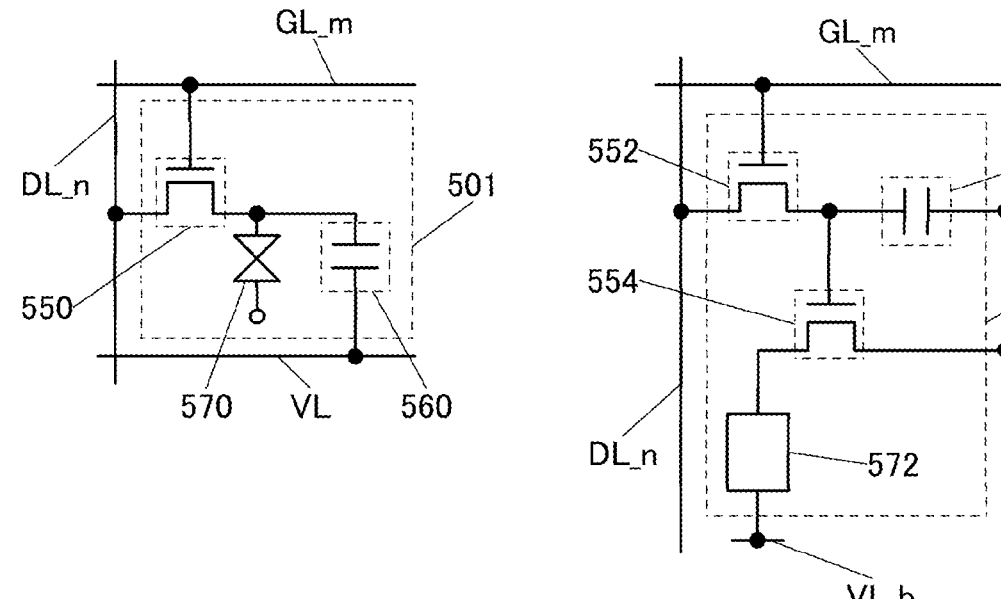

FIG. 35A
400
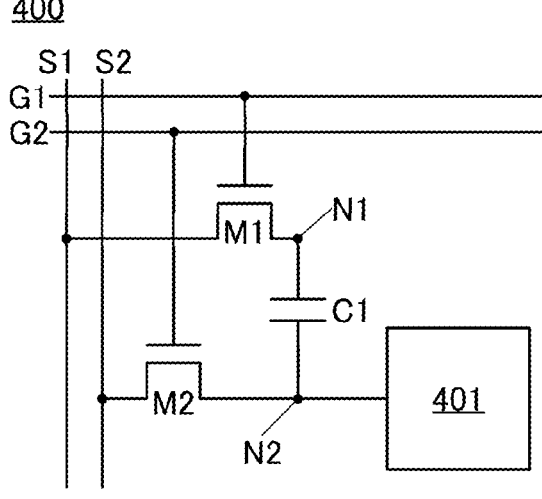
FIG. 35B
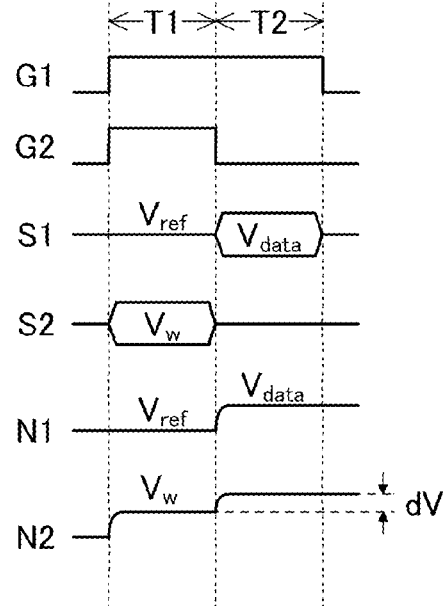
FIG. 35C
400LC
FIG. 35D
400EL
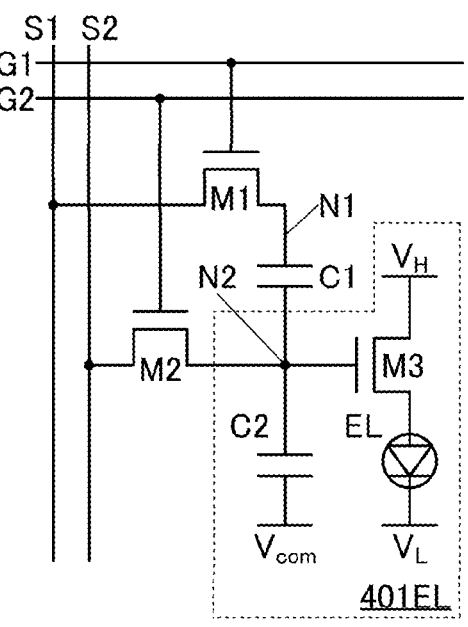

6001

6005

6006

6000

6009

6010

6011

6002

6000

6018 6001

6017a

6017b 6015 6006 6010 6011 6009 6016 6002

FIG. 38A
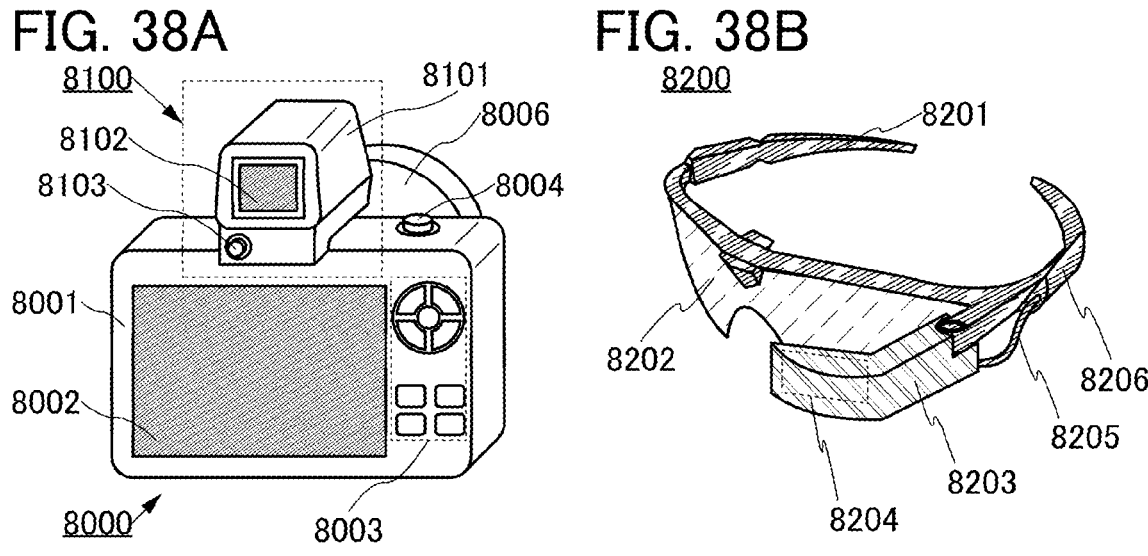
FIG. 38B
FIG. 38C
FIG. 38D
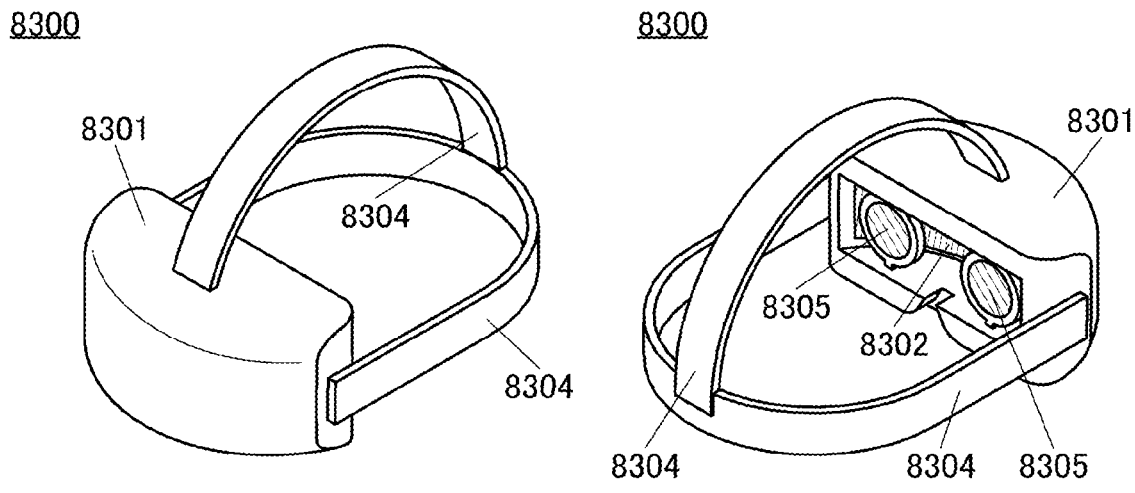
FIG. 38E
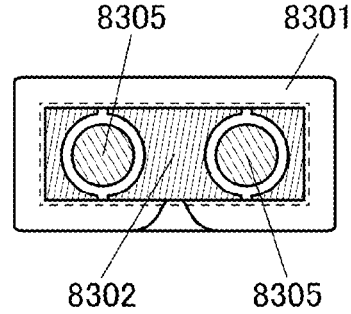

FIG. 39A
9100
FIG. 39D
9200
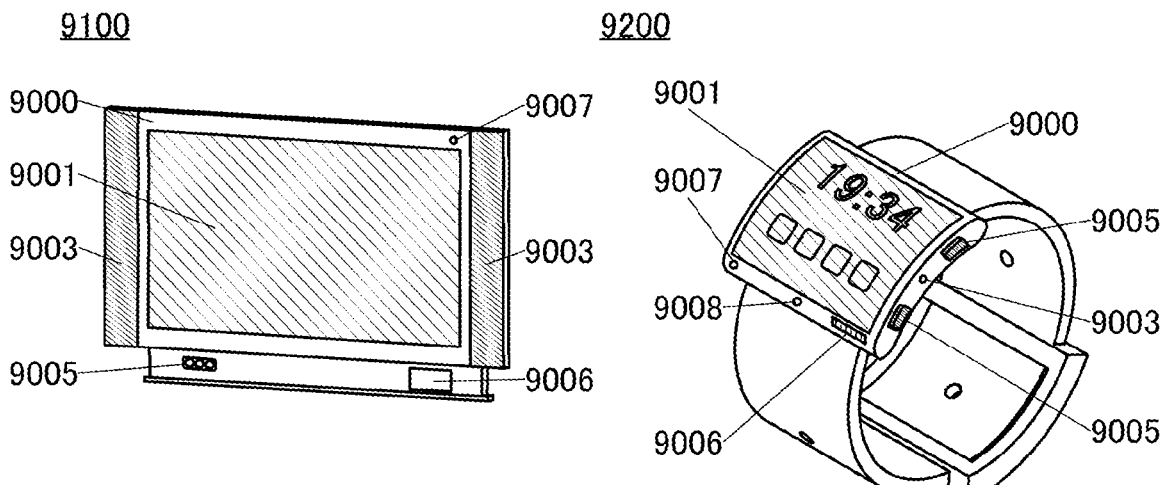
FIG. 39B
9101
FIG. 39E
9201
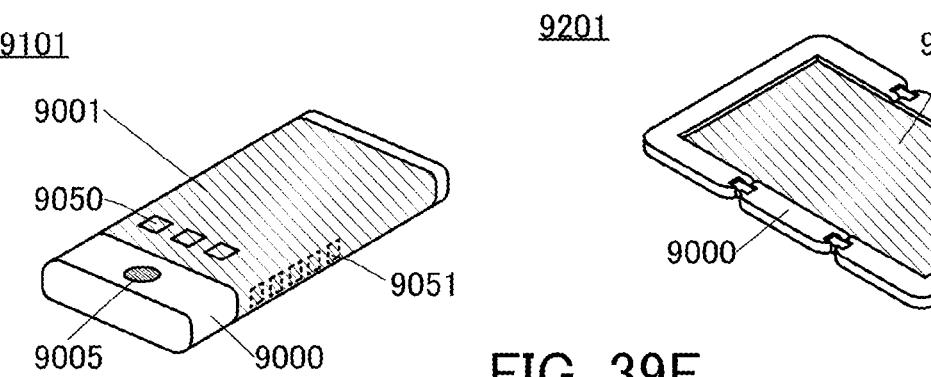
FIG. 39C
9102
FIG. 39F
9201
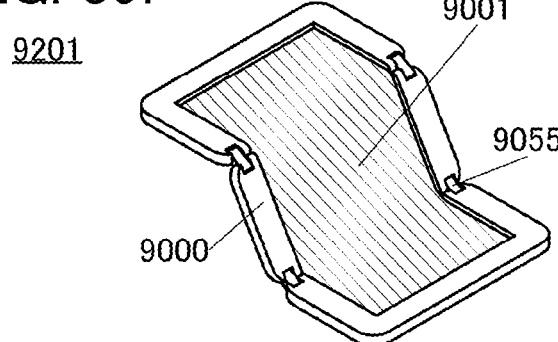
FIG. 39G
9201
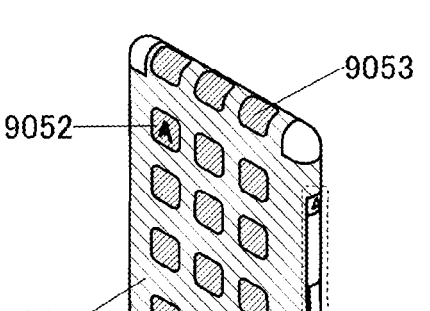
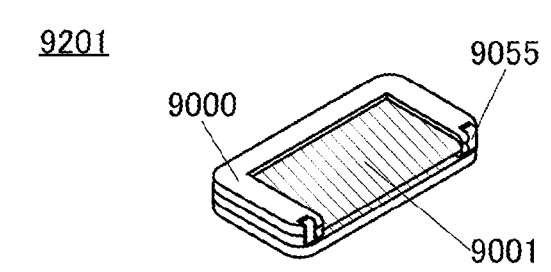

7100

7101

7500

7103

7111

7200

7211

7500

7212

7213

7214

7300

7301

7303

7500

7311

7400

7401

7500

7311

SEMICONDUCTOR DEVICE

This application is a continuation of copending U.S. application Ser. No. 17/911,751, filed on Sep. 15, 2022 which is 371 of international application PCT/IB2021/051895 filed on Mar. 8, 2021 which are all incorporated herein by reference.

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above-described technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device in which the field-effect mobility (simply referred to as mobility or μFE in some cases) is increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case of using amorphous silicon; therefore, a high-performance display device provided with driver circuits can be obtained.

There is a trend in a display device toward a larger screen, and development taking a screen size of 60 inches diagonal or more or 120 inches diagonal or more into consideration has been progressed. Furthermore, there is a trend in the definition of a screen toward a higher resolution, for example, full high definition (the number of pixels: 1920×1080; also referred to as "2K", for example), ultra high definition (the number of pixels: 3840×2160; also referred to as "4K", for example), and super high definition (the number of pixels: 7680×4320; also referred to as "8K", for example).

An increase in screen size or resolution tends to increase wiring resistance in a display portion. Patent Document 2 discloses a technique of forming a low-resistance wiring layer using copper (Cu) in order to suppress an increase in wiring resistance in a liquid crystal display device using an amorphous silicon transistor.

REFERENCES

Patent Documents

[Patent Document 1] Japanese Published Patent Application No. 2014-7399
[Patent Document 2] Japanese Published Patent Application No. 2004-163901

SUMMARY OF THE INVENTION

Problems to be Solved by the Invention

An object of one embodiment of the present invention is to provide a semiconductor device having favorable electrical characteristics. Another object of one embodiment of the present invention is to provide a highly reliable semiconductor device. Another object of one embodiment of the present invention is to provide a small semiconductor device. Another object of one embodiment of the present invention is to provide a semiconductor device with low power consumption. Another object of one embodiment of the present invention is to provide a novel semiconductor device.

Another object of one embodiment of the present invention is to provide a high-resolution display device. Another object of one embodiment of the present invention is to provide a display device with high operating speed. Another object of one embodiment of the present invention is to provide a highly reliable display device. Another object of one embodiment of the present invention is to provide a display device with a narrow frame. Another object of one embodiment of the present invention is to provide a display device with low power consumption. Another object of one embodiment of the present invention is to provide a novel display device.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including a first transistor; a second transistor; a first insulating layer; and a second insulating layer. The first transistor includes a first semiconductor layer, a first gate insulating layer, and a first gate electrode. The first semiconductor layer includes a metal oxide. The first gate electrode includes a region overlapping with the first semiconductor layer with the first gate insulating layer therebetween. The second transistor includes a second semiconductor layer, a second gate insulating layer, and a second gate electrode. The second semiconductor layer includes crystalline silicon. The second gate electrode includes a region overlapping with the second semiconductor layer with the second gate insulating layer therebetween. The first insulating layer includes a region overlapping with the first transistor with the second insulating layer therebetween. The second insulating layer includes a region overlapping with the second transistor with the first insulating layer therebetween. The second insulating layer preferably has higher film density than the first insulating layer.

In the above-described semiconductor device, the first gate electrode preferably includes a region overlapping with the second insulating layer with the first semiconductor layer therebetween.

In the above-described semiconductor device, the first transistor preferably includes a third gate insulating layer and a third gate electrode. The third gate electrode preferably includes a region overlapping with the first semiconductor layer with the third gate insulating layer therebetween. The second insulating layer preferably includes a region overlapping with the third gate insulating layer with the third gate electrode therebetween.

In the above-described semiconductor device, the first transistor preferably includes a third gate electrode. The third gate electrode preferably includes a region overlapping with the first semiconductor layer with the first insulating layer and the second insulating layer therebetween.

In the above-described semiconductor device, the third gate electrode is preferably formed by processing the same conductive film as the second gate electrode.

In the above-described semiconductor device, the second semiconductor layer preferably includes a first region and a pair of second regions between which the first region is sandwiched, and the first region preferably includes a region overlapping with the second gate electrode. The third gate electrode preferably includes crystalline silicon. The second regions and the third gate electrode each preferably include one or more selected from boron, aluminum, gallium, indium, phosphorus, arsenic, antimony, and bismuth.

In the above-described semiconductor device, the first semiconductor layer preferably includes a region overlapping with the second insulating layer with the first gate electrode therebetween.

One embodiment of the present invention is a semiconductor device including a first transistor and a second transistor. The first transistor includes a first semiconductor layer, a first gate insulating layer, and a first gate electrode. The first semiconductor layer includes a metal oxide. The first gate electrode includes a region overlapping with the first semiconductor layer with the first gate insulating layer therebetween. The second transistor includes a second semiconductor layer, a second gate insulating layer, and a second gate electrode. The second semiconductor layer includes crystalline silicon. The second gate electrode includes a region overlapping with the second semiconductor layer with the second gate insulating layer therebetween. The first gate insulating layer includes a first insulating layer and a second insulating layer over the first insulating layer. The second insulating layer includes a region overlapping with the second transistor with the first insulating layer therebetween. The second insulating layer preferably has higher film density than the first insulating layer.

In the above-described semiconductor device, the first gate electrode is preferably formed by processing the same conductive film as the second gate electrode.

In the above-described semiconductor device, the second semiconductor layer preferably includes a first region and a pair of second regions between which the first region is sandwiched, and the first region preferably includes a region overlapping with the second gate electrode. The first gate electrode preferably includes crystalline silicon. The second regions and the first gate electrode each preferably include one or more selected from boron, aluminum, gallium, indium, phosphorus, arsenic, antimony, and bismuth.

In the above-described semiconductor device, the second semiconductor layer preferably includes a region overlapping with the first insulating layer with the second gate electrode therebetween.

In the above-described semiconductor device, the second gate electrode preferably includes a region overlapping with the first insulating layer with the second semiconductor layer therebetween.

One embodiment of the present invention is a method for manufacturing a semiconductor device including: forming a first transistor including a first semiconductor layer including crystalline silicon, a first gate insulating layer, and a first gate electrode; forming a first insulating layer over the first transistor; forming a second insulating layer having a higher film density than the first insulating layer over the first insulating layer; forming a second semiconductor layer including a metal oxide over the second insulating layer; forming a second gate insulating layer over the second insulating layer and the second semiconductor layer; forming a conductive film over the second gate insulating layer; and processing the conductive film to form a second gate electrode of a second transistor including the second semiconductor layer and the second gate insulating layer and a wiring electrically connected to the first semiconductor layer.

Effect of the Invention

With one embodiment of the present invention, a semiconductor device having favorable electrical characteristics can be provided. A highly reliable semiconductor device can be provided. A small semiconductor device can be provided. A semiconductor device with low power consumption can be provided. A novel semiconductor device can be provided.

With one embodiment of the present invention, a high-resolution display device can be provided. A display device with high operating speed can be provided. A highly reliable display device can be provided. A display device with a narrow frame can be provided. A display device with low power consumption can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 28A, FIG. 28B, and FIG. 28C are top views of display devices.

FIG. 34A is a block diagram of a display device. FIG. 34B and FIG. 34C are circuit diagrams of the display device.

FIG. 35A, FIG. 35C, and FIG. 35D are circuit diagrams of display devices. FIG. 35B is a timing chart of the display device.

FIG. 38A, FIG. 38B, FIG. 38C, FIG. 38D, and FIG. 38E are diagrams illustrating structure examples of electronic devices.

FIG. 39A, FIG. 39B, FIG. 39C, FIG. 39D, FIG. 39E, FIG. 39F, and FIG. 39G are diagrams illustrating structure examples of electronic devices.

MODE FOR CARRYING OUT THE INVENTION

Figure 1A:
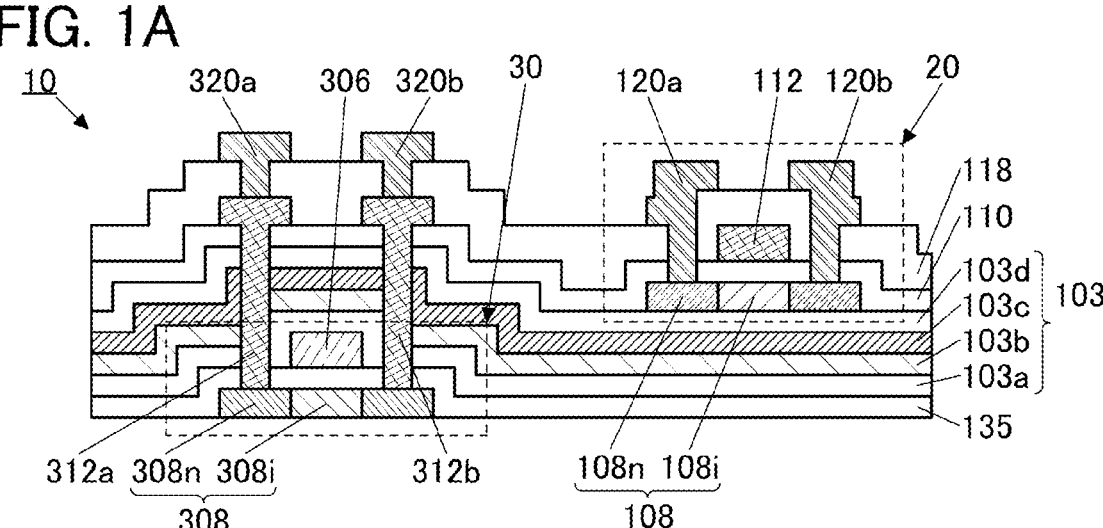
FIG. 1A, FIG. 1B, and FIG. 1C are cross-sectional views illustrating structure examples of a semiconductor device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first", "second", and "third" used in this specification and the like are used in order to avoid confusion among components and do not limit the components numerically.

In this specification and the like, terms for describing arrangement, such as "over" and "under", are used for convenience to describe the positional relation between components with reference to drawings. Furthermore, the positional relation between components is changed as appropriate in accordance with a direction in which the components are described. Thus, terms for the description are not limited to those used in the specification, and the description can be rephrased appropriately depending on the situation.

In this specification and the like, functions of a source and a drain of a transistor are sometimes interchanged with each other when a transistor of opposite polarity is employed or the direction of a current is changed in a circuit operation, for example. Therefore, the terms "source" and "drain" can be used interchangeably.

In this specification and the like, the channel length direction of a transistor refers to one of directions parallel to the straight line that connects a source region and a drain region in the shortest distance. In other words, the channel length direction corresponds to one of directions of a current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function." Here, there is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film", respectively.

In this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and an end portion of the upper layer is positioned inward from an end portion of the lower layer or an end portion of the upper layer is positioned outward from an end portion of the lower layer; such a case is also represented by the expression "having substantially the same top surface shapes".

Unless otherwise specified, an off-state current in this specification and the like refers to a drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In this specification and the like, a display panel that is one embodiment of a display device has a function of displaying (outputting) an image or the like on (to) a display surface. Therefore, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

Note that in this specification and the like, a touch panel that is one embodiment of a display device has a function of displaying an image or the like on a display surface and a function of a touch sensor that senses the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a structure in which a connector and an IC are mounted on a substrate of a touch panel is referred to as a touch panel module or a display module, or simply as a touch panel or the like in some cases.

Embodiment 1

In this embodiment, a semiconductor device of one embodiment of the present invention and a manufacturing method thereof are described.

One embodiment of the present invention is a semiconductor device including a first transistor, a second transistor, a first insulating layer, and a second insulating layer. The first transistor includes a first semiconductor layer, a first gate insulating layer, and a first gate electrode. The first gate electrode includes a region overlapping with the first semiconductor layer with the first gate insulating layer therebetween. The second transistor includes a second semiconductor layer, a second gate insulating layer, and a second gate electrode. The second gate electrode includes a region overlapping with the second semiconductor layer with the second gate insulating layer therebetween. The first insulating layer preferably includes a region overlapping with the first transistor with the second insulating layer therebetween.

The second insulating layer preferably includes a region overlapping with the second transistor with the first insulating layer therebetween. Furthermore, the second insulating layer preferably has a lower hydrogen-transmitting property than the first insulating layer. By using a film having higher film density than the first insulating layer as the second insulating layer, hydrogen transmission from the first insulating layer side to the first transistor side can be suppressed.

One embodiment of the present invention is a semiconductor device including a first transistor and a second transistor. The first transistor includes a first semiconductor layer, a first gate insulating layer, and a first gate electrode. The first gate electrode includes a region overlapping with the first semiconductor layer with the first gate insulating layer therebetween. The second transistor includes a second semiconductor layer, a second gate insulating layer, and a second gate electrode. The second gate electrode includes a region overlapping with the second semiconductor layer with the second gate insulating layer therebetween. The first gate insulating layer preferably includes a first insulating layer and a second insulating layer over the first insulating layer. The second insulating layer preferably includes a region overlapping with the second transistor with the first insulating layer therebetween. Furthermore, the second insulating layer preferably has a lower hydrogen-transmitting property than the first insulating layer. By using a film having higher film density than the first insulating layer as the second insulating layer, hydrogen transmission from the first insulating layer side to the first transistor side can be suppressed.

As the first transistor, a transistor including a metal oxide (hereinafter, also referred to as an oxide semiconductor) (hereinafter, also referred to as an OS transistor) can be used. An OS transistor has extremely higher field-effect mobility than a transistor including amorphous silicon. In addition, the OS transistor has an extremely low leakage current between a source and a drain in an off state (hereinafter, also referred to as an off-state current), and charge accumulated in a capacitor that is connected in series to the transistor can be held for a long period. By using an OS transistor, a semiconductor device can have low power consumption.

As the second transistor, a transistor including silicon (hereinafter, also referred to as a Si transistor) can be used. In particular, a transistor including low-temperature polysilicon (LTPS) (hereinafter, also referred to as an LTPS transistor) can suitably be used. The LTPS transistor has high field-effect mobility and excellent frequency characteristics. By using an LTPS transistor, the semiconductor device is capable of high-speed operation.

In the semiconductor device that is one embodiment of the present invention, a Si transistor is used as a transistor that is required to have high field-effect mobility, an OS transistor is used as a transistor that is required to have a small leakage, and these transistors are provided over the same substrate, whereby parts costs and mounting costs can be reduced. Further, the semiconductor device that is one embodiment of the present invention includes an OS transistor and a Si transistor, whereby a semiconductor device achieving both low power consumption and high-speed operation can be obtained. Moreover, a semiconductor device with favorable electrical characteristics and high reliability can be obtained.

The semiconductor device that is one embodiment of the present invention can be used for a display device. For example, it is possible to use an OS transistor as a transistor or the like functioning as a switch for controlling electrical continuity between wirings and a Si transistor as a transistor or the like for controlling a current. In particular, an LTPS transistor is preferably used as the transistor or the like for controlling a current. With this structure, a display device achieving both low power consumption and high-speed operation can be obtained. Moreover, a display device with favorable electrical characteristics and high reliability can be obtained.

The first insulating layer includes a region positioned between the OS transistor and the Si transistor. The first insulating layer preferably includes a region overlapping with the OS transistor and preferably includes a region overlapping with the Si transistor. The first insulating layer includes a region from which hydrogen is released by application of heat. Dangling bonds of silicon included in the Si transistor are terminated with hydrogen released from the first insulating layer, whereby the Si transistor can have favorable electrical characteristics. In addition, the Si transistor can have high reliability.

However, when hydrogen released from the first insulating layer diffuses into the OS transistor, the hydrogen deprives the metal oxide of oxygen and oxygen vacancies (hereinafter, also referred to as $V_O$) are generated in the metal oxide in some cases. Defects (hereinafter, also referred to as $V_O H$) generated by entry of hydrogen into the oxygen vacancies ($V_O$) can serve as carrier supply sources. In particular, when hydrogen diffuses into a channel formation region, the carrier concentration in the channel formation region becomes high and electrical characteristics of the OS transistor are degraded in some cases. In the semiconductor device that is one embodiment of the present invention, the second insulating layer having a lower hydrogen-transmitting property is provided between the first insulating layer and the OS transistor, whereby hydrogen diffusion into the OS transistor can be inhibited and the OS transistor can have favorable electrical characteristics. In addition, the OS transistor can have high reliability.

The semiconductor device that is one embodiment of the present invention can be manufactured by forming the OS transistor after the Si transistor is formed. Since the OS transistor can be manufactured at a low temperature, the OS transistor can be formed without degrading the electrical characteristics and reliability of the Si transistor; thus, the semiconductor device can achieve both favorable electrical characteristics and high reliability.

More specific structure examples are described below with reference to drawings.

Structure Example 1

Structure Example 1-1

A schematic cross-sectional view of a semiconductor device 10 that is one embodiment of the present invention is illustrated in FIG. 1A. The semiconductor device 10 includes a transistor 20 and a transistor 30. FIG. 1A illustrates a schematic cross-sectional view of the transistor 20 and the transistor 30 in the channel length direction.

As each of semiconductors used in the transistor 20 and the transistor 30, a Group 14 semiconductor (e.g., silicon or germanium), a compound semiconductor such as gallium arsenide, an organic semiconductor, a metal oxide, or the like can be used. The semiconductor used in the transistor 20 and the semiconductor used in the transistor 30 may each be a non-single-crystal semiconductor (e.g., an amorphous semiconductor, a microcrystalline semiconductor, or a polycrystalline semiconductor) or a single crystal semiconductor. The semiconductor used in the transistor 20 and the semiconductor used in the transistor 30 may be materials of the same type or materials of different types.

For example, amorphous silicon can be used as the semiconductors used in the transistor and the transistor 30. In particular, amorphous silicon has high mass productivity and can be easily provided over a large-sized substrate. Note that amorphous silicon used in a transistor contains a large amount of hydrogen in general. Thus, amorphous silicon containing a large amount of hydrogen may be referred to as "hydrogenated amorphous silicon" or "a-Si:H". Amorphous silicon can be formed at a temperature lower than that for polycrystalline silicon; thus, the highest temperature in a manufacturing process can be lowered. Therefore, low heat-resistance materials can be used for a substrate, a conductive layer, an insulating layer, and the like.

For example, as the semiconductors used in the transistor 20 and the transistor 30, silicon having crystallinity, such as microcrystalline silicon, polycrystalline silicon, or single crystal silicon, can also be used. In particular, polycrystalline silicon which is referred to as low-temperature poly-silicon (LTPS) can be formed at a temperature lower than the temperature at which single crystal silicon is formed and has higher field-effect mobility and higher reliability than amorphous silicon.

For example, as the semiconductors used in the transistor 20 and the transistor 30, a metal oxide can be used. Typically, an oxide semiconductor containing indium, or the like can be used. A transistor using a metal oxide can achieve higher field-effect mobility and higher reliability than a transistor using amorphous silicon. A transistor using a metal oxide is excellent in mass productivity and thus is easily provided over a large-sized substrate.

The transistor 20 includes a semiconductor layer 108, an insulating layer 110, and a conductive layer 112. The insulating layer 110 functions as a gate insulating layer. The conductive layer 112 includes a region overlapping with the semiconductor layer 108 with the insulating layer 110 therebetween and functions as a gate electrode. The transistor 20 is what is called a top-gate transistor, in which the gate electrode is provided over the semiconductor layer 108. As the semiconductor layer 108, a metal oxide can be suitably used, for example.

The transistor 30 includes a semiconductor layer 308, an insulating layer 135, and a conductive layer 306. The insulating layer 135 functions as a gate insulating layer. The conductive layer 306 includes a region overlapping with the semiconductor layer 308 with the insulating layer 135 therebetween and functions as a gate electrode. The transistor 30 is what is called a top-gate transistor, in which the gate electrode is provided over the semiconductor layer 308. As the semiconductor layer 308, silicon can be suitably used, for example. As the semiconductor layer 308, crystalline silicon can be suitably used, and in particular low-temperature polysilicon (LTPS) can be suitably used.

In the semiconductor device 10 that is one embodiment of the present invention, different materials can be used as the semiconductor layer 108 of the transistor 20 and the semiconductor layer 308 of the transistor 30. With the transistors including different semiconductor layer materials from each other, the semiconductor device 10 can be a high-performance semiconductor device utilizing an advantage of each of the transistors. Providing the transistor 20 over the transistor 30 allows the semiconductor device 10 to be downsized. By using the semiconductor device that is one embodiment of the present invention, a high-resolution display device can be provided.

The transistor 20 is described in detail.

The semiconductor layer 108 includes a region 108_i_ and a pair of regions 108_n_. The region 108_i_ includes a region overlapping with the conductive layer 112 with the insulating layer 110 therebetween and functions as a channel formation region. The electric resistance of the region 108_i_ in a state where the channel is not formed is preferably as high as possible. For example, the sheet resistance of the region 108_i_ is preferably higher than or equal to $1 \times 10^7$ Ω/square, further preferably higher than or equal to $1 \times 10^8$ Ω/square, still further preferably higher than or equal to $1 \times 10^9$ Ω/square.

The pair of regions 108_n_ are provided with the region 108_i_ therebetween. The regions 108_n_ have lower resistance than the region 108_i_ and function as a source region and a drain region. The electric resistance of the regions 108_n_ is preferably as low as possible; for example, the sheet resistance of the regions 108_n_ is preferably higher than or equal to 1 Ω/square and lower than $1 \times 10^3$ Ω/square, further preferably higher than or equal to 1 Ω/square and lower than or equal to $8 \times 10^2$ Ω/square. The above-mentioned upper limits and lower limits can be combined freely.

The electric resistance of the region 108_i_ in a state where the channel is not formed is preferably more than or equal to $1 \times 10^6$ times and less than or equal to $1 \times 10^{12}$ times, further preferably more than or equal to $1 \times 10^6$ times and less than or equal to $1 \times 10^{11}$ times, still further preferably more than or equal to $1 \times 10^6$ times and less than or equal to $1 \times 10^{10}$ times the electric resistance of the regions 108_n_. The above-mentioned upper limits and lower limits can be combined freely.

With the above-mentioned resistance values, the transistor 20 can have a high switching characteristics with both a high on-state current and a low off-state current.

The carrier concentration in the region 108_i_ functioning as the channel formation region is preferably as low as possible and is preferably lower than or equal to $1 \times 10^{18}$ cm$^{-3}$, further preferably lower than or equal to $1 \times 10^{17}$ cm$^{-3}$, still further preferably lower than or equal to $1 \times 10^{16}$ cm$^{-3}$, yet further preferably lower than or equal to $1 \times 10^{13}$ cm$^{-3}$, yet still further preferably lower than or equal to $1 \times 10^{12}$ cm$^{-3}$. Note that the lower limit of the carrier concentration in the region 108_i_ is not particularly limited but can be, for example, $1 \times 10^7$ cm$^{-3}$.

Meanwhile, the carrier concentration in the regions 108_n_ can be higher than or equal to $5 \times 10^{18}$ cm$^{-3}$, preferably higher than or equal to $1 \times 10^{19}$ cm$^{-3}$, further preferably higher than or equal to $5 \times 10^{19}$ cm$^{-3}$, for example. The upper limit of the carrier concentration of the regions 108_n_ is not particularly limited and can be, for example, $5 \times 10^{21}$ cm' or $1 \times 10^{22}$ cm$^{-3}$. With the above-mentioned carrier concentration value, the transistor 20 can have a high switching characteristics with both a high on-state current and a low off-state current.

The region 108_n_ is a region containing a first element. As the first element, for example, one or more of hydrogen, boron, carbon, nitrogen, fluorine, phosphorus, sulfur, arsenic, aluminum, magnesium, helium, neon, argon, krypton, and xenon can be used. In particular, one or more of hydrogen, boron, nitrogen, and phosphorus can be suitably used as the first element.

The concentration of the first element in the semiconductor layer 108 can be analyzed by an analysis method such as secondary ion mass spectrometry (SIMS) or X-ray photoelectron spectroscopy (XPS), for example. In the case of using XPS analysis, ion sputtering from the top surface side or the back surface side is combined with XPS analysis, whereby the concentration distribution in the depth direction can be found. Note that in the case where the concentration of the first element is low, the first element is not detected or is lower than or equal to the lower detection limit in the analysis in some cases. In particular, since the concentration of the first element in the region 108_i_ is low, the first element is not detected or is lower than or equal to the lower detection limit in the analysis in some cases.

The semiconductor layer 108 contains a metal oxide exhibiting semiconductor characteristics (hereinafter, also referred to as an oxide semiconductor). The semiconductor layer 108 preferably contains at least indium and oxygen. When the semiconductor layer 108 contains an oxide of indium, the carrier mobility can be increased. For example, a transistor that can flow a higher current than a transistor using amorphous silicon can be provided. A metal oxide containing at least zinc and oxygen can be used in the semiconductor layer 108. When an oxide of zinc is included, the carrier mobility can be increased.

There is no particular limitation on the crystallinity of a semiconductor material used for the semiconductor layer 108, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer 108 preferably contains a metal oxide. Alternatively, the semiconductor layer 108 may contain silicon. Examples of silicon include amorphous silicon and crystalline silicon (polycrystalline polysilicon, microcrystalline silicon, single crystal silicon, or the like).

In the case of using a metal oxide, the semiconductor layer 108 preferably contains indium, an element M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, the element M is preferably one or more of aluminum, gallium, yttrium, and tin. The element M further preferably contains one or both of gallium and tin.

An oxide containing indium (In), gallium (Ga), and zinc (Zn) (hereinafter, also referred to as IGZO), for example, can be suitably used for the semiconductor layer 108. For example, an oxide with an atomic ratio of metal elements of In:Ga:Zn=1:1:1 or in the neighborhood thereof can be suitably used for the semiconductor layer 108.

As the semiconductor layer 108, an oxide containing, in addition to indium, gallium, and zinc, one or more of aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium can also be used. In particular, an oxide containing tin, aluminum, or silicon in addition to indium, gallium, and zinc is preferably used as the semiconductor layer, in which case a transistor with high field-effect mobility can be obtained.

In the case where the semiconductor layer 108 is an In-M-Zn oxide, a sputtering target used for depositing the In-M-Zn oxide preferably has the atomic ratio of In to the element M higher than or equal to 1. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:

3, In:M:Zn=5:1:4, In:M:Zn=5:1:5, In:M:Zn=5:1:6, In:M:Zn=5:1:7, In:M:Zn=5:1:8, In:M:Zn=6:1:6, In:M:Zn=5:2:5, In:M:Zn=10:1:3, In:M:Zn=10:1:4, In:M:Zn=10:1:5, In:M:Zn=10:1:6, In:M:Zn=10:1:7, and In:M:Zn=10:1:8. In the case where two or more kinds of elements are contained as the element M, the proportion of the element M in the atomic ratio corresponds to the sum of the number of atoms of the two or more metal elements.

A target containing a polycrystalline oxide is preferably used as the sputtering target, in which case the semiconductor layer having crystallinity is easily formed. Note that the atomic ratio in the formed semiconductor layer may vary in the range of ±40% from any of the above-mentioned atomic ratios of the metal elements contained in the sputtering target. For example, in the case where the composition of a sputtering target used for the semiconductor layer is In:M:Zn=4:2:4.1 [atomic ratio], the composition of the formed semiconductor layer is sometimes in the neighborhood of In:M:Zn=4:2:3 [atomic ratio].

Note that when the atomic ratio is described as In:M:Zn=4:2:3 or in the neighborhood thereof, the case is included where the element M is greater than or equal to 1 and less than or equal to 3 and Zn is greater than or equal to 2 and less than or equal to 4 with In being 4. When the atomic ratio is described as In:M:Zn=5:1:6 or in the neighborhood thereof, the case is included where M is greater than 0.1 and less than or equal to 2 and Zn is greater than or equal to 5 and less than or equal to 7 with In being 5. When the atomic ratio is described as In:M:Zn=1:1:1 or in the neighborhood thereof, the case is included where the element M is greater than 0.1 and less than or equal to 2 and Zn is greater than 0.1 and less than or equal to 2 with In being 1.

Here, the composition of the semiconductor layer 108 is described. The semiconductor layer 108 preferably contains a metal oxide containing at least indium and oxygen. Moreover, the semiconductor layer 108 may contain zinc additionally. The semiconductor layer 108 may contain gallium.

For example, a metal oxide film having any of the following atomic ratios of metal elements can be used as the semiconductor layer 108: In:Ga:Zn=1:1:1, In:Ga:Zn=1:1:1.2, In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:4, In:Ga:Zn=5:1:5, In:Ga:Zn=5:1:6, In:Ga:Zn=5:1:7, In:Ga:Zn=5:1:8, In:Ga:Zn=6:1:6, In:Ga:Zn=5:2:5, In:Ga:Zn=10:1:3, In:Ga:Zn=10:1:4, In:Ga:Zn=10:1:5, In:Ga:Zn=10:1:6, In:Ga:Zn=10:1:7, In:Ga:Zn=10:1:8, and a neighborhood thereof.

The composition of the semiconductor layer 108 greatly affects the electrical characteristics and reliability of the transistor 20. For example, an increase in the indium content in the semiconductor layer 108 can increase the carrier mobility and achieve a transistor with high field-effect mobility.

Here, one of indexes for evaluating the reliability of a transistor is a gate bias stress test (GBT) in which a state of applying an electric field to a gate is maintained. Among GBTs, a test in which a state where a positive potential relative to a source potential and a drain potential is supplied to a gate is maintained at high temperatures is referred to as a PBTS (Positive Bias Temperature Stress) test, and a test in which a state where a negative potential is supplied to a gate is maintained at high temperatures is referred to as an NBTS (Negative Bias Temperature Stress) test. The PBTS test and the NBTS test conducted in a state where irradiation with light such as white LED light is performed are respectively referred to as a PBTIS (Positive Bias Temperature Illumination Stress) test and an NBTIS (Negative Bias Temperature Illumination Stress) test.

In particular, in an n-channel transistor using an oxide semiconductor, a positive potential is applied to a gate in putting the transistor in an on state (a state where a current flows); thus, the amount of change in threshold voltage in the PBTS test is one important item to be focused on as an indicator of the reliability of the transistor.

The use of a metal oxide film not containing gallium or having a low gallium content as the semiconductor layer 108 can reduce the amount of change in the threshold voltage in the PBTS test. In the case where gallium is contained, the gallium content is preferably lower than the indium content in the composition of the semiconductor layer 108. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be inhibited by reducing the gallium content in a portion of the semiconductor layer that is in contact with the gate insulating layer.

The following can be given, for example, as the reason why degradation in the PBTS test can be inhibited when gallium is not contained or the gallium content is made low. Gallium contained in the semiconductor layer 108 has a property of attracting oxygen more easily than another metal element (e.g., indium or zinc) does. Thus, when, at the interface between a metal oxide film containing a large amount of gallium and the insulating layer 110 containing an oxide, gallium is bonded to excess oxygen in the insulating layer 110, trap sites of carriers (here, electrons) are probably generated easily. This might cause the change in the threshold voltage when a positive potential is applied to a gate and carriers are trapped at the interface between the semiconductor layer and the gate insulating layer.

Specifically, in the case where an In—Ga—Zn oxide is used for the semiconductor layer 108, a metal oxide film whose atomic proportion of In is higher than the atomic proportion of Ga can be used as the semiconductor layer 108. It is further preferable to use a metal oxide film whose atomic proportion of Zn is higher than the atomic proportion of Ga. In other words, a metal oxide film in which the atomic proportions of metal elements satisfy In >Ga and Zn>Ga is preferably used as the semiconductor layer 108.

In the case where a metal oxide film containing indium and gallium is used as the semiconductor layer 108, the atomic proportion (atomic ratio) of gallium to metal elements contained in the metal oxide can be higher than 0 and lower than 50%, preferably higher than or equal to 0.05% and lower than or equal to 30%, further preferably higher than or equal to 0.1% and lower than or equal to 15%, still further preferably higher than or equal to 0.1% and lower than or equal to 5%. Note that oxygen vacancies (hereinafter, also referred to as $V_O$) are less likely to be generated when the semiconductor layer 108 contains gallium.

A metal oxide film not containing gallium may be used as the semiconductor layer 108. For example, an In—Zn oxide can be used as the semiconductor layer 108. In this case, when the atomic proportion of In to metal elements contained in the metal oxide film is increased, the field-effect mobility of the transistor can be increased. By contrast, when the atomic proportion of Zn to metal elements contained in the metal oxide is increased, the metal oxide film has high crystallinity; thus, a change in the electrical characteristics of the transistor can be inhibited and the reliability can be increased. Alternatively, a metal oxide film that contains neither gallium nor zinc, such as indium oxide, can be used as the semiconductor layer 108. The use of a metal oxide film not containing gallium at all can make a change in the threshold voltage particularly in the PBTS test extremely small.

For example, an oxide containing indium and zinc can be used as the semiconductor layer 108. In that case, for example, a metal oxide film with an atomic ratio of metal elements of In:Zn=2:3, In:Zn=4:1, or a neighborhood thereof can be used.

In particular, a metal oxide film whose atomic proportion of In is higher than the atomic proportion of the element M is preferably used as the semiconductor layer 108. Furthermore, a metal oxide film whose atomic proportion of Zn is higher than the atomic proportion of the element M is preferably used.

It is preferable to use a metal oxide film having crystallinity as the semiconductor layer 108. For example, a metal oxide film having a CAAC (c-axis aligned crystal) structure, which is described later, an nc (nano crystal) structure, a polycrystalline structure, a microcrystalline structure, or the like can be used. With the use of a metal oxide film having crystallinity as the semiconductor layer 108, the density of defect states in the semiconductor layer 108 can be reduced, which enables the semiconductor device to have high reliability.

As the semiconductor layer 108 has higher crystallinity, the density of defect states in the film can be lower. By contrast, the use of a metal oxide film with low crystallinity enables a transistor to flow a large amount of current.

The semiconductor layer 108 may have a stacked-layer structure in which layers with different compositions, layers with different crystallinities, or layers with different impurity concentrations are stacked.

In the case where the metal oxide film is formed by a sputtering method, the crystallinity of the formed metal oxide film can be increased as the substrate temperature (stage temperature) at the time of deposition is higher. The crystallinity of the formed metal oxide film can be increased as the proportion of a flow rate of an oxygen gas to the whole deposition gas (also referred to as oxygen flow rate ratio) used at the time of deposition is higher. In this manner, the crystallinity of the metal oxide film to be formed can be controlled by the substrate temperature and the oxygen flow rate ratio of the deposition gas.

The insulating layer 110 functions as a gate insulating layer of the transistor 20. The insulating layer 110 in contact with the semiconductor layer 108 preferably contains an oxide or an oxynitride. The insulating layer 110 may include a region containing oxygen in excess of that in the stoichiometric composition. In other words, the insulating layer 110 may include an insulating film capable of releasing oxygen. It is also possible to supply oxygen into the insulating layer 110 by forming the insulating layer 110 in an oxygen atmosphere, performing heat treatment in an oxygen atmosphere after the formation of the insulating layer 110, performing plasma treatment or the like in an oxygen atmosphere after the formation of the insulating layer 110, or depositing an oxide film or an oxynitride film over the insulating layer 110 in an oxygen atmosphere, for example. Note that an oxidizing gas (e.g., dinitrogen monoxide or ozone) may be used instead of oxygen or in addition to oxygen in each of the above treatments for supplying oxygen.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For example, the insulating layer 110 can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. In particular, the insulating layer 110 is preferably formed by a PECVD (plasma CVD) method.

For example, for the insulating layer 110, an insulating film including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

For the insulating layer 110, a material having a higher dielectric constant than silicon oxide or silicon oxynitride, such as hafnium oxide, can also be used. In that case, the insulating layer 110 can be thick, and a leakage current due to a tunnel current can be inhibited. In particular, hafnium oxide having crystallinity is preferable because it has a higher dielectric constant than amorphous hafnium oxide.

The conductive layer 112 functions as the gate electrode of the transistor 20. A low-resistance material is preferably used in the conductive layer 112. The use of a low-resistance material in the conductive layer 112 can reduce parasitic resistance and enables the transistor to have a high on-state current, leading to a semiconductor device having a high on-state current. For example, the conductive layer 112 is preferably formed using a conductive film containing a metal or an alloy, in which case electric resistance can be reduced. Note that a conductive film containing an oxide may be used as the conductive layer 112. In addition, in a large-sized or high-resolution display device, wiring resistance can be reduced, which inhibits signal delay and enables a high-speed operation.

For the conductive layer 112, one or more selected from chromium, copper, aluminum, gold, silver, zinc, niobium, molybdenum, tantalum, titanium, tungsten, manganese, nickel, iron, and cobalt can be used. An alloy containing any of the above-described metal elements, an alloy containing the above-described metal elements in combination, or the like may be used for the conductive layer 112. Copper is particularly preferable because of its low resistance and high mass productivity.

The conductive layer 112 may have a stacked-layer structure. In the case where the conductive layer 112 has a stacked-layer structure, a second conductive layer is provided over and/or under a first conductive layer having low resistance. For the second conductive layer, a conductive material that is less likely to be oxidized (that has higher oxidation resistance) than the first conductive layer is preferably used. For the second conductive layer, a material that inhibits diffusion of components of the first conductive layer is preferably used. For the second conductive layer, for example, a metal oxide such as indium oxide, indium zinc oxide, indium tin oxide (ITO), indium tin oxide containing silicon (ITSO), or zinc oxide, or a metal nitride such as titanium nitride, tantalum nitride, molybdenum nitride, or tungsten nitride can be suitably used.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for the conductive layer 112.

Here, an oxide conductor (OC) is described. For example, when oxygen vacancies are formed in a metal oxide having semiconductor characteristics and hydrogen is supplied to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 112 may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

The semiconductor device 10 preferably further includes an insulating layer 118. The insulating layer 118 functions as a protective insulating layer protecting the transistor 20 and the transistor 30. For example, an inorganic insulating material such as an oxide, an oxynitride, a nitride oxide, or a nitride can be used for the insulating layer 118. More specifically, as the insulating layer 118, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used. Moreover, the insulating layer 118 may have a stacked-layer structure of two or more layers.

In the case where an oxynitride and a nitride oxide, which have the same elements, are described in this specification, the oxynitride includes a material that has a higher oxygen content and/or a lower nitrogen content than the nitride oxide. Similarly, the nitride oxide includes a material that has a lower oxygen content and/or a higher nitrogen content than the oxynitride. For example, in the case where silicon oxynitride and silicon nitride oxide are described, the silicon oxynitride includes a material that has a higher oxygen content and a lower nitrogen content than the silicon nitride oxide. Similarly, the silicon nitride oxide includes a material that has a lower oxygen content and a higher nitrogen content than the silicon oxynitride.

The insulating layer 118 may function as a supply source of the first element to the regions 108n. For example, the insulating layer 118 can function as a hydrogen supply source to the regions 108n. By supply of the first element to the regions 108n, the resistance of the regions 108n can be reduced. Since the conductive layer 112 is positioned between the region 108i and the insulating layer 118, the first element is not easily supplied and the resistance of the region 108i can be inhibited from being reduced.

In the case where hydrogen is used as the first element, the insulating layer 118 may be formed using a mixed gas including a gas containing hydrogen. This enables hydrogen to be effectively supplied to the regions 108n exposed at the time of forming the insulating layer 118, which can further lower the resistance of the regions 108n. As the gas containing hydrogen, for example, hydrogen ($H_2$), ammonia ($NH_3$), silane ($SiH_4$), or the like can be used.

When the resistance of the region 108i is increased and the resistance of the regions 108n is reduced, the transistor 20 can have high electrical characteristics.

The semiconductor device 10 includes the insulating layer 118 covering the semiconductor layer 108, the insulating layer 110, and the conductive layer 112. The insulating layer 118 has a function of a protective insulating layer of the transistor 20.

A conductive layer 120a and a conductive layer 120b are provided over the insulating layer 118. The conductive layer 120a and the conductive layer 120b are each electrically connected to the region 108n through an opening provided in the insulating layer 110 and the insulating layer 118. The conductive layer 120a functions as one of a source electrode and a drain electrode of the transistor 20, and the conductive layer 120b functions as the other of the source electrode and the drain electrode.

For the conductive layer 120a and the conductive layer 120b, a material that can be used for the conductive layer 112 can be used. One or more selected from titanium, tungsten, tantalum, niobium, and molybdenum can also be suitably used for the conductive layer 120a and the conductive layer 120b. In particular, a tantalum nitride film is suitably used for the conductive layer 112. Since a tantalum nitride film has conductivity and a high barrier property against copper, oxygen, or hydrogen and releases little hydrogen from itself, it can be suitably used as the conductive film in contact with the semiconductor layer 108 or the conductive film in the vicinity of the semiconductor layer 108.

Next, the transistor 30 is described in detail.

The semiconductor layer 308 includes a region 308i and a pair of regions 308n. The region 308i includes a region overlapping with the conductive layer 306 with the insulating layer 135 therebetween and functions as a channel formation region.

The pair of regions 308n are provided with the region 308i therebetween. The regions 308n have lower resistance than the region 308i and function as a source region and a drain region.

The regions 308n are regions including a second element. A Group 13 element or a Group 15 element can be used as the second element. As the second element, for example, one or more selected from boron, aluminum, gallium, indium, phosphorus, arsenic, antimony, and bismuth can be used. In the case where the transistor 30 is an n-channel transistor, one or both of phosphorus and arsenic can be suitably used as the second element. In the case where the transistor 30 is a p-channel transistor, one or both of boron and aluminum can be suitably used as the second element. In addition, the second element may be added to the region 308i functioning as the channel formation region in order to control the threshold voltage of the transistor 30.

For the analysis of the concentration of the second element in the semiconductor layer 308, the above description of the first element can be referred to; thus, the detailed description is omitted.

The semiconductor layer 308 preferably includes silicon. There is no particular limitation on the crystallinity of a semiconductor material used for the semiconductor layer 308, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited. Examples of silicon include amorphous silicon and crystalline silicon (low-temperature polysilicon, single crystal silicon, or the like).

The insulating layer 135 functions as a gate insulating layer of the transistor 30. The insulating layer 135 in contact with the semiconductor layer 308 preferably includes an oxide or an oxynitride. For the insulating layer 135, a material that can be used for the insulating layer 110 can be used.

For the conductive layer 306, a material that can be used for the conductive layer 112 can be used.

The semiconductor device 10 includes an insulating layer 103, the insulating layer 110, and the insulating layer 118 which cover the semiconductor layer 308, the insulating layer 135, and the conductive layer 306. The insulating layer 103, the insulating layer 110, and the insulating layer 118 function as protective insulating layers of the transistor 30.

The insulating layer 103 functioning as the protective insulating layer of the transistor can be formed by a sputtering method, a CVD method, an evaporation method, a pulsed laser deposition (PLD) method, or the like as appropriate. For example, the insulating layer 103 can be formed using a single layer or stacked layers of an oxide insulating film, an oxynitride insulating film, a nitride oxide insulating film, or a nitride insulating film. For example, for the insulating layer 103, one or more inorganic insulating materials selected from silicon oxide, silicon oxynitride, silicon nitride, silicon nitride oxide, aluminum oxide, aluminum oxynitride, aluminum nitride, hafnium oxide, and hafnium aluminate can be used.

To improve the properties of the interface with the semiconductor layer 108, at least a region of the insulating layer 103 that is in contact with the semiconductor layer 108 is preferably formed using an oxide insulating film or an oxynitride film. In the case where a film other than an oxide film or an oxynitride film, e.g., a silicon nitride film, is used on the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

The insulating layer 103 preferably has a stacked-layer structure. FIG. 1A illustrates a structure example in which the insulating layer 103 has a four-layer structure in which an insulating layer 103a, an insulating layer 103b, an insulating layer 103c, and an insulating layer 103d are stacked in this order from the conductive layer 306 side. The insulating layer 103a includes a region in contact with the conductive layer 306. The insulating layer 103d includes a region in contact with the semiconductor layer 108.

For each of the insulating layer 103a, the insulating layer 103b, the insulating layer 103c, and the insulating layer 103d, an inorganic insulating material such as an oxide, an oxynitride, a nitride oxide, or a nitride can be suitably used, for example. More specifically, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used for each of the insulating layer 103a, the insulating layer 103b, the insulating layer 103c, and the insulating layer 103d. The insulating layer 103a, the insulating layer 103b, the insulating layer 103c, and the insulating layer 103d may be formed using the same material or different materials from each other.

The insulating layer 103a positioned on the formation surface side of the insulating layer 103 is preferably formed using an insulating film containing oxygen. It is preferable that an insulating film containing at least silicon and oxygen, typically a silicon oxide film or a silicon oxynitride film, be used as the insulating layer 103a.

As the insulating layer 103b, an insulating film that contains hydrogen and is capable of releasing hydrogen by application of heat is preferably used. Hydrogen released from the insulating layer 103b terminates dangling bonds of silicon included in the semiconductor layer 308, leading to an improvement in electrical characteristics of the transistor 30. As the insulating layer 103b, an insulating film containing nitrogen can be used. An insulating film containing at least silicon and nitrogen, typically a silicon nitride film or a silicon nitride oxide film, can be used as the insulating layer 103b.

The insulating layer 103c is preferably a dense film that can inhibit diffusion of impurities from the layers below the insulating layer 103c. The insulating layer 103c is preferably a film capable of blocking metal elements or impurities containing hydrogen included in a member (e.g., a substrate) on the formation surface side of the insulating layer 103c. Examples of the impurities containing hydrogen include hydrogen and water. In particular, the insulating layer 103c is preferably a film capable of blocking impurities containing hydrogen. Thus, an insulating layer that is formed at a lower deposition rate than the insulating layer 103b can be used as the insulating layer 103c.

As the insulating layer 103c, an insulating film containing nitrogen can be used. As the insulating layer 103c, an insulating film containing nitrogen, such as a silicon nitride film, a silicon nitride oxide film, an aluminum nitride film, or a hafnium nitride film, or an insulating film containing an oxide such as aluminum oxide or hafnium oxide can be suitably used, for example. In particular, a dense silicon nitride film formed with a plasma CVD apparatus is preferably used as the insulating layer 103c. With the use of such an insulating film containing nitrogen, diffusion of impurities from the formation surface side can be inhibited even when the thickness of the insulating film is small.

The insulating layer 103c preferably has a lower hydrogen-transmitting property than the insulating layer 103b. Furthermore, the insulating layer 103c is preferably a denser insulating film than the insulating layer 103b. Moreover, the insulating layer 103c is preferably an insulating film having a higher film density than the insulating layer 103b. When such an insulating film is used as the insulating layer 103c, hydrogen included in the insulating layer 103b can be inhibited from diffusing to the insulating layer 103d side. Thus, hydrogen included in the insulating layer 103b can be efficiently supplied to the semiconductor layer 308, and dangling bonds of silicon included in the semiconductor layer 308 can be terminated; accordingly, the transistor 30 can have favorable electrical characteristics.

To evaluate the film density, an X-ray reflectivity (XRR) method or a transmission electron microscopy (TEM) image can be used. For example, in the case where the insulating layer 103b and the insulating layer 103c have different film densities from each other, the difference can be observed as a difference in contrast in a transmission electron microscopy (TEM) image or the like of a cross section of the insulating layer 103, and the insulating layers can be distinguished from each other, in some cases. Note that the boundary might be unclear in the case where their compositions or film densities are close to each other.

When the insulating layer 103c is provided, hydrogen included in the insulating layer 103b can be inhibited from diffusing into the semiconductor layer 108 of the transistor 20. In the case where a metal oxide is used for the semiconductor layer 108, hydrogen diffused into the semiconductor layer 108 deprives the semiconductor layer 108 of oxygen and oxygen vacancies ($V_O$) are generated in the semiconductor layer 108. Defects (hereinafter, also referred to as $V_O$H) generated by entry of hydrogen into these oxygen vacancies ($V_O$) can serve as carrier supply sources. In particular, when hydrogen diffuses into the region 108i that is a channel formation region, the carrier concentration in the region 108i becomes high and electrical characteristics of the transistor 20 are degraded. In the semiconductor device 10 that is one embodiment of the present invention, the insulating layer 103c is provided between the insulating layer 103b containing a large amount of hydrogen and the semiconductor layer 108, whereby hydrogen diffusion from the insulating layer 103b into the semiconductor layer 108 can be inhibited and the transistor 20 can have favorable electrical characteristics.

The insulating layer 103c preferably has a lower hydrogen concentration than the insulating layer 103b. When such an insulating film is used as the insulating layer 103c, the amount of hydrogen released from the insulating layer 103c itself can be reduced and an increase of oxygen vacancies ($V_O$) or $V_O$H in the semiconductor layer 108 can be inhibited.

In the semiconductor device 10, at least the semiconductor layer 308 preferably includes a region overlapping with the insulating layer 103c with the insulating layer 103b therebetween. With such a structure, a semiconductor device having favorable electrical characteristics and high reliability can be provided. Furthermore, in the semiconductor device 10, at least the semiconductor layer 108 preferably includes a region overlapping with the insulating layer 103b with the insulating layer 103c therebetween.

For example, a silicon nitride film can be used as each of the insulating layer 103b and the insulating layer 103c. In the case where the insulating layer 103b is formed with a plasma CVD apparatus, a mixed gas of silane, nitrogen, and ammonia can be used as a deposition gas, for example. The use of ammonia enables the insulating layer 103b to contain a large amount of hydrogen. In the case where the insulating layer 103c is formed with a plasma CVD apparatus, a mixed gas of silane, nitrogen, and ammonia can be used as a deposition gas, for example. The flow rate of ammonia in forming the insulating layer 103c is preferably set lower than that in forming the insulating layer 103b. By setting the flow rate of ammonia lower than that in forming the insulating layer 103b, the insulating layer 103c can have a lower hydrogen-transmitting property. Furthermore, hydrogen contained in the insulating layer 103c is reduced, and hydrogen released from the insulating layer 103c can be reduced. Note that ammonia is not necessarily used in forming the insulating layer 103c. For example, a mixed gas of silane and nitrogen may be used as a deposition gas in forming the insulating layer 103c.

The transistor 20 is provided over the insulating layer 103, and the insulating layer 103d includes a region in contact with the semiconductor layer 108. The insulating layer 103d in contact with the semiconductor layer 108 is preferably formed using an insulating film containing an oxide or an oxynitride. It is particularly preferable to use an oxide film or an oxynitride film as the insulating layer 103d. As the insulating layer 103d, it is preferable to use a dense insulating film in which impurities such as water are less likely to be adsorbed on the surface. In addition, it is preferable to use an insulating film which includes as few defects as possible and in which impurities such as water and hydrogen are reduced.

It is further preferable that the insulating layer 103d include a region containing oxygen in excess of that in the stoichiometric composition. In other words, the insulating layer 103d is preferably an insulating film capable of releasing oxygen by heating. It is also possible to supply oxygen into the insulating layer 103d by forming the insulating layer 103d in an oxygen atmosphere, performing heat treatment on the formed insulating layer 103d in an oxygen atmosphere, performing plasma treatment or the like on the formed insulating layer 103d in an oxygen atmosphere, or depositing an oxide film or an oxynitride film over the insulating layer 103d in an oxygen atmosphere, for example. Note that an oxidizing gas (e.g., dinitrogen monoxide or ozone) may be used instead of oxygen or in addition to oxygen in each of the above treatments for supplying oxygen. Alternatively, heat may be applied after an insulating film capable of releasing oxygen by heating is formed over the insulating layer 103d, so that oxygen may be supplied from the insulating film to the insulating layer 103d.

When a metal oxide film to be the semiconductor layer 108 is formed by a sputtering method in an atmosphere containing oxygen, oxygen can be supplied to the insulating layer 103d. Then, heat treatment is performed after the metal oxide film to be the semiconductor layer is formed, whereby oxygen in the insulating layer 103d can be supplied to the metal oxide film to reduce oxygen vacancies ($V_O$) in the metal oxide film.

As the insulating layer 103d, an insulating film including one or more kinds of a silicon oxide film, a silicon oxynitride film, a silicon nitride oxide film, an aluminum oxide film, an aluminum oxynitride film, aluminum nitride oxide, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be suitably used, for example. It is particularly preferable to use a silicon oxide film or a silicon oxynitride film as the insulating layer 103d.

An insulating film that releases hydrogen or water as little as possible is preferably used as the insulating layer 103d. With the use of such an insulating film, diffusion of hydrogen and water from the insulating layer 103d to the semiconductor layer 108 by heat treatment or application of heat or the like during the process can be prevented, whereby the carrier concentration in the region 108i can be reduced.

For the insulating layer 103c, an insulating film that does not easily allow diffusion of oxygen is preferably used. This can inhibit a reduction in the amount of oxygen supplied to the semiconductor layer 108, which is caused by diffusion of oxygen from the insulating layer 103d to the insulating layer 103b or layers lower than the insulating layer 103b in the heat treatment for supplying oxygen from the insulating layer 103d to the semiconductor layer 108 (or the metal oxide film to be the semiconductor layer 108).

Note that the thickness of the insulating layer 103 can be determined on the basis of the values of the dielectric constant of the insulating layer 103a to the insulating layer 103d and the thicknesses of the insulating layer 103a to the insulating layer 103d in consideration of the value of the dielectric constant required for the insulating layer 103, withstand voltage characteristics required for the insulating layer 103, and the like. That is, the thicknesses of the insulating layer 103a to the insulating layer 103d can be adjusted in the range where the above-described requirements are satisfied.

A dense insulating film is preferably used as the insulating layer 103c; however, such an insulating film sometimes has large stress. In the case where an insulating film with large stress is used, a problem such as substrate warpage or film peeling might be caused. Thus, the insulating layer 103c is not necessarily thick as long as the insulating layer 103c has a thickness with which hydrogen diffusion from the insulating layer 103b side to the semiconductor layer 108 side can be blocked. The thickness of the insulating layer 103c is preferably greater than or equal to 10 nm and less than or equal to 200 nm, further preferably greater than or equal to 20 nm and less than or equal to 150 nm, further preferably greater than or equal to 30 nm and less than or equal to 150 nm, still further preferably greater than or equal to 30 nm and less than or equal to 100 nm, further preferably greater than or equal to 50 nm and less than or equal to 100 nm, for example. The above-mentioned upper limits and lower limits can be combined freely.

The four insulating films included in the insulating layer 103 are preferably formed successively without exposure to the air with a plasma CVD apparatus. For example, the insulating layer 103b is preferably formed in a treatment chamber where the insulating layer 103a is formed. Alternatively, a structure may be employed in which a treatment chamber where the insulating layer 103a is formed and a treatment chamber where the insulating layer 103b is formed are connected through a gate valve or the like and after the insulating layer 103a is formed, transfer to the chamber where the insulating layer 103b is formed is performed under a reduced pressure without exposure to the air. In the case where the insulating layer 103a and the insulating layer 103b are formed successively in the same treatment chamber in the same apparatus, it is preferable that the insulating layer 103a and the insulating layer 103b be formed at the same temperature. Similarly, it is preferable that the insulating layer 103b and the insulating layer 103c be formed successively without exposure to the air and that the insulating layer 103c and the insulating layer 103d be formed successively without exposure to the air.

Note that although FIG. 1A illustrates an example where the insulating layer 103 has a four-layer structure including the insulating layer 103a, the insulating layer 103b, the insulating layer 103c, and the insulating layer 103d, one embodiment of the present invention is not limited thereto. The insulating layer 103 preferably includes the insulating layer 103b and the insulating layer 103c over the insulating layer 103b and may have a structure not including the insulating layer 103a. For example, the insulating layer 103 can have a two-layer structure including the insulating layer 103b and the insulating layer 103c. In the case where the semiconductor layer 108 is provided over the insulating layer 103, the insulating layer 103d is preferably provided so that the insulating layer 103d and the semiconductor layer 108 are in contact with each other. Furthermore, a different layer may be provided between the insulating layer 103b and the insulating layer 103c.

A conductive layer 312a and a conductive layer 312b are provided over the insulating layer 110. The conductive layer 312a and the conductive layer 312b are each electrically connected to the region 308n through an opening provided in the insulating layer 110 and the insulating layer 103. The conductive layer 312a functions as one of the source electrode and the drain electrode of the transistor 30, and the conductive layer 312b functions as the other of the source electrode and the drain electrode.

The conductive layer 312a and the conductive layer 312b can be formed using a material that can be used for the conductive layer 112. Furthermore, the conductive layer 312a, the conductive layer 312b, and the conductive layer 112 are preferably formed using the same material. Furthermore, the conductive layer 312a, the conductive layer 312b, and the conductive layer 112 are preferably formed by processing the same conductive film. By the formation through processing of the same conductive film, manufacturing cost can be reduced and production yield can be increased.

The insulating layer 118 is provided over the conductive layer 312a and the conductive layer 312b. The insulating layer 118 can be formed using a material that can be used for the insulating layer 103.

A conductive layer 320a and a conductive layer 320b are provided over the insulating layer 118. The conductive layer 320a and the conductive layer 320b are electrically connected to the conductive layer 312a and the conductive layer 312b, respectively, through openings provided in the insulating layer 118. Illustrated in FIG. 1A is an example where the conductive layer 320a is electrically connected to the region 308n through the conductive layer 312a, and the conductive layer 320b is electrically connected to the region 308n through the conductive layer 312b.

The conductive layer 320a and the conductive layer 320b can be formed using a material that can be used for the conductive layer 112. Furthermore, the conductive layer 320a, the conductive layer 320b, the conductive layer 120a, and the conductive layer 120b are preferably formed using the same material. Furthermore, the conductive layer 320a, the conductive layer 320b, the conductive layer 120a, and the conductive layer 120b are preferably formed by processing the same conductive film. By the formation through processing of the same conductive film, manufacturing cost can be reduced and production yield can be increased.

Structure Example 1-2

Figure 1B:
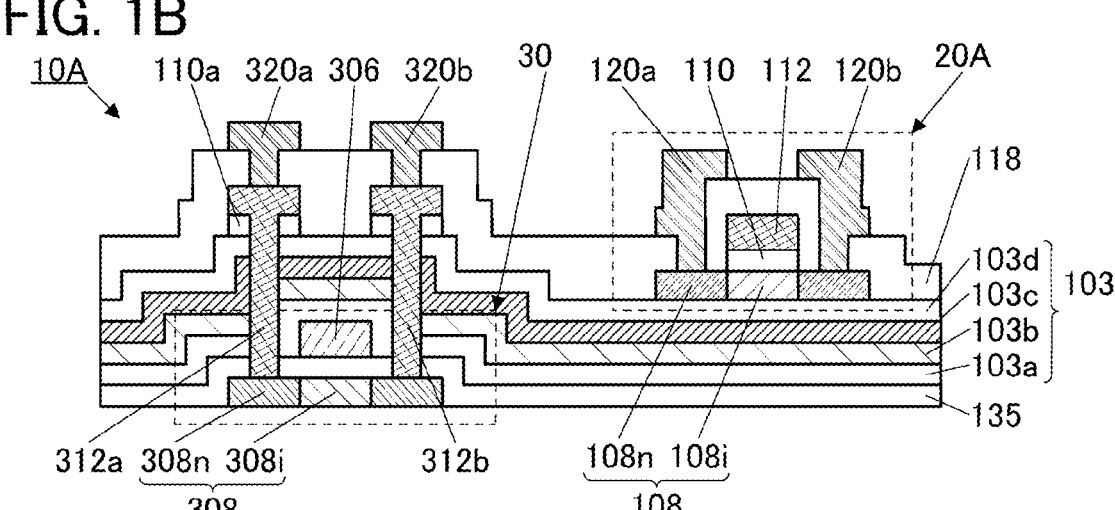

FIG. 1B illustrates a structure example different from that of the above-described semiconductor device 10. A semiconductor device 10A illustrated in FIG. 1B includes a transistor 20A and the transistor 30. FIG. 1B illustrates a schematic cross-sectional view of the transistor 20A and the transistor 30 in the channel length direction. The semiconductor device 10A is different from the semiconductor device 10 mainly in the structure of the insulating layer 110.

In the semiconductor device 10A, the insulating layer 110 is processed to have substantially the same top surface shape as the conductive layer 112. An insulating layer 110a is processed to have substantially the same top surface shape as the conductive layer 312a and the conductive layer 312b. Furthermore, the insulating layer 110a is preferably formed using the same material as the insulating layer 110. By using the same material, the insulating layer 110 and the insulating layer 110a can be formed through the same steps, which can increase production yield as well as reducing manufacturing cost. The insulating layer 110 and the insulating layer 110a can be processed using a resist mask for processing the conductive layer 112, the conductive layer 312a, and the conductive layer 312b, for example.

As illustrated in FIG. 1B, the insulating layer 118 includes a region in contact with the region 108n. With this structure, the first element can be supplied from the insulating layer 118 to the regions 108n. For example, hydrogen in the insulating layer 118 is diffused into the regions 108n, so that the resistance of the regions 108n can be reduced. Since the conductive layer 112 is provided between the region 108i and the insulating layer 118, the amount of hydrogen diffused into the region 108i is smaller than that diffused into the regions 108n and thus the region 108i has higher resistance than the regions 108n. In other words, the regions 108n which are low-resistance regions can be formed in a self-aligned manner.

In the example illustrated in FIG. 1A, the top surface shape of the insulating layer 110 and the top surface shape of the conductive layer 112 are substantially the same and the top surface shape of the insulating layer 110a and the top surface shape of the conductive layer 312a and the conductive layer 312b are substantially the same; however, one embodiment of the present invention is not limited thereto. An end portion of the insulating layer 110 may be positioned outside an end portion of the conductive layer 112. Similarly, an end portion of the insulating layer 110a may be positioned outside end portions of the conductive layer 312a and the conductive layer 312b. The end portion of the insulating layer 110 is preferably positioned inside an end portion of the semiconductor layer 108.

Structure Example 1-3

Figure 1C:
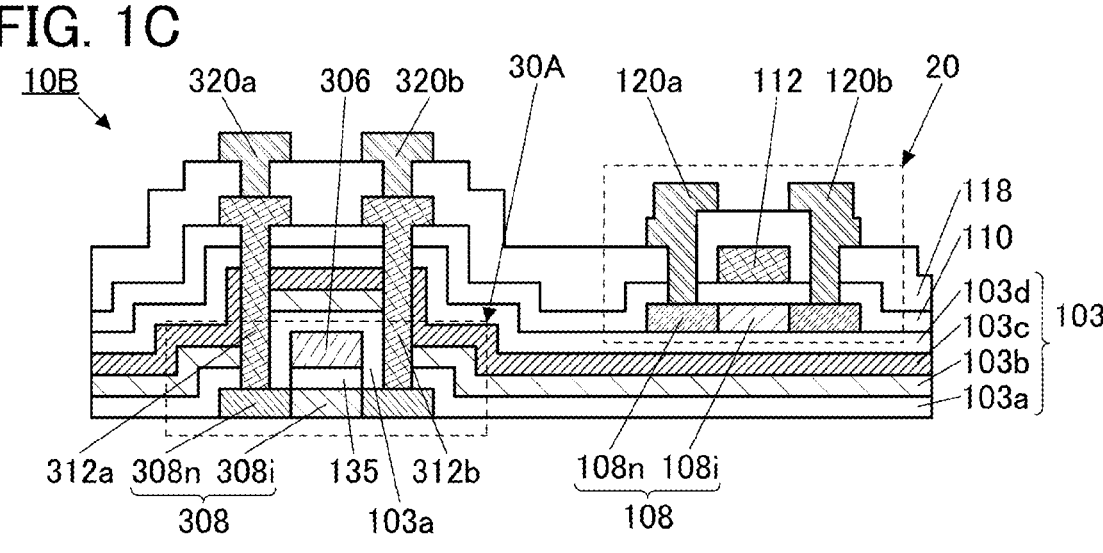

FIG. 1C illustrates a structure example different from that of the above-described semiconductor device 10. A semiconductor device 10B illustrated in FIG. 1C includes the transistor 20 and a transistor 30A. FIG. 1C illustrates a schematic cross-sectional view of the transistor 20 and the transistor 30A in the channel length direction. The semiconductor device 10B is different from the semiconductor device 10 mainly in the structure of the insulating layer 135.

In the transistor 30A, the insulating layer 135 is processed to have substantially the same top surface shape as the conductive layer 306. The insulating layer 135 can be processed using a resist mask for processing the conductive layer 306, for example.

As illustrated in FIG. 1C, the insulating layer 103 includes a region in contact with the region 308n. For example, the regions 308n may be formed by making the insulating layer 103 contain the second element and diffusing the second element into the semiconductor layer 108 in contact with the insulating layer 103. With this structure, the regions 308n which are low-resistance regions can be formed in a self-aligned manner.

Structure Example 1-4

Figure 2A:
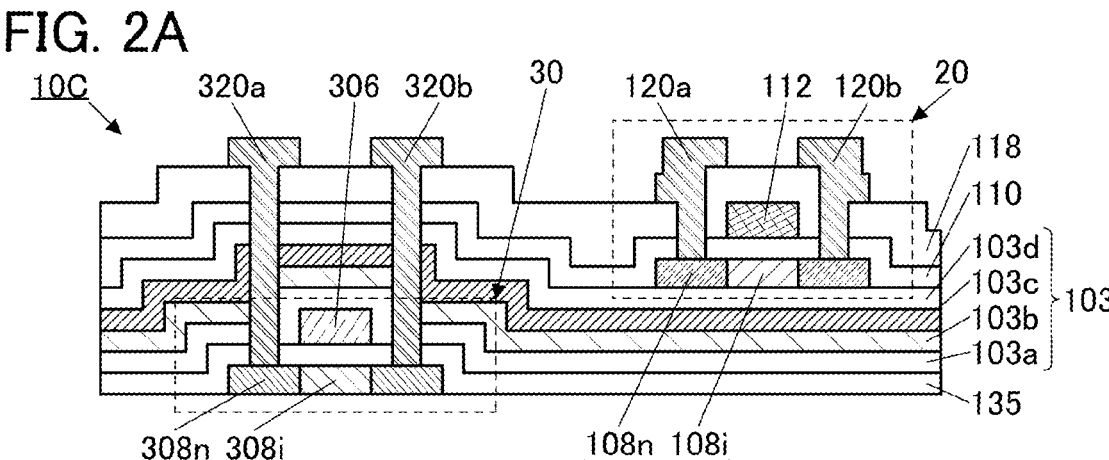
FIG. 2A, FIG. 2B, and FIG. 2C are cross-sectional views illustrating structure examples of a semiconductor device.

FIG. 2A illustrates a structure example different from that of the above-described semiconductor device 10. A semiconductor device 10C illustrated in FIG. 2A includes the transistor 20 and the transistor 30. FIG. 2A illustrates a schematic cross-sectional view of the transistor 20 and the transistor 30 in the channel length direction. The semiconductor device 10C is different from the semiconductor device 10 mainly in not including the conductive layer 312a and the conductive layer 312b.

The conductive layer 320a and the conductive layer 320b are each electrically connected to the region 308n through an opening provided in the insulating layer 135, the insulating layer 103, the insulating layer 110, and the insulating layer 118. The conductive layer 320a functions as one of the source electrode and the drain electrode of the transistor 30, and the conductive layer 320b functions as the other of the source electrode and the drain electrode. Not providing the conductive layer 312a and the conductive layer 312b can reduce manufacturing cost.

The openings in which the conductive layer 120a and the conductive layer 120b are formed and the openings in which the conductive layer 320a and the conductive layer 320b are formed may be formed in the same step or different steps. Formation of these openings in the same step can reduce manufacturing cost.

Structure Example 1-5

Figure 2B:
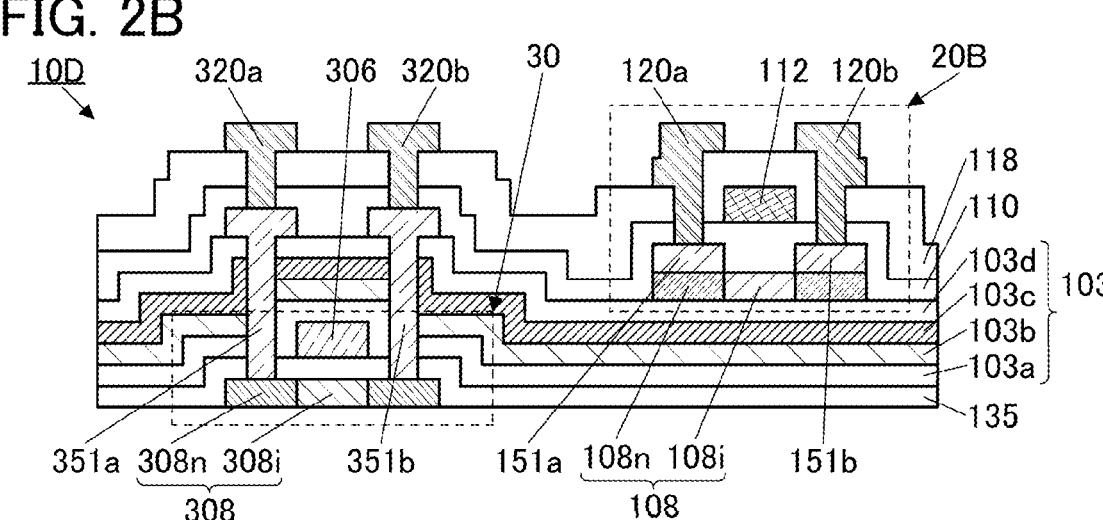

FIG. 2B illustrates a structure example different from that of the above-described semiconductor device 10. A semiconductor device 10D illustrated in FIG. 2B includes a transistor 20B and the transistor 30. FIG. 2B illustrates a schematic cross-sectional view of the transistor 20B and the transistor 30 in the channel length direction. The semiconductor device 10D is different from the semiconductor device 10 mainly in including a conductive layer 151a and a conductive layer 151b and in including a conductive layer 351a and a conductive layer 351b instead of the conductive layer 312a and the conductive layer 312b.

The transistor 20B includes the conductive layer 151a and the conductive layer 151b over the regions 108n. The conductive layer 151a and the conductive layer 151b each include a region in contact with the region 108n. The conductive layer 151a functions as one of a source electrode and a drain electrode of the transistor 20B, and the conductive layer 151b functions as the other of the source electrode and the drain electrode. The conductive layer 120a and the conductive layer 120b are each electrically connected to the region 108n through the conductive layer 151a or the conductive layer 151b.

The semiconductor device 10D includes the conductive layer 351a and the conductive layer 351b over the insulating layer 103. The conductive layer 351a and the conductive layer 351b are each electrically connected to the region 308n through an opening provided in the insulating layer 135 and the insulating layer 103. The conductive layer 351a functions as one of the source electrode and the drain electrode of the transistor 30, and the conductive layer 351b functions as the other of the source electrode and the drain electrode. The conductive layer 320a and the conductive layer 320b are each electrically connected to the region 308n through the conductive layer 351a or the conductive layer 351b.

The conductive layer 151a, the conductive layer 151b, the conductive layer 351a, and the conductive layer 351b can each be formed using a material that can be used for the conductive layer 112. Furthermore, the conductive layer 151a, the conductive layer 151b, the conductive layer 351a, and the conductive layer 351b are preferably formed using the same material. Furthermore, the conductive layer 151a, the conductive layer 151b, the conductive layer 351a, and the conductive layer 351b are preferably formed by processing the same conductive film. By the formation through processing of the same conductive film, manufacturing cost can be reduced and production yield can be increased.

Structure Example 1-6

Figure 2C:
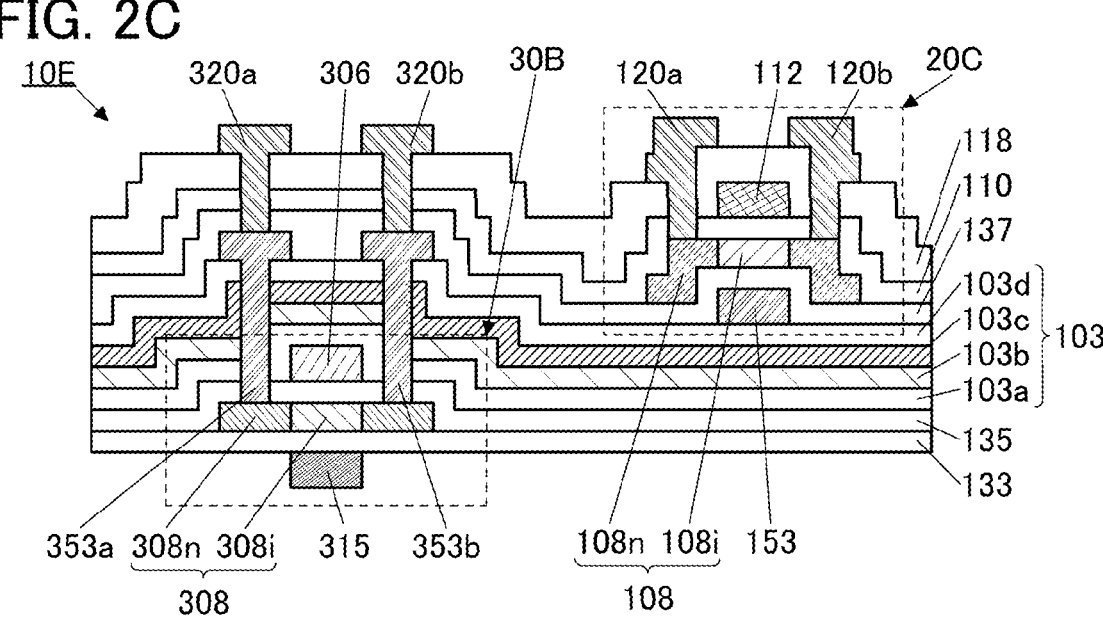

FIG. 2C illustrates a structure example different from that of the above-described semiconductor device 10. A semiconductor device 10E illustrated in FIG. 2C includes a transistor 20C and a transistor 30B. FIG. 2C illustrates a schematic cross-sectional view of the transistor 20C and the transistor 30B in the channel length direction. The semiconductor device 10E is different from the semiconductor device 10 mainly in including a conductive layer 153 and an insulating layer 137 and in including a conductive layer 315 and an insulating layer 133 instead of the conductive layer 312a and the conductive layer 312b.

The transistor 20C includes the conductive layer 153 and the insulating layer 137. The conductive layer 153 includes a region overlapping with the semiconductor layer 108, the insulating layer 110, and the conductive layer 112 with the insulating layer 137 therebetween. In the transistor 20C, the conductive layer 153 functions as a first gate electrode (also referred to as a back gate electrode). The insulating layer 137 functions as a first gate insulating layer. In this case, the conductive layer 112 functions as a second gate electrode (also referred to as a top gate electrode), and the insulating layer 110 functions as a second gate insulating layer.

For example, when the same potential is supplied to the conductive layer 112 and the conductive layer 153, the amount of current which can flow in the transistor 20C in an on state can be increased. In the transistor 20C, a potential for controlling the threshold voltage can be supplied to one of the conductive layer 112 and the conductive layer 153, and a potential for controlling the on/off state of the transistor 20C can be supplied to the other. In addition, the electrical characteristics of the transistor 20C can be stabilized by electrical connection between the source and one of the conductive layer 112 and the conductive layer 153.

The insulating layer 137 functioning as the first gate insulating layer preferably functions as a barrier layer that inhibits diffusion of impurities into the semiconductor layer 108 and the like from the formation surface side of the insulating layer 137. Examples of the impurities include metal components included in the conductive layer 153. The insulating layer 137 preferably satisfies one or more of the following characteristics, further preferably satisfies all of the following characteristics: a high withstand voltage, low stress of a film, unlikeliness of releasing hydrogen and water, unlikeliness of diffusing hydrogen and water, and few defects. An insulating film that can be used as the insulating layer 110 can be used as the insulating layer 137. The description of the insulating layer 110 can be referred to for the insulating layer 137; thus, the detailed description is omitted.

Although FIG. 2C illustrates an example in which an end portion of the conductive layer 153 is substantially aligned with the end portion of the conductive layer 112, one embodiment of the present invention is not limited thereto. The end portion of the conductive layer 153 may be positioned outside the end portion of the conductive layer 112. Alternatively, the end portion of the conductive layer 153 may be positioned inside the end portion of the conductive layer 112.

The transistor 30B includes the conductive layer 315 and the insulating layer 133. The conductive layer 315 includes a region overlapping with the semiconductor layer 308, the insulating layer 135, and the conductive layer 306 with the insulating layer 133 therebetween. In the transistor 20C, the conductive layer 315 functions as a first gate electrode (back gate electrode). The insulating layer 133 functions as a first gate insulating layer. In this case, the conductive layer 306 functions as a second gate electrode (top gate electrode), and the insulating layer 135 functions as a second gate insulating layer.

For example, when the same potential is supplied to the conductive layer 306 and the conductive layer 315, the amount of current which can flow in the transistor 30B in an on state can be increased. In the transistor 30B, a potential for controlling the threshold voltage can be supplied to one of the conductive layer 306 and the conductive layer 315, and a potential for controlling the on/off state of the transistor 30B can be supplied to the other. In addition, the electrical characteristics of the transistor 30B can be stabilized by electrical connection between the source and one of the conductive layer 306 and the conductive layer 315.

The insulating layer 133 functioning as the first gate insulating layer preferably functions as a barrier layer that inhibits diffusion of impurities into the semiconductor layer 308 and the like from the formation surface side of the insulating layer 133. Examples of the impurities include metal components included in the conductive layer 315. The insulating layer 133 preferably satisfies one or more of the following characteristics, further preferably satisfies all of the following characteristics: a high withstand voltage, low stress of a film, unlikeliness of releasing hydrogen and water, unlikeliness of diffusing hydrogen and water, and few defects. An insulating film that can be used as the insulating layer 110 can be used as the insulating layer 133.

For the conductive layer 315, a material that can be used for the conductive layer 112 can be used.

Although FIG. 2C illustrates an example in which an end portion of the conductive layer 315 is substantially aligned with an end portion of the conductive layer 306, one embodiment of the present invention is not limited thereto. The end portion of the conductive layer 315 may be positioned outside the end portion of the conductive layer 306. Alternatively, the end portion of the conductive layer 315 may be positioned inside the end portion of the conductive layer 306.

A conductive layer 353a and a conductive layer 353b are each electrically connected to the region 308n through an opening provided in the insulating layer 135 and the insulating layer 103. The conductive layer 353a functions as one of a source electrode and a drain electrode of the transistor 30B, and the conductive layer 353b functions as the other of the source electrode and the drain electrode. The conductive layer 320a and the conductive layer 320b are each electrically connected to the region 308n through the conductive layer 353a or the conductive layer 353b.

The conductive layer 353a, the conductive layer 353b, and the conductive layer 153 can each be formed using a material that can be used for the conductive layer 112. Furthermore, the conductive layer 353a, the conductive layer 353b, and the conductive layer 153 are preferably formed using the same material. Furthermore, the conductive layer 353a, the conductive layer 353b, and the conductive layer 153 are preferably formed by processing the same conductive film. By the formation through processing of the same conductive film, manufacturing cost can be reduced and production yield can be increased.

Structure Example 1-7

Figure 3A:
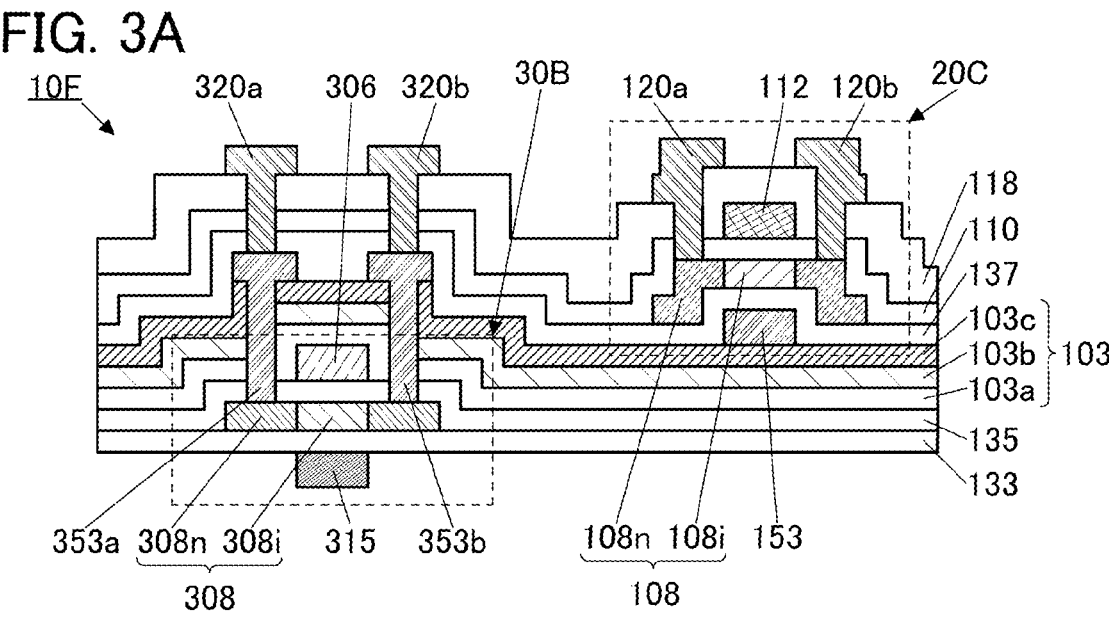
FIG. 3A and FIG. 3B are cross-sectional views illustrating structure examples of a semiconductor device.

FIG. 3A illustrates a structure example different from that of the above-described semiconductor device 10E. A semiconductor device 10F illustrated in FIG. 3A includes the transistor 20C and the transistor 30B. FIG. 3A illustrates a schematic cross-sectional view of the transistor 20C and the transistor 30B in the channel length direction. The semiconductor device 10F is different from the semiconductor device 10E mainly in not including the insulating layer 103d.

The conductive layer 153 functioning as a first gate electrode (back gate electrode) of the transistor 20C includes a region in contact with the insulating layer 103c. The conductive layer 353*a* and the conductive layer 353*b* functioning as the source electrode and the drain electrode of the transistor 30B include regions in contact with the insulating layer 103*c*. By having the structure not provided with the insulating layer 103*d*, the manufacturing cost of the semiconductor device 10F can be reduced.

Note that although FIG. 3A illustrates an example where the insulating layer 103 has a three-layer structure including the insulating layer 103*a*, the insulating layer 103*b*, and the insulating layer 103*c*, one embodiment of the present invention is not limited thereto. The insulating layer 103 preferably includes the insulating layer 103*b* and the insulating layer 103*c* over the insulating layer 103*b* and may have a structure not including the insulating layer 103*a*. For example, the insulating layer 103 can have a two-layer structure including the insulating layer 103*b* and the insulating layer 103*c*.

Structure Example 1-8

Figure 3B:
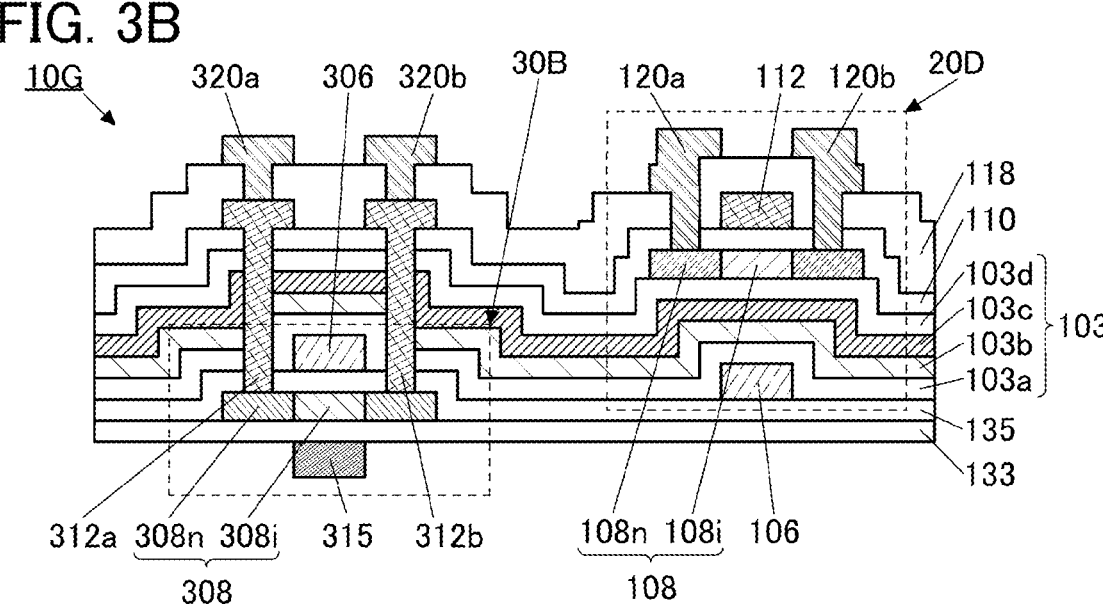

FIG. 3B illustrates a structure example different from that of the above-described semiconductor device 10E. A semiconductor device 10G illustrated in FIG. 3B includes a transistor 20D and the transistor 30B. FIG. 3B illustrates a schematic cross-sectional view of the transistor 20D and the transistor 30B in the channel length direction. The semiconductor device 10G is different from the semiconductor device 10E mainly in not including the insulating layer 137 and in including a conductive layer 106 instead of the conductive layer 153.

In the transistor 20D, the conductive layer 106 includes a region overlapping with the semiconductor layer 108, the insulating layer 110, and the conductive layer 112 with the insulating layer 103 therebetween. In the transistor 20D, the conductive layer 106 functions as a first gate electrode (back gate electrode). The insulating layer 103 functions as a first gate insulating layer. In this case, the conductive layer 112 functions as a second gate electrode (top gate electrode), and the insulating layer 110 functions as a second gate insulating layer.

For example, when the same potential is supplied to the conductive layer 112 and the conductive layer 106, the amount of current which can flow in the transistor 20D in an on state can be increased. In the transistor 20D, a potential for controlling the threshold voltage can be supplied to one of the conductive layer 112 and the conductive layer 106, and a potential for controlling the on/off state of the transistor 20D can be supplied to the other. In addition, the electrical characteristics of the transistor 20D can be stabilized by electrical connection between the source and one of the conductive layer 112 and the conductive layer 106.

The insulating layer 103 preferably includes the insulating layer 103*d*. It is preferable to provide the insulating layer 103*d* on the side on which the insulating layer 103 is in contact with the semiconductor layer 108 and provide the semiconductor layer 108 in contact with the insulating layer 103*d*. With the structure where the insulating layer 103*d* containing an oxide or an oxynitride is in contact with the semiconductor layer 108, oxygen vacancies (Vo) or VoH in the semiconductor layer 108 can be reduced.

The conductive layer 106 can be formed using a material that can be used for the conductive layer 112. Furthermore, the conductive layer 106 and the conductive layer 306 are preferably formed using the same material. Furthermore, the conductive layer 106 and the conductive layer 306 are preferably formed by processing the same conductive film.

By the formation through processing of the same conductive film, manufacturing cost can be reduced and production yield can be increased.

Although FIG. 3B illustrates an example in which an end portion of the conductive layer 106 is substantially aligned with the end portion of the conductive layer 112, one embodiment of the present invention is not limited thereto. The end portion of the conductive layer 106 may be positioned outside the end portion of the conductive layer 112. Alternatively, the end portion of the conductive layer 106 may be positioned inside the end portion of the conductive layer 112.

Structure Example 1-9

Figures 4A, 4B:
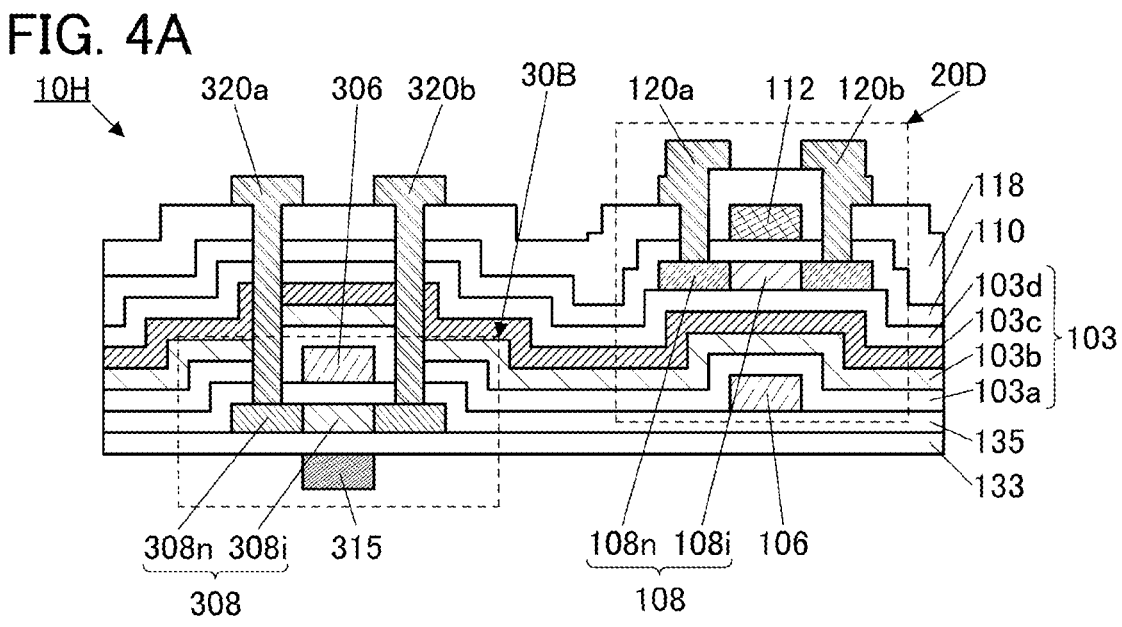
FIG. 4A and FIG. 4B are cross-sectional views illustrating structure examples of a semiconductor device.

FIG. 4A illustrates a structure example different from that of the above-described semiconductor device 10G. A semiconductor device 10H illustrated in FIG. 4A includes the transistor 20D and the transistor 30B. FIG. 4A illustrates a schematic cross-sectional view of the transistor 20D and the transistor 30B in the channel length direction. The semiconductor device 10H is different from the semiconductor device 10G mainly in not including the conductive layer 312*a* and the conductive layer 312*b*.

The conductive layer 320*a* and the conductive layer 320*b* are each electrically connected to the region 308*n* through the opening provided in the insulating layer 135, the insulating layer 103, the insulating layer 110, and the insulating layer 118. The conductive layer 320*a* functions as one of the source electrode and the drain electrode of the transistor 30B, and the conductive layer 320*b* functions as the other of the source electrode and the drain electrode. Not providing the conductive layer 312*a* and the conductive layer 312*b* can reduce manufacturing cost.

Structure Example 1-10

FIG. 4B illustrates a structure example different from that of the above-described semiconductor device 10E. A semiconductor device 10I illustrated in FIG. 4B includes a transistor 20E and the transistor 30B. FIG. 4B illustrates a schematic cross-sectional view of the transistor 20E and the transistor 30B in the channel length direction. The semiconductor device 10I is different from the semiconductor device 10E mainly in including a conductive layer 105 instead of the conductive layer 153.

In the transistor 20E, the conductive layer 105 includes a region overlapping with the semiconductor layer 108, the insulating layer 110, and the conductive layer 112 with the insulating layer 135 and the insulating layer 103 therebetween. In the transistor 20E, the conductive layer 105 functions as a first gate electrode (back gate electrode). The insulating layer 135 and the insulating layer 103 function as a first gate insulating layer. In this case, the conductive layer 112 functions as a second gate electrode (top gate electrode), and the insulating layer 110 functions as a second gate insulating layer.

For example, when the same potential is supplied to the conductive layer 112 and the conductive layer 105, the amount of current which can flow in the transistor 20E in an on state can be increased. In the transistor 20E, a potential for controlling the threshold voltage can be supplied to one of the conductive layer 112 and the conductive layer 105, and a potential for controlling the on/off state of the transistor 20E can be supplied to the other. In addition, the electrical characteristics of the transistor 20E can be stabilized by electrical connection between the source and one of the conductive layer 112 and the conductive layer 105.

For the conductive layer 105, a material that can be used for the semiconductor layer 308 can be used. Furthermore, the conductive layer 105 preferably contains the second element. For example, the conductive layer 105 preferably contains crystalline silicon and one or more selected from boron, aluminum, gallium, indium, phosphorus, arsenic, antimony, and bismuth. Furthermore, the conductive layer 105 preferably contains the same second element contained in the regions 308n. Since the conductive layer 105 and the regions 308n can be formed through the same steps, manufacturing cost can be reduced and production yield can be increased.

Although FIG. 4B illustrates an example in which an end portion of the conductive layer 105 is substantially aligned with the end portion of the conductive layer 112, one embodiment of the present invention is not limited thereto. The end portion of the conductive layer 105 may be positioned outside the end portion of the conductive layer 112. Alternatively, the end portion of the conductive layer 105 may be positioned inside the end portion of the conductive layer 112.

Structure Example 1-11

Figure 5:
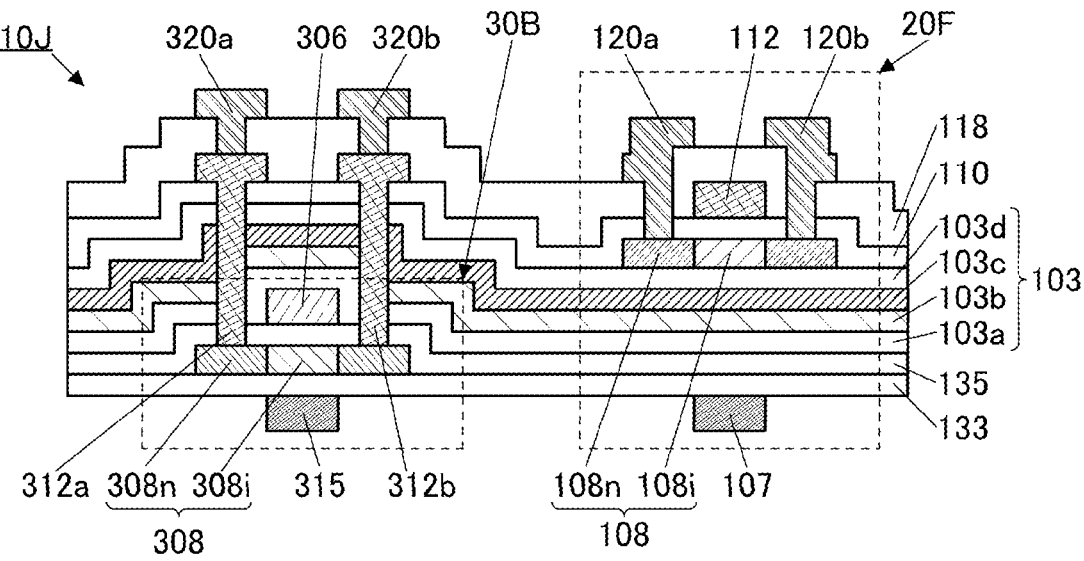
FIG. 5 is a cross-sectional view illustrating a structure example of a semiconductor device.

FIG. 5 illustrates a structure example different from that of the above-described semiconductor device 10E. A semiconductor device 10J illustrated in FIG. 5 includes a transistor 20F and the transistor 30B. FIG. 5 illustrates a schematic cross-sectional view of the transistor 20F and the transistor 30B in the channel length direction. The semiconductor device 10J is different from the semiconductor device 10E mainly in including a conductive layer 107 instead of the conductive layer 153.

In the transistor 20F, the conductive layer 107 includes a region overlapping with the semiconductor layer 108, the insulating layer 110, and the conductive layer 112 with the insulating layer 133, the insulating layer 135, and the insulating layer 103 therebetween. In the transistor 20F, the conductive layer 107 functions as a first gate electrode (back gate electrode). The insulating layer 133, the insulating layer 135, and the insulating layer 103 function as a first gate insulating layer. In this case, the conductive layer 112 functions as a second gate electrode (top gate electrode), and the insulating layer 110 functions as a second gate insulating layer.

For example, when the same potential is supplied to the conductive layer 112 and the conductive layer 107, the amount of current which can flow in the transistor 20F in an on state can be increased. In the transistor 20F, a potential for controlling the threshold voltage can be supplied to one of the conductive layer 112 and the conductive layer 107, and a potential for controlling the on/off state of the transistor 20F can be supplied to the other. In addition, the electrical characteristics of the transistor 20F can be stabilized by electrical connection between the source and one of the conductive layer 112 and the conductive layer 107.

The conductive layer 107 and the conductive layer 315 can each be formed using a material that can be used for the conductive layer 112. Furthermore, the conductive layer 107 and the conductive layer 315 are preferably formed using the same material. Furthermore, the conductive layer 107 and the conductive layer 315 are preferably formed by processing the same conductive film. By the formation through processing of the same conductive film, manufacturing cost can be reduced and production yield can be increased.

Although FIG. 5 illustrates an example in which an end portion of the conductive layer 107 is substantially aligned with the end portion of the conductive layer 112, one embodiment of the present invention is not limited thereto. The end portion of the conductive layer 107 may be positioned outside the end portion of the conductive layer 112. Alternatively, the end portion of the conductive layer 107 may be positioned inside the end portion of the conductive layer 112.

Structure Example 2

Structure examples different from those of the semiconductor device 10 to the semiconductor device 10J described above will be described.

Structure Example 2-1

Figure 6A:
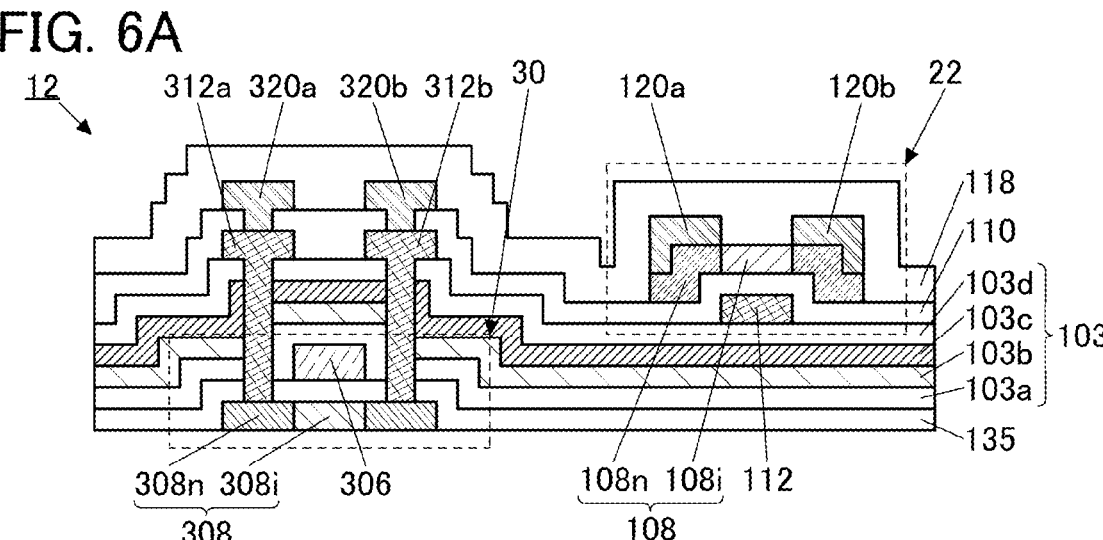
FIG. 6A, FIG. 6B, and FIG. 6C are cross-sectional views illustrating structure examples of a semiconductor device.

FIG. 6A illustrates a schematic cross-sectional view of a semiconductor device 12. The semiconductor device 12 includes a transistor 22 and the transistor 30. FIG. 6A illustrates a schematic cross-sectional view of the transistor 22 and the transistor 30 in the channel length direction.

The transistor 22 includes the semiconductor layer 108, the insulating layer 110, and the conductive layer 112. The insulating layer 110 functions as a gate insulating layer. The conductive layer 112 functions as a gate electrode. The transistor 22 is what is called a bottom-gate transistor, in which the gate electrode is provided below the semiconductor layer 108. A metal oxide can be suitably used as the semiconductor layer 108, for example. The bottom-gate transistor 22, which is manufactured through less steps than those of the above-described top-gate transistor 20 or the like, can reduce the manufacturing cost of the semiconductor device 12. The transistor 22 includes the conductive layer 120a and the conductive layer 120b over the regions 108n. The conductive layer 120a and the conductive layer 120b each include a region in contact with the region 108n. The conductive layer 120a functions as one of a source electrode and a drain electrode of the transistor 22, and the conductive layer 120b functions as the other of the source electrode and the drain electrode.

The transistor 30 includes the semiconductor layer 308, the insulating layer 135, and the conductive layer 306. The insulating layer 135 functions as a gate insulating layer. The conductive layer 306 functions as a gate electrode. The transistor 30 is what is called a top-gate transistor, in which the gate electrode is provided over the semiconductor layer 308. As the semiconductor layer 308, silicon can be suitably used, for example.

The semiconductor device 12 includes the insulating layer 118 covering the transistor 22 and the transistor 30. The insulating layer 118 has a function of a protective insulating layer of the transistor 22 and the transistor 30.

Structure Example 2-2

Figure 6B:
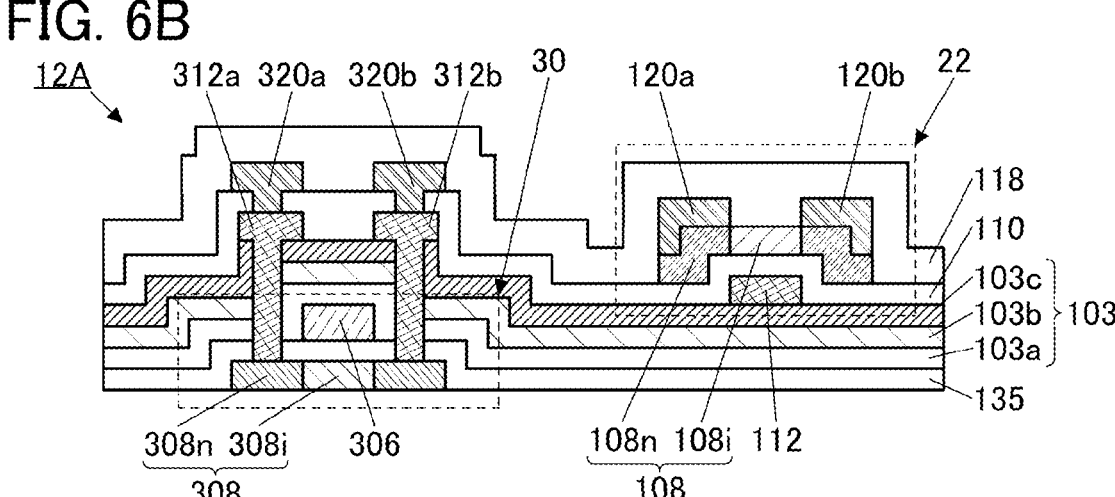

FIG. 6B illustrates a structure example different from that of the above-described semiconductor device 12. A semiconductor device 12A illustrated in FIG. 6B includes the transistor 22 and the transistor 30. FIG. 6B illustrates a schematic cross-sectional view of the transistor 22 and the transistor 30 in the channel length direction. The semiconductor device 12A is different from the semiconductor device 12 mainly in not including the insulating layer 103d.

The conductive layer 112 functioning as a gate electrode of the transistor 22 includes a region in contact with the insulating layer 103c. The conductive layer 312a and the conductive layer 312b functioning as the source electrode and the drain electrode of the transistor 30 include regions in contact with the insulating layer 103c. By having the structure not provided with the insulating layer 103d, the manufacturing cost of the semiconductor device 12A can be reduced.

Note that although FIG. 6B illustrates an example where the insulating layer 103 has a three-layer structure including the insulating layer 103a, the insulating layer 103b, and the insulating layer 103c, one embodiment of the present invention is not limited thereto. The insulating layer 103 preferably includes the insulating layer 103b and the insulating layer 103c over the insulating layer 103b and may have a structure not including the insulating layer 103a. For example, the insulating layer 103 can have a two-layer structure including the insulating layer 103b and the insulating layer 103c.

Structure Example 2-3

Figure 6C:
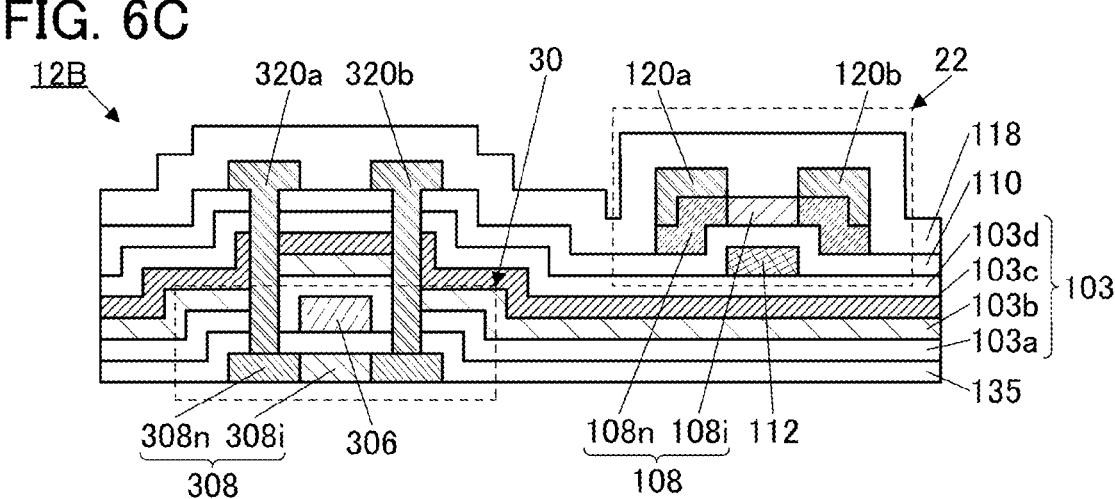

FIG. 6C illustrates a structure example different from that of the above-described semiconductor device 12. A semiconductor device 12B illustrated in FIG. 6C includes the transistor 22 and the transistor 30. FIG. 6C illustrates a schematic cross-sectional view of the transistor 22 and the transistor 30 in the channel length direction. The semiconductor device 12B is different from the semiconductor device 12 mainly in not including the conductive layer 312a and the conductive layer 312b.

The conductive layer 320a and the conductive layer 320b are each electrically connected to the region 308n through the opening provided in the insulating layer 135, the insulating layer 103, and the insulating layer 110. The conductive layer 320a functions as one of the source electrode and the drain electrode of the transistor 30, and the conductive layer 320b functions as the other of the source electrode and the drain electrode. Not providing the conductive layer 312a and the conductive layer 312b can reduce manufacturing cost.

Structure Example 2-4

Figure 7A:
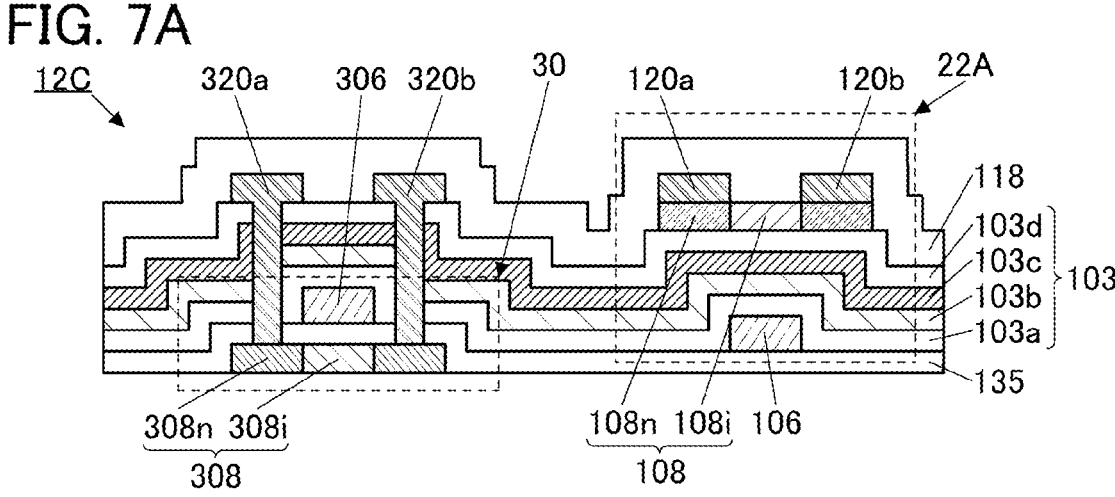
FIG. 7A and FIG. 7B are cross-sectional views illustrating structure examples of a semiconductor device.

FIG. 7A illustrates a structure example different from that of the above-described semiconductor device 12B. A semiconductor device 12C illustrated in FIG. 7A includes a transistor 22A and the transistor 30. FIG. 7A illustrates a schematic cross-sectional view of the transistor 22A and the transistor 30 in the channel length direction. The semiconductor device 12C is different from the semiconductor device 12B mainly in including the conductive layer 106 instead of the conductive layer 112 and in not including the insulating layer 110.

In the transistor 22A, the conductive layer 106 includes a region overlapping with the semiconductor layer 108 with the insulating layer 103 therebetween. In the transistor 22A, the conductive layer 106 functions as a gate electrode. The insulating layer 103 functions as a gate insulating layer.

It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

The conductive layer 106 and the conductive layer 306 can each be formed using a material that can be used for the conductive layer 112. Furthermore, the conductive layer 106 and the conductive layer 306 are preferably formed using the same material. Furthermore, the conductive layer 106 and the conductive layer 306 are preferably formed by processing the same conductive film. By the formation through processing of the same conductive film, manufacturing cost can be reduced and production yield can be increased.

Structure Example 2-5

Figure 7B:
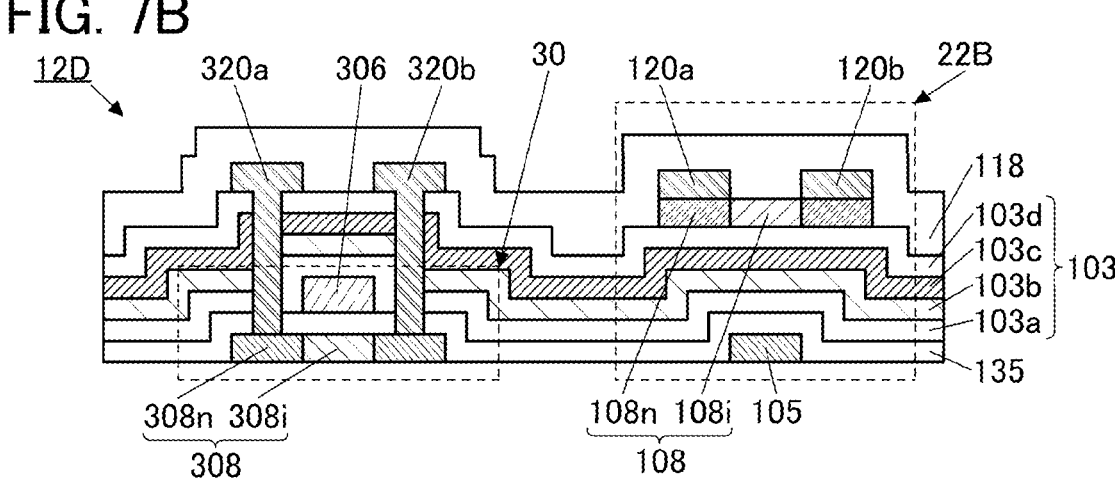

FIG. 7B illustrates a structure example different from that of the above-described semiconductor device 12B. A semiconductor device 12D illustrated in FIG. 7B includes a transistor 22B and the transistor 30. FIG. 7B illustrates a schematic cross-sectional view of the transistor 22B and the transistor 30 in the channel length direction. The semiconductor device 12D is different from the semiconductor device 12B mainly in including the conductive layer 105 instead of the conductive layer 112 and in not including the insulating layer 110.

In the transistor 22B, the conductive layer 105 includes a region overlapping with the semiconductor layer 108 with the insulating layer 135 and the insulating layer 103 therebetween. In the transistor 22B, the conductive layer 105 functions as a gate electrode. The insulating layer 135 and the insulating layer 103 function as a gate insulating layer.

It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

Structure Example 2-6

Figure 8A:
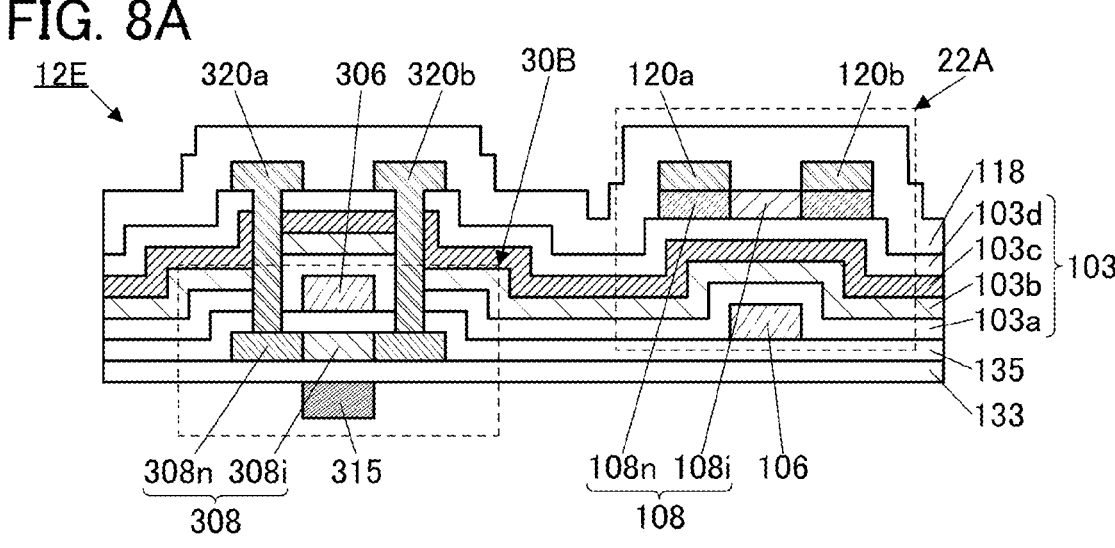
FIG. 8A and FIG. 8B are cross-sectional views illustrating structure examples of a semiconductor device.

FIG. 8A illustrates a structure example different from that of the above-described semiconductor device 12C. A semiconductor device 12E illustrated in FIG. 8A includes the transistor 22A and the transistor 30B. FIG. 8A illustrates a schematic cross-sectional view of the transistor 22A and the transistor 30B in the channel length direction. The semiconductor device 12E is different from the semiconductor device 12C mainly in including the conductive layer 315 and the insulating layer 133.

The transistor 30B includes the conductive layer 315 and the insulating layer 133. The conductive layer 315 includes a region overlapping with the semiconductor layer 308, the insulating layer 135, and the conductive layer 306 with the insulating layer 133 therebetween. In the transistor 30B, the conductive layer 315 functions as a first gate electrode (back gate electrode). The insulating layer 133 functions as a first gate insulating layer. In this case, the conductive layer 306 functions as a second gate electrode (top gate electrode), and the insulating layer 135 functions as a second gate insulating layer.

For example, when the same potential is supplied to the conductive layer 306 and the conductive layer 315, the amount of current which can flow in the transistor 30B in an on state can be increased. In the transistor 30B, a potential for controlling the threshold voltage can be supplied to one of the conductive layer 306 and the conductive layer 315, and a potential for controlling the on/off state of the transistor 30B can be supplied to the other. In addition, the electrical characteristics of the transistor 30B can be stabilized by electrical connection between the source and one of the conductive layer 306 and the conductive layer 315.

Although FIG. 8A illustrates an example in which the end portion of the conductive layer 315 is substantially aligned with the end portion of the conductive layer 306, one embodiment of the present invention is not limited thereto. The end portion of the conductive layer 315 may be positioned outside the end portion of the conductive layer 306. Alternatively, the end portion of the conductive layer 315 may be positioned inside the end portion of the conductive layer 306.

Structure Example 2-7

Figure 8B:
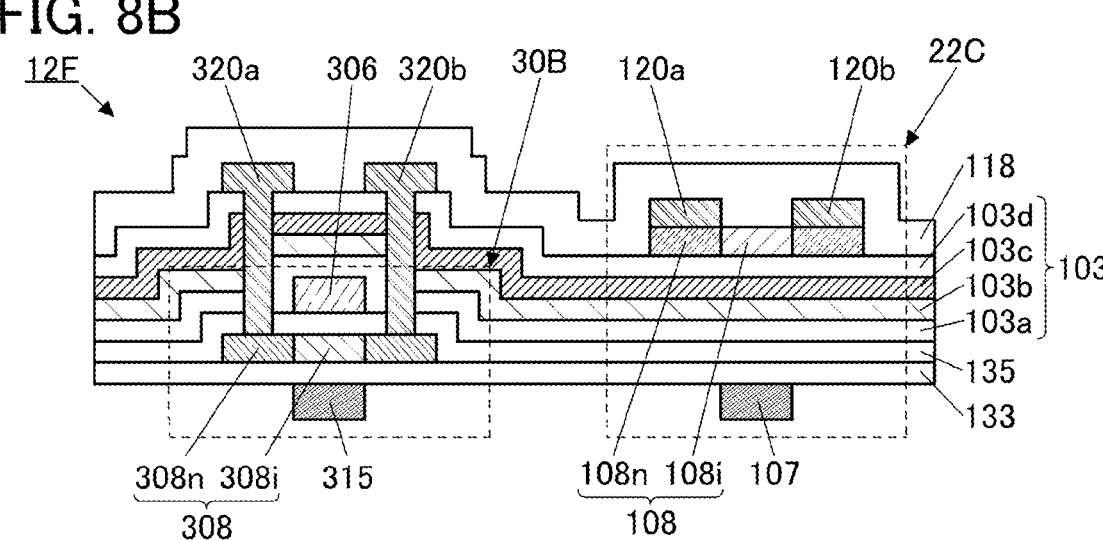

FIG. 8B illustrates a structure example different from that of the above-described semiconductor device 12E. A semiconductor device 12F illustrated in FIG. 8B includes a transistor 22C and the transistor 30B. FIG. 8B illustrates a schematic cross-sectional view of the transistor 22C and the transistor 30B in the channel length direction. The semiconductor device 12F is different from the semiconductor device 12E mainly in including the conductive layer 107 instead of the conductive layer 106.

In the transistor 22C, the conductive layer 107 includes a region overlapping with the semiconductor layer 108 with the insulating layer 133, the insulating layer 135, and the insulating layer 103 therebetween. In the transistor 22C, the conductive layer 107 functions as a gate electrode. The insulating layer 133, the insulating layer 135, and the insulating layer 103 function as a gate insulating layer.

The conductive layer 107 and the conductive layer 315 can each be formed using a material that can be used for the conductive layer 112. Furthermore, the conductive layer 107 and the conductive layer 315 are preferably formed using the same material. Furthermore, the conductive layer 107 and the conductive layer 315 are preferably formed by processing the same conductive film. By the formation through processing of the same conductive film, manufacturing cost can be reduced and production yield can be increased.

Structure Example 3

Structure examples different from those of the semiconductor device 10 to the semiconductor device 10J and the semiconductor device 12 to the semiconductor device 12F described above will be described.

Structure Example 3-1

Figure 9A:
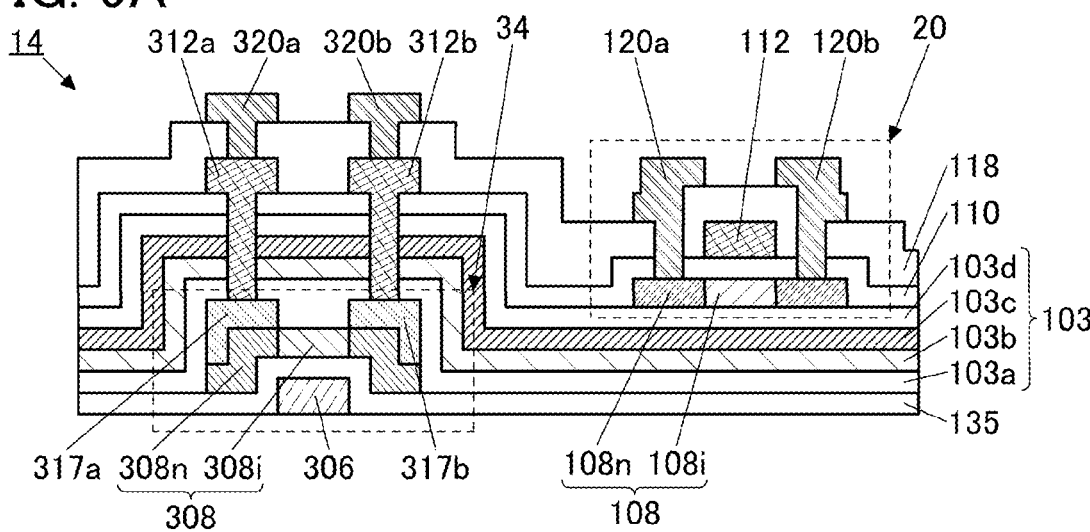
FIG. 9A, FIG. 9B, and FIG. 9C are cross-sectional views illustrating structure examples of a semiconductor device.

A schematic cross-sectional view of a semiconductor device 14 is illustrated in FIG. 9A. The semiconductor device 14 includes the transistor 20 and a transistor 34. FIG. 9A illustrates a schematic cross-sectional view of the transistor 20 and the transistor 34 in the channel length direction.

The transistor 20 includes the semiconductor layer 108, the insulating layer 110, and the conductive layer 112. The insulating layer 110 functions as a gate insulating layer. The conductive layer 112 functions as a gate electrode. The transistor 20 is what is called a top-gate transistor, in which the gate electrode is provided over the semiconductor layer 108. As the semiconductor layer 108, a metal oxide can be suitably used, for example. For the transistor 20, the above description of the transistor 20 can be referred to; thus, the detailed description is omitted.

The transistor 34 includes the semiconductor layer 308, the insulating layer 135, and the conductive layer 306. The insulating layer 135 functions as a gate insulating layer. The conductive layer 306 functions as a gate electrode. The transistor 34 is what is called a bottom-gate transistor, in which the gate electrode is provided below the semiconductor layer 308. As the semiconductor layer 308, silicon can be suitably used, for example.

The transistor 34 includes a conductive layer 317a and a conductive layer 317b over the regions 308n. The conductive layer 317a and the conductive layer 317b each include a region in contact with the region 308n. The conductive layer 317a functions as one of a source electrode and a drain electrode of the transistor 34, and the conductive layer 317b functions as the other of the source electrode and the drain electrode.

The semiconductor device 14 includes an insulating layer 103, the insulating layer 110, and the insulating layer 118 which cover the semiconductor layer 308, the insulating layer 135, the conductive layer 306, the conductive layer 317a, and the conductive layer 317b. The insulating layer 103, the insulating layer 110, and the insulating layer 118 function as protective insulating layers of the transistor 34.

The above description can be referred to for the insulating layer 103; thus, the detailed description is omitted.

The conductive layer 312a and the conductive layer 312b are provided over the insulating layer 110. The conductive layer 312a and the conductive layer 312b are each electrically connected to the region 308n through an opening provided in the insulating layer 110 and the insulating layer 103.

The conductive layer 312a and the conductive layer 312b can be formed using a material that can be used for the conductive layer 112. Furthermore, the conductive layer 312a, the conductive layer 312b, and the conductive layer 112 are preferably formed using the same material. Furthermore, the conductive layer 312a, the conductive layer 312b, and the conductive layer 112 are preferably formed by processing the same conductive film. By the formation through processing of the same conductive film, manufacturing cost can be reduced and production yield can be increased.

The conductive layer 320a and the conductive layer 320b are provided over the insulating layer 118. The conductive layer 320a and the conductive layer 320b are each electrically connected to the conductive layer 312a or the conductive layer 312b through an opening provided in the insulating layer 118. Illustrated in FIG. 9A is an example where the conductive layer 320a is electrically connected to the region 308n through the conductive layer 312a, and the conductive layer 320b is electrically connected to the region 308n through the conductive layer 312b. It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

Structure Example 3-2

Figure 9B:
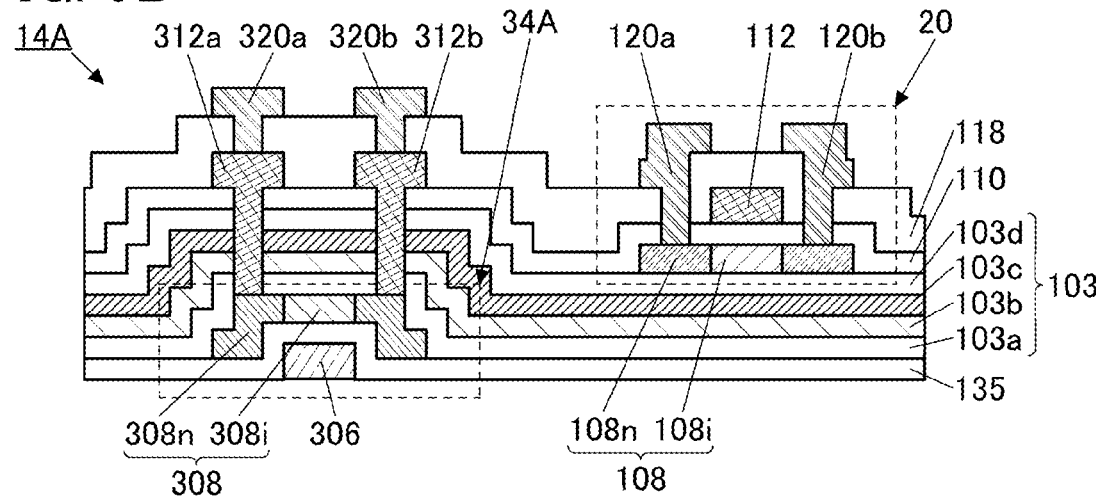

FIG. 9B illustrates a structure example different from that of the above-described semiconductor device 14. A semiconductor device 14A illustrated in FIG. 9B includes the transistor 20 and a transistor 34A. FIG. 9B illustrates a schematic cross-sectional view of the transistor 20 and the transistor 34A in the channel length direction. The semiconductor device 14A is different from the semiconductor device 14 mainly in not including the conductive layer 317a and the conductive layer 317b.

The conductive layer 312a and the conductive layer 312b are each electrically connected to the region 308n through the opening provided in the insulating layer 103 and the insulating layer 110. The conductive layer 312a functions as one of a source electrode and a drain electrode of the transistor 34A, and the conductive layer 312b functions as the other of the source electrode and the drain electrode. Not providing the conductive layer 317a and the conductive layer 317b can reduce manufacturing cost.

Structure Example 3-3

Figure 9C:
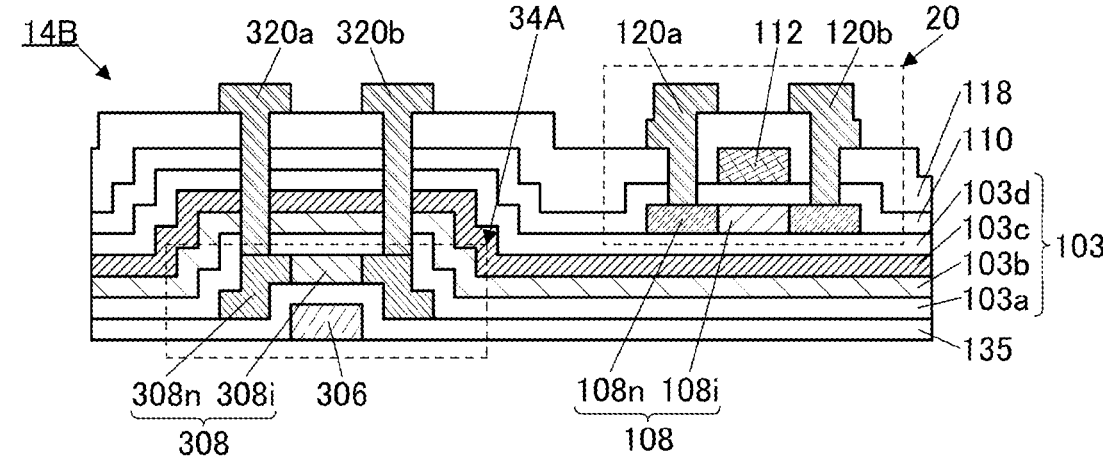

FIG. 9C illustrates a structure example different from that of the above-described semiconductor device 14A. A semiconductor device 14B illustrated in FIG. 9C includes the transistor 20 and the transistor 34A. FIG. 9C illustrates a schematic cross-sectional view of the transistor 20 and the transistor 34A in the channel length direction. The semiconductor device 14B is different from the semiconductor device 14A mainly in not including the conductive layer 312a and the conductive layer 312b.

The conductive layer 320a and the conductive layer 320b are each electrically connected to the region 308n through the opening provided in the insulating layer 103, the insulating layer 110, and the insulating layer 118. The conductive layer 320a functions as one of the source electrode and the drain electrode of the transistor 34A, and the conductive layer 320b functions as the other of the source electrode and the drain electrode. Not providing the conductive layer 312a and the conductive layer 312b can reduce manufacturing cost.

Structure Example 3-4

Figure 10A:
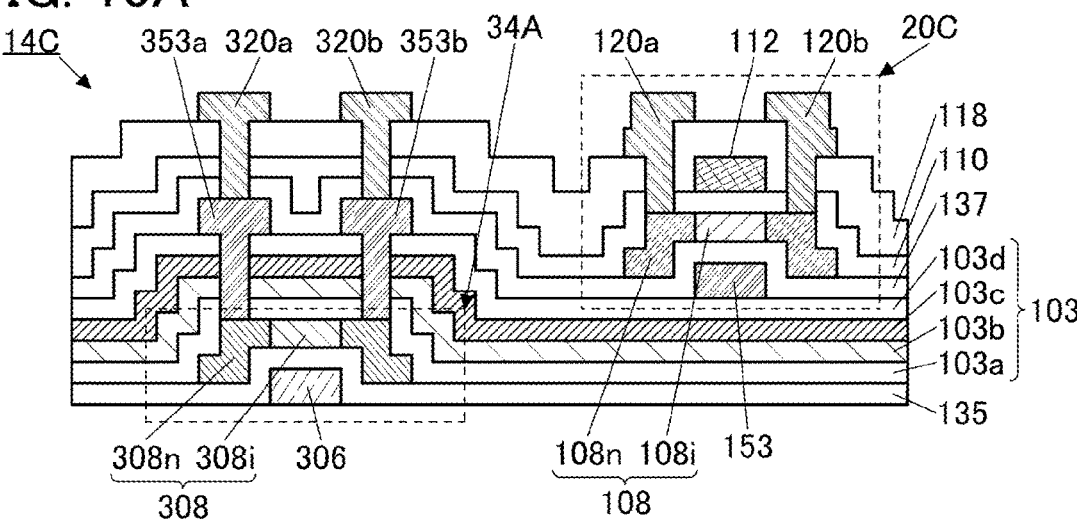
FIG. 10A, FIG. 10B, and FIG. 10C are cross-sectional views illustrating structure examples of a semiconductor device.

FIG. 10A illustrates a structure example different from that of the above-described semiconductor device 14A. A semiconductor device 14C illustrated in FIG. 10A includes the transistor 20C and the transistor 34A. FIG. 10A illustrates a schematic cross-sectional view of the transistor 20C and the transistor 34A in the channel length direction. The semiconductor device 14C is different from the semiconductor device 14A mainly in including the conductive layer 153 and the insulating layer 137 and in including the conductive layer 353a and the conductive layer 353b instead of the conductive layer 312a and the conductive layer 312b.

The above description can be referred to for the transistor 20C; thus, the detailed description is omitted.

The conductive layer 353a and the conductive layer 353b are each electrically connected to the region 308n through an opening provided in the insulating layer 103. The conductive layer 353a functions as one of the source electrode and the drain electrode of the transistor 34A, and the conductive layer 353b functions as the other of the source electrode and the drain electrode.

The conductive layer 153, the conductive layer 353a, and the conductive layer 353b can each be formed using a material that can be used for the conductive layer 112. Furthermore, the conductive layer 153, the conductive layer 353a, and the conductive layer 353b are preferably formed using the same material. Furthermore, the conductive layer 153, the conductive layer 353a, and the conductive layer 353b are preferably formed by processing the same conductive film. By the formation through processing of the same conductive film, manufacturing cost can be reduced and production yield can be increased.

Structure Example 3-5

Figure 10B:
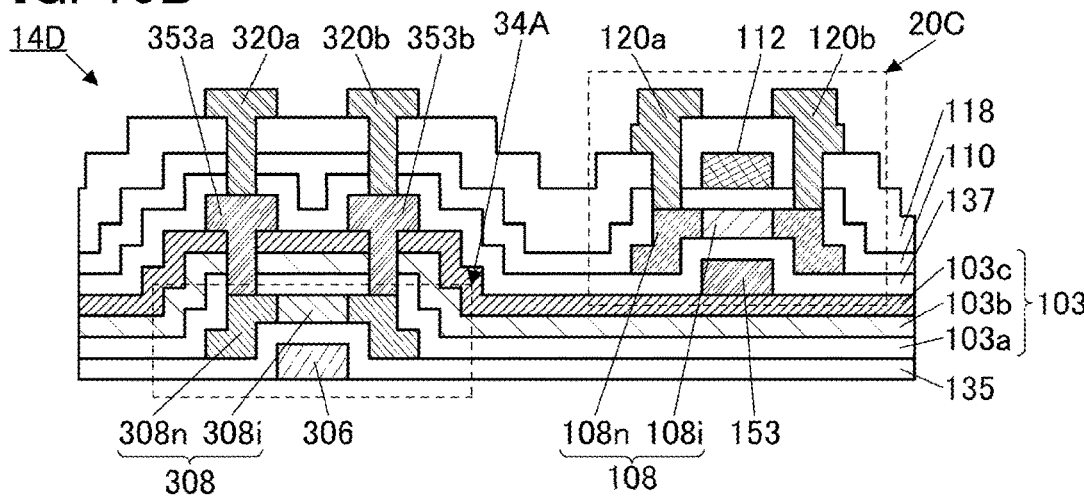

FIG. 10B illustrates a structure example different from that of the above-described semiconductor device 14C. A semiconductor device 14D illustrated in FIG. 10B includes the transistor 20C and the transistor 34A. FIG. 10B illustrates a schematic cross-sectional view of the transistor 20C and the transistor 34A in the channel length direction. The semiconductor device 14D is different from the semiconductor device 14C mainly in not including the insulating layer 103d.

The conductive layer 153 functioning as a first gate electrode (back gate electrode) of the transistor 20C includes a region in contact with the insulating layer 103c. The conductive layer 353a and the conductive layer 353b functioning as the source electrode and the drain electrode of the transistor 34A include regions in contact with the insulating layer 103c. By having the structure not provided with the insulating layer 103d, the manufacturing cost of the semiconductor device 14D can be reduced.

Note that although FIG. 10B illustrates an example where the insulating layer 103 has a three-layer structure including the insulating layer 103a, the insulating layer 103b, and the insulating layer 103c, one embodiment of the present invention is not limited thereto. The insulating layer 103 preferably includes the insulating layer 103b and the insulating layer 103c over the insulating layer 103b and may have a structure not including the insulating layer 103a. For example, the insulating layer 103 can have a two-layer structure including the insulating layer 103b and the insulating layer 103c.

Structure Example 3-6

Figure 10C:
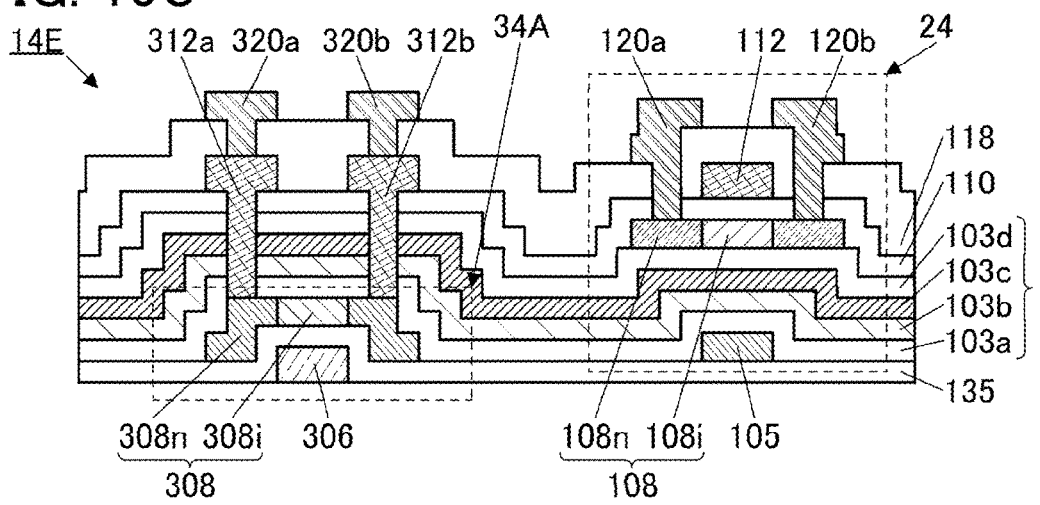

FIG. 10C illustrates a structure example different from that of the above-described semiconductor device 14C. A semiconductor device 14E illustrated in FIG. 10C includes a transistor 24 and the transistor 34A. FIG. 10C illustrates a schematic cross-sectional view of the transistor 24 and the transistor 34A in the channel length direction. The semiconductor device 14E is different from the semiconductor device 14C mainly in not including the insulating layer 137, in including the conductive layer 105 instead of the conductive layer 153, and in including the conductive layer 312a and the conductive layer 312b instead of the conductive layer 353a and the conductive layer 353b.

For the transistor 24, the above description of the transistor 20E can be referred to; thus, the detailed description is omitted.

The conductive layer 312a and the conductive layer 312b are each electrically connected to the region 308n through an opening provided in the insulating layer 103 and the insulating layer 110. The conductive layer 312a functions as one of the source electrode and the drain electrode of the transistor 34A, and the conductive layer 312b functions as the other of the source electrode and the drain electrode.

The conductive layer 312a and the conductive layer 312b can be formed using a material that can be used for the conductive layer 112. Furthermore, the conductive layer 112, the conductive layer 312a, and the conductive layer 312b are preferably formed using the same material. Furthermore, the conductive layer 112, the conductive layer 312a, and the conductive layer 312b are preferably formed by processing the same conductive film. By the formation through processing of the same conductive film, manufacturing cost can be reduced and production yield can be increased.

Structure Example 3-7

Figure 11A:
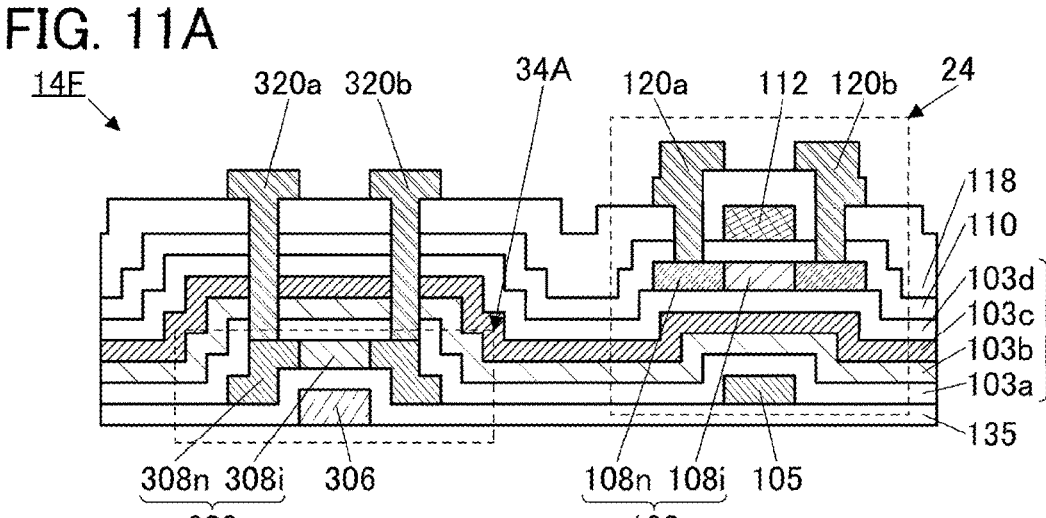
FIG. 11A, FIG. 11B, and FIG. 11C are cross-sectional views illustrating structure examples of a semiconductor device.

FIG. 11A illustrates a structure example different from that of the above-described semiconductor device 14E. A semiconductor device 14F illustrated in FIG. 11A includes the transistor 24 and the transistor 34A. FIG. 11A illustrates a schematic cross-sectional view of the transistor 24 and the transistor 34A in the channel length direction. The semiconductor device 14F is different from the semiconductor device 14E mainly in not including the conductive layer 312a and the conductive layer 312b.

The above description can be referred to for the transistor 24 and the transistor 34A; thus, the detailed description is omitted.

Structure Example 3-8

Figure 11B:
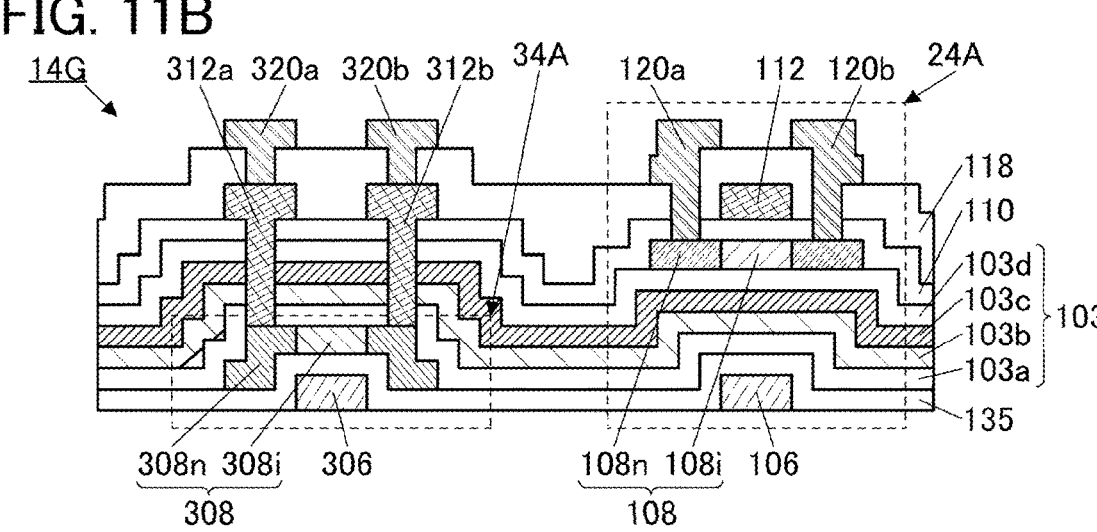

FIG. 11B illustrates a structure example different from that of the above-described semiconductor device 14E. A semiconductor device 14G illustrated in FIG. 11B includes a transistor 24A and the transistor 34A. FIG. 11B illustrates a schematic cross-sectional view of the transistor 24A and the transistor 34A in the channel length direction. The semiconductor device 14G is different from the semiconductor device 14E mainly in including the conductive layer 106 instead of the conductive layer 105.

For the transistor 24A, the above description of the transistor 20D can be referred to; thus, the detailed description is omitted.

Structure Example 3-9

Figure 11C:
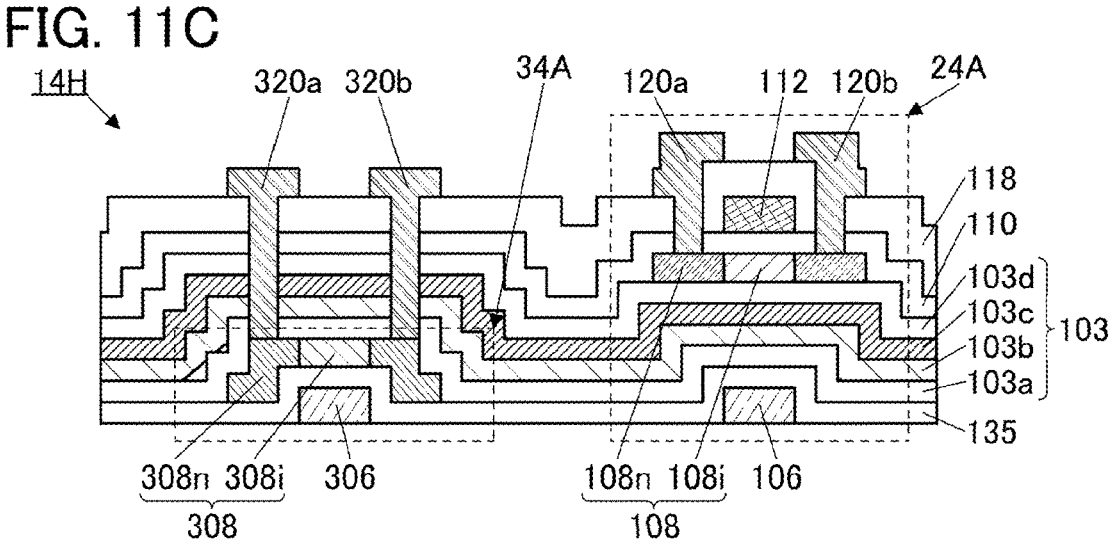

FIG. 11C illustrates a structure example different from that of the above-described semiconductor device 14G. A semiconductor device 14H illustrated in FIG. 11C includes the transistor 24A and the transistor 34A. FIG. 11C illustrates a schematic cross-sectional view of the transistor 24A and the transistor 34A in the channel length direction. The semiconductor device 14H is different from the semiconductor device 14G mainly in not including the conductive layer 312a and the conductive layer 312b.

For the transistor 24A and the transistor 34A, the above description can be referred to; thus, the detailed description is omitted.

Structure Example 4

Structure examples different from those of the semiconductor device 10 to the semiconductor device 10J, the semiconductor device 12 to the semiconductor device 12F, and the semiconductor device 14 to the semiconductor device 14H described above will be described.

Structure Example 4-1

Figure 12A:
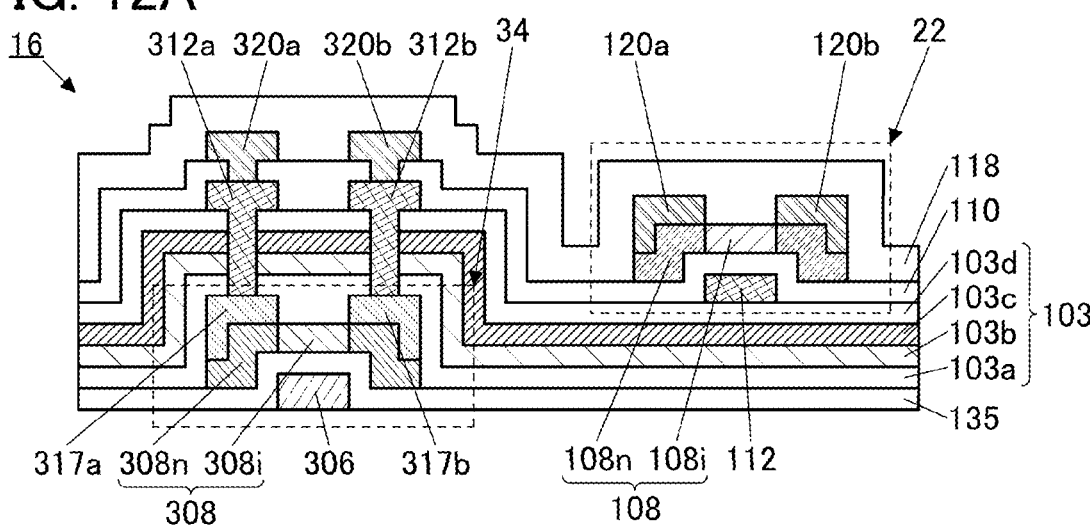
FIG. 12A, FIG. 12B, and FIG. 12C are cross-sectional views illustrating structure examples of a semiconductor device.

A schematic cross-sectional view of a semiconductor device 16 is illustrated in FIG. 12A. The semiconductor device 16 includes the transistor 22 and the transistor 34. FIG. 12A illustrates a schematic cross-sectional view of the transistor 22 and the transistor 34 in the channel length direction.

The transistor 22 includes the semiconductor layer 108, the insulating layer 110, and the conductive layer 112. The insulating layer 110 functions as a gate insulating layer. The conductive layer 112 functions as a gate electrode. The transistor 22 is what is called a bottom-gate transistor, in which the gate electrode is provided below the semiconductor layer 108. As the semiconductor layer 108, a metal oxide can be suitably used, for example. For the transistor 22, the above description of the transistor 22 can be referred to; thus, the detailed description is omitted.

The transistor 34 includes the semiconductor layer 308, the insulating layer 135, and the conductive layer 306. The insulating layer 135 functions as a gate insulating layer. The conductive layer 306 functions as a gate electrode. The transistor 34 is what is called a bottom-gate transistor, in which the gate electrode is provided below the semiconductor layer 308. As the semiconductor layer 308, silicon can be suitably used, for example. For the transistor 34, the above description of the transistor 34 can be referred to; thus, the detailed description is omitted.

The semiconductor device 16 includes the insulating layer 118 covering the transistor 22 and the transistor 34. The insulating layer 118 has a function of a protective insulating layer of the transistor 22 and the transistor 34.

Structure Example 4-2

Figure 12B:
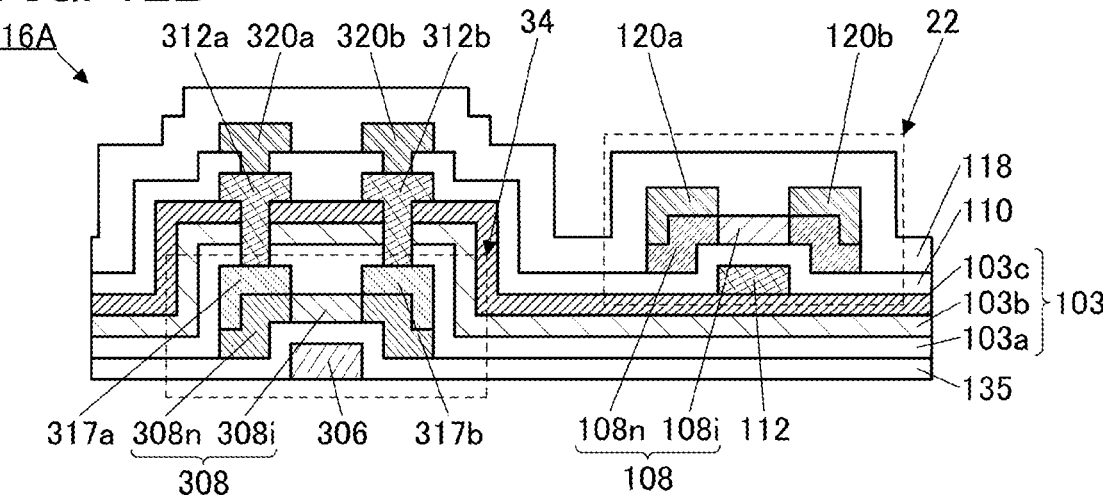

FIG. 12B illustrates a structure example different from that of the above-described semiconductor device 16. A semiconductor device 16A illustrated in FIG. 12B includes the transistor 22 and the transistor 34. FIG. 12B illustrates a schematic cross-sectional view of the transistor 22 and the transistor 34 in the channel length direction. The semiconductor device 16A is different from the semiconductor device 16 mainly in not including the insulating layer 103d.

The conductive layer 112 functioning as the gate electrode of the transistor 22 includes a region in contact with the insulating layer 103c. The conductive layer 312a and the conductive layer 312b include regions in contact with the insulating layer 103c. By having the structure not provided with the insulating layer 103d, the manufacturing cost of the semiconductor device 16A can be reduced.

Note that although FIG. 12B illustrates an example where the insulating layer 103 has a three-layer structure including the insulating layer 103a, the insulating layer 103b, and the insulating layer 103c, one embodiment of the present invention is not limited thereto. The insulating layer 103 preferably includes the insulating layer 103b and the insulating layer 103c over the insulating layer 103b and may have a structure not including the insulating layer 103a. For example, the insulating layer 103 can have a two-layer structure including the insulating layer 103b and the insulating layer 103c.

Structure Example 4-3

Figure 12C:
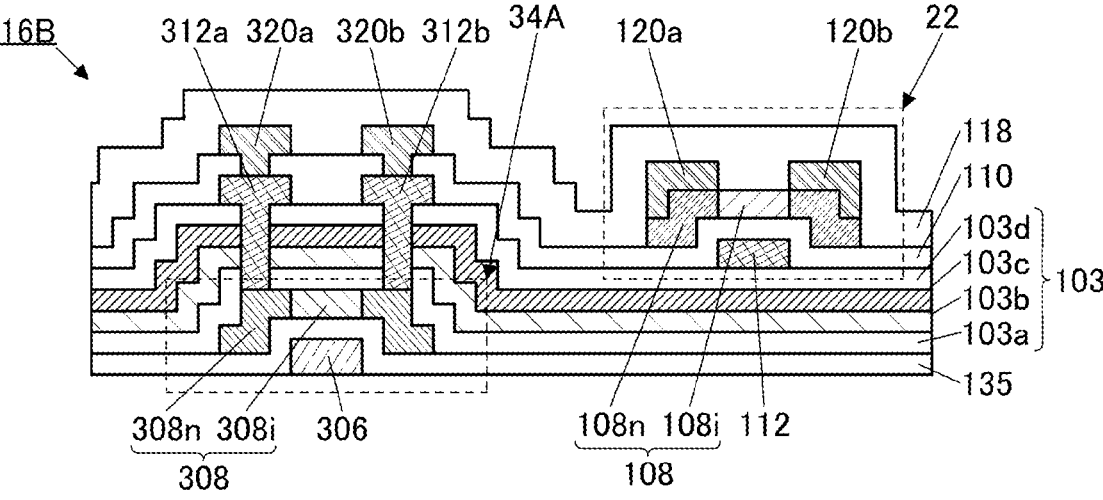

FIG. 12C illustrates a structure example different from that of the above-described semiconductor device 16. A semiconductor device 16B illustrated in FIG. 12C includes the transistor 22 and a transistor 34A. FIG. 12C illustrates a schematic cross-sectional view of the transistor 22 and the transistor 34A in the channel length direction. The semiconductor device 16B is different from the semiconductor device 16 mainly in not including the conductive layer 317a and the conductive layer 317b.

The conductive layer 312a and the conductive layer 312b are each electrically connected to the region 308n through the opening provided in the insulating layer 103. The conductive layer 312a functions as one of the source electrode and the drain electrode of the transistor 34A, and the conductive layer 312b functions as the other of the source electrode and the drain electrode. Not providing the conductive layer 317a and the conductive layer 317b can reduce manufacturing cost.

Structure Example 4-4

Figure 13A:
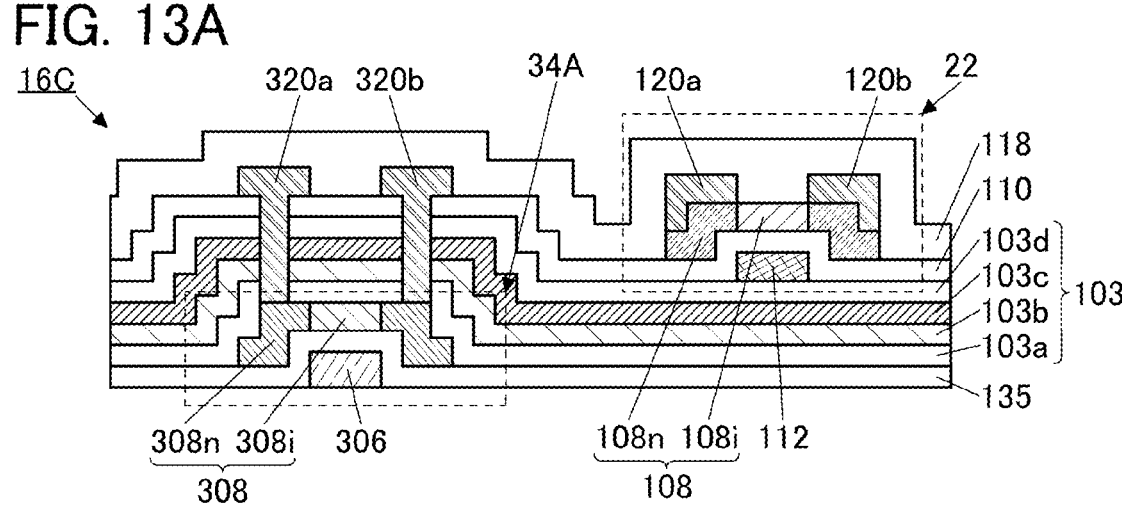
FIG. 13A, FIG. 13B, and FIG. 13C are cross-sectional views illustrating structure examples of a semiconductor device.

FIG. 13A illustrates a structure example different from that of the above-described semiconductor device 16B. A semiconductor device 16C illustrated in FIG. 13A includes the transistor 22 and the transistor 34A. FIG. 13A illustrates a schematic cross-sectional view of the transistor 22 and the transistor 34A in the channel length direction. The semiconductor device 16C is different from the semiconductor device 16B mainly in not including the conductive layer 312a and the conductive layer 312b.

The conductive layer 320a and the conductive layer 320b are each electrically connected to the region 308n through the opening provided in the insulating layer 103 and the insulating layer 110. The conductive layer 320a functions as one of the source electrode and the drain electrode of the transistor 34A, and the conductive layer 320b functions as the other of the source electrode and the drain electrode. Not providing the conductive layer 312a and the conductive layer 312b can reduce manufacturing cost.

Structure Example 4-5

Figure 13B:
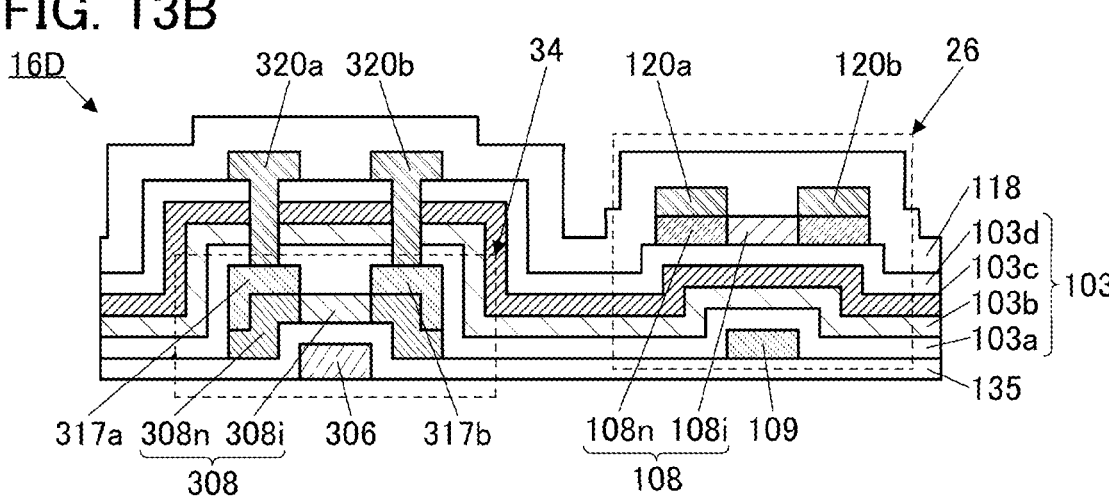

FIG. 13B illustrates a structure example different from that of the above-described semiconductor device 16. A semiconductor device 16D illustrated in FIG. 13B includes a transistor 26 and the transistor 34. FIG. 13B illustrates a schematic cross-sectional view of the transistor 26 and the transistor 34 in the channel length direction. The semiconductor device 16D is different from the semiconductor device 16 mainly in including a conductive layer 109 instead of the conductive layer 112 and in not including the conductive layer 312a and the conductive layer 312b.

In the transistor 26, the conductive layer 109 includes a region overlapping with the semiconductor layer 108 with the insulating layer 103 therebetween. In the transistor 26, the conductive layer 109 functions as a gate electrode. The insulating layer 103 functions as a gate insulating layer.

It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

The conductive layer 109, the conductive layer 317a, and the conductive layer 317b can each be formed using a material that can be used for the conductive layer 112. Furthermore, the conductive layer 109, the conductive layer 317a, and the conductive layer 317b are preferably formed using the same material. Furthermore, the conductive layer 109, the conductive layer 317a, and the conductive layer 317b are preferably formed by processing the same conductive film. By the formation through processing of the same conductive film, manufacturing cost can be reduced and production yield can be increased.

The conductive layer 320a and the conductive layer 320b are each electrically connected to the conductive layer 317a or the conductive layer 317b through the opening provided in the insulating layer 103. The conductive layer 317a functions as one of the source electrode and the drain electrode of the transistor 34A, and the conductive layer 317b functions as the other of the source electrode and the drain electrode. Not providing the conductive layer 312a and the conductive layer 312b can reduce manufacturing cost.

Structure Example 4-6

Figure 13C:
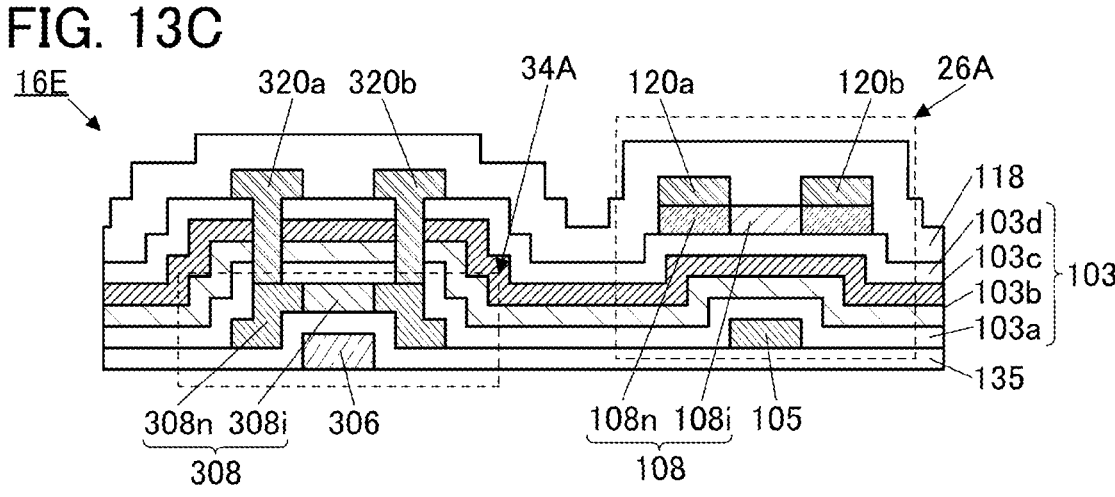

FIG. 13C illustrates a structure example different from that of the above-described semiconductor device 16. A semiconductor device 16E illustrated in FIG. 13C includes a transistor 26A and the transistor 34A. FIG. 13C illustrates a schematic cross-sectional view of the transistor 26A and the transistor 34A in the channel length direction. The semiconductor device 16E is different from the semiconductor device 16 mainly in including the conductive layer 105 instead of the conductive layer 112 and in not including the conductive layer 317a, the conductive layer 317b, the conductive layer 312a, and the conductive layer 312b.

In the transistor 26A, the conductive layer 105 includes a region overlapping with the semiconductor layer 108 with the insulating layer 103 therebetween. In the transistor 26A, the conductive layer 105 functions as a gate electrode. The insulating layer 103 functions as a gate insulating layer.

It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

The conductive layer 320a and the conductive layer 320b are each electrically connected to the region 308n through the opening provided in the insulating layer 103. The conductive layer 320a functions as one of the source electrode and the drain electrode of the transistor 34A, and the conductive layer 320b functions as the other of the source electrode and the drain electrode. Not providing the conductive layer 317a, the conductive layer 317b, the conductive layer 312a, and the conductive layer 312b can reduce manufacturing cost.

Structure Example 4-7

Figure 14:
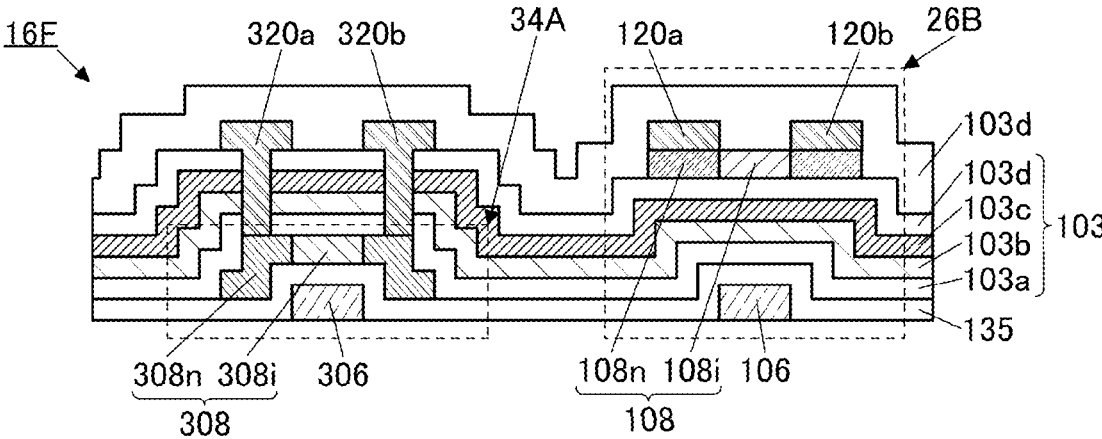
FIG. 14 is a cross-sectional view illustrating a structure example of a semiconductor device.

FIG. 14 illustrates a structure example different from that of the above-described semiconductor device 16E. A semiconductor device 16F illustrated in FIG. 14 includes a transistor 26B and the transistor 34A. FIG. 14 illustrates a schematic cross-sectional view of the transistor 26B and the transistor 34A in the channel length direction. The semiconductor device 16F is different from the semiconductor device 16E mainly in including the conductive layer 106 instead of the conductive layer 105.

In the transistor 26B, the conductive layer 106 includes a region overlapping with the semiconductor layer 108 with the insulating layer 135 and the insulating layer 103 therebetween. In the transistor 26B, the conductive layer 106 functions as a gate electrode. The insulating layer 135 and the insulating layer 103 function as a gate insulating layer.

It is preferable to provide the insulating layer 103d on the side on which the insulating layer 103 is in contact with the semiconductor layer 108 and provide the semiconductor layer 108 in contact with the insulating layer 103d. With the structure where the insulating layer 103d containing an oxide or an oxynitride is in contact with the semiconductor layer 108, oxygen vacancies (Vo) or VoH in the semiconductor layer 108 can be reduced.

The conductive layer 106 and the conductive layer 306 can each be formed using a material that can be used for the conductive layer 112. Furthermore, the conductive layer 106 and the conductive layer 306 are preferably formed using the same material. Furthermore, the conductive layer 106 and the conductive layer 306 are preferably formed by processing the same conductive film. By the formation through processing of the same conductive film, manufacturing cost can be reduced and production yield can be increased.

Embodiment 2

In this embodiment, more specific structure examples of the semiconductor devices described in the above embodiment and a manufacturing method will be described.

Structure Example 5

Structure Example 5-1

Figure 15A:
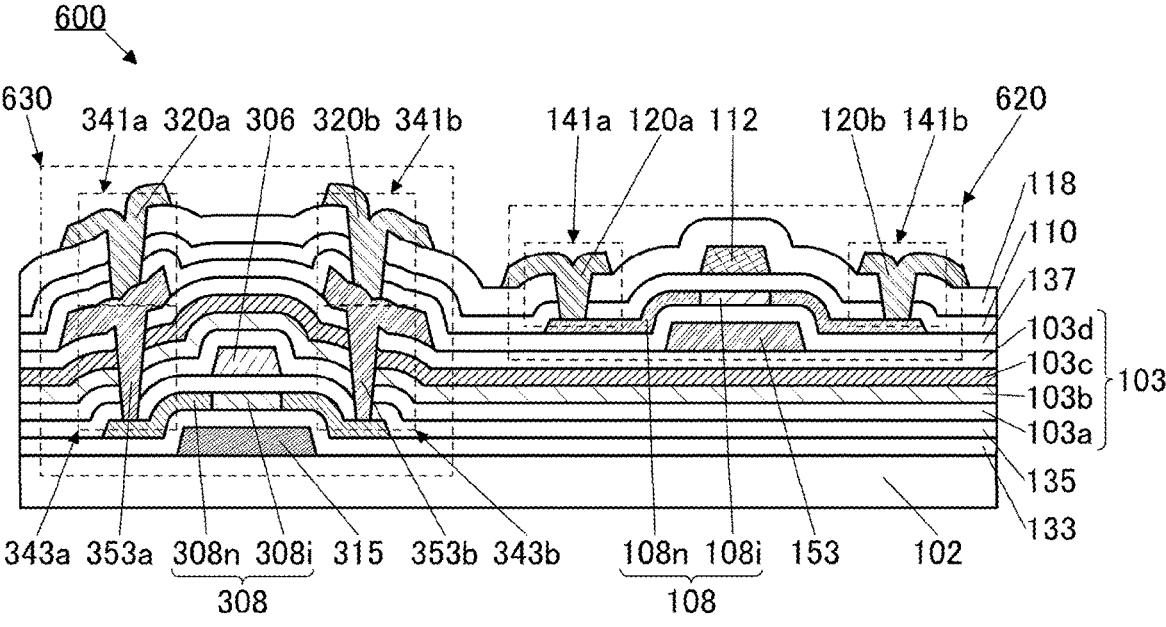
FIG. 15A and FIG. 15B are cross-sectional views illustrating structure examples of a semiconductor device.

FIG. 15A illustrates a schematic cross-sectional view of a semiconductor device 600. The semiconductor device 600 includes a top-gate transistor 620 and a top-gate transistor 630. FIG. 15A illustrates a schematic cross-sectional view of the transistor 620 and the transistor 630 in the channel length direction. Note that the semiconductor device 600 corresponds to the semiconductor device 10E described in Embodiment 1.

The transistor 620 includes the semiconductor layer 108, the insulating layer 110, the insulating layer 137, the conductive layer 112, the conductive layer 153, the insulating layer 118, and the like. The conductive layer 153 includes a region overlapping with the semiconductor layer 108 with the insulating layer 137 therebetween. The conductive layer 112 includes a region overlapping with the semiconductor layer 108 with the insulating layer 110 therebetween.

In the transistor 620, the conductive layer 153 has a function of a first gate electrode (also referred to as a bottom gate electrode), and the conductive layer 112 has a function of a second gate electrode (also referred to as a top gate electrode). In addition, part of the insulating layer 137 functions as a first gate insulating layer, and part of the insulating layer 110 functions as a second gate insulating layer.

A portion of the semiconductor layer 108 that overlaps with at least one of the conductive layer 112 and the conductive layer 153 functions as a channel formation region. Note that for easy explanation, a portion of the semiconductor layer 108 that overlaps with the conductive layer 112 is sometimes referred to as a channel formation region in the following description; however, a channel can also be actually formed in a portion that does not overlap with the conductive layer 112 but overlaps with the conductive layer 153.

The conductive layer 112 may be electrically connected to the conductive layer 153 through an opening portion (not shown) provided in the insulating layer 110 and the insulating layer 137. In that case, the same potential can be applied to the conductive layer 112 and the conductive layer 153.

Note that a structure in which the conductive layer 153 and the conductive layer 112 are not electrically connected to each other may be employed. In that case, a constant potential may be supplied to one of the pair of gate electrodes, and a signal for driving the transistor 620 may be supplied to the other. In that case, the potential supplied to one of the gate electrodes enables control of the threshold voltage at the time of driving the transistor 620 with the other gate electrode.

The insulating layer 137 can have a stacked-layer structure. For the insulating layer 137, the above description can be referred to; thus, the detailed description is omitted.

Note that in the case where a metal film or an alloy film that does not easily cause diffusion into the insulating layer 137 is used as the conductive layer 153, the insulating layer 137 may have a single-layer structure.

In manufacturing processes of the transistor 620 and the transistor 630 in the semiconductor device that is one embodiment of the present invention, planarization treatment may be omitted. Alternatively, the semiconductor device that is one embodiment of the present invention may include no planarization film. By not performing planarization treatment or not providing a planarization film, manufacturing cost can be reduced and production yield can be increased.

FIG. 15A illustrates a structure not provided with a region where the transistor 620 and the transistor 630 overlap with each other. It is preferable that at least a region where the conductive layer 306 and the conductive layer 112 overlap with each other be not included. In the case of including the region where the transistor 620 and the transistor 630 overlap with each other, coverage might be decreased in manufacturing the transistor 620 owing to the unevenness of the transistor 630. With the structure not provided with the region where the transistor 620 and the transistor 630 overlap with each other, the decrease of coverage in manufacturing the transistor 620 can be prevented.

Although the conductive layer 353a, the conductive layer 353b, and the conductive layer 153 can be formed by processing the same conductive film, the height of the conductive layer 353a and the conductive layer 353b may differ from that of the conductive layer 153 in the case of not performing planarization treatment or not providing a planarization film. Similarly, although the conductive layer 120a, the conductive layer 120b, the conductive layer 320a, and the conductive layer 320b can be formed by processing the same conductive film, the height of the conductive layer 120a and the conductive layer 120b may differ from that of the conductive layer 320a and the conductive layer 320b.

Although the structure not provided with the region where the transistor 620 and the transistor 630 overlap with each other is illustrated in FIG. 15A, one embodiment of the present invention is not limited thereto. A region where the transistor 620 and the transistor 630 overlap with each other may be included. By including the region where the transistor 620 and the transistor 630 overlap with each other, the area occupied by the transistor 620 and the transistor 630 in the semiconductor device 600 can be reduced; accordingly, the size of the semiconductor device 600 can be reduced. For example, in the case of using the semiconductor device 600 in a display device, the area occupied by the transistor 620 and the transistor 630 in a pixel can be reduced; accordingly, a high-resolution display device can be provided. Furthermore, the area of a driver circuit portion can be reduced; accordingly, a display device with a narrow bezel can be provided.

Here, the semiconductor layer 108 and oxygen vacancies that might be formed in the semiconductor layer 108 will be described.

Oxygen vacancies formed in the channel formation region of the semiconductor layer 108 affect the transistor characteristics and therefore cause a problem. For example, when an oxygen vacancy is formed in the semiconductor layer 108, the oxygen vacancy might be bonded with hydrogen to serve as a carrier supply source. The carrier supply source generated in the channel formation region causes a change in the electrical characteristics, typically, a shift in the threshold voltage, of the transistor 620. Therefore, the number of oxygen vacancies in the region 108_i_ that is the channel formation region is preferably as small as possible.

In view of this, one embodiment of the present invention has a structure in which insulating films in the vicinity of the channel formation region of the semiconductor layer 108, specifically, the insulating layer 110 positioned above the channel formation region and the insulating layer 137 positioned below the channel formation region, each include an oxide film or an oxynitride film. When oxygen is moved from the insulating layer 137 and the insulating layer 110 to the channel formation region by heat during the manufacturing process or the like, the number of oxygen vacancies in the channel formation region can be reduced.

The semiconductor layer 108 preferably includes a region where the atomic ratio of In to the element M is higher than 1. A higher percentage of In content results in higher field-effect mobility of the transistor.

Here, in the case of a metal oxide containing In, Ga, and Zn, bonding strength between In and oxygen is weaker than bonding strength between Ga and oxygen; thus, with a higher percentage of In content, oxygen vacancies are likely to be generated in the metal oxide film. There is a similar tendency when the element M is used instead of Ga. The existence of a large number of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 containing a metal oxide; thus, a metal oxide material with a high percentage of In content can be used. Accordingly, it is possible to achieve a transistor with extremely high field-effect mobility, stable electrical characteristics, and high reliability.

For example, a metal oxide in which the atomic ratio of In to the element M is 1.5 or higher, 2 or higher, 3 or higher, 3.5 or higher, or 4 or higher can be suitably used.

In particular, the atomic ratio of In to M and Zn in the semiconductor layer 108 is preferably In:M:Zn=4:2:3 or in the neighborhood thereof. Alternatively, the atomic ratio of In to M and Zn is preferably In:M:Zn=5:1:6 or in the neighborhood thereof. Furthermore, as the composition of the semiconductor layer 108, the atomic proportions of In, the element M, and Zn in the semiconductor layer 108 may be approximately equal to each other. That is, a material in which the atomic ratio of In to the element M and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which a small number of wirings are connected can be provided.

Note that even when the semiconductor layer 108 includes the region where the atomic ratio of In to the element M is higher than 1, the field-effect mobility might be low if the semiconductor layer 108 has high crystallinity.

The crystallinity of the semiconductor layer 108 can be analyzed using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier concentration in the film can be reduced. A transistor using such a metal oxide film for the channel formation region of the semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used for the semiconductor layer 108, damage in the processing of the semiconductor layer 108 or in the deposition of the insulating layer 110 can be inhibited, so that a highly reliable transistor can be achieved. By contrast, when a metal oxide film with relatively low crystallinity is used for the semiconductor layer 108, the electrical conductivity is improved, so that a transistor with high field-effect mobility can be achieved.

As the semiconductor layer 108, a metal oxide film having a CAAC (c-axis aligned crystal) structure described later, a metal oxide film having an nc (nano crystal) structure, or a metal oxide film in which a CAAC structure and an nc structure are mixed is preferably used.

The semiconductor layer 108 may have a stacked-layer structure of two or more layers.

For example, the semiconductor layer 108 in which two or more metal oxide films with different compositions are stacked can be used. For example, in the case of using an In-M-Zn oxide, it is preferable to use a stack of two or more films each formed using a sputtering target in which the atomic ratio of In to the element M and Zn is In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

The semiconductor layer 108 in which two or more metal oxide films with different crystallinities are stacked can be used. In that case, the metal oxide films are preferably formed successively without exposure to the air using the same oxide target under different deposition conditions.

In this case, the semiconductor layer 108 can have a stacked-layer structure of a metal oxide film having an nc structure and a metal oxide film having a CAAC structure. Alternatively, a stacked-layer structure of a metal oxide film having an nc structure and a metal oxide film having an nc structure may be employed. Note that the description of a CAC (Cloud-Aligned Composite) can be referred to for a function or a material composition of a metal oxide that can be suitably used for the metal oxide films.

For example, the oxygen flow rate ratio at the time of forming an earlier-formed first metal oxide film is set higher than the oxygen flow rate ratio at the time of forming a later-formed second metal oxide film. When the oxygen flow rate at the time of forming the first metal oxide film is high, oxygen can be effectively supplied to the insulating layer 103_d_. Oxygen supplied to the insulating layer 103_d_ is diffused into the semiconductor layer 108 by a heat application step, and the oxygen can reduce oxygen vacancies ($V_O$) in the semiconductor layer 108. When excess oxygen exists at the interface between the insulating layer 110 functioning as a gate insulating layer and the semiconductor layer 108, reliability might be degraded. When the oxygen flow rate at the time of forming the second metal oxide film is low, excess oxygen can be prevented from increasing at the interface between the insulating layer 110 functioning as the gate insulating layer and the semiconductor layer 108, whereby reliability can be increased.

More specifically, the oxygen flow rate ratio at the time of forming the first metal oxide film is set to be greater than or equal to 5% and less than or equal to 100%, preferably greater than or equal to 10% and less than or equal to 80%, further preferably greater than or equal to 15% and less than or equal to 70%, further preferably greater than or equal to 20% and less than or equal to 70%, further preferably greater than or equal to 25% and less than or equal to 60%, further preferably greater than or equal to 30% and less than or equal to 60%, further preferably greater than or equal to 30% and less than or equal to 50%, typically 40%. The oxygen flow rate ratio at the time of forming the second metal oxide film is lower than the oxygen flow rate ratio at the time of forming the first metal oxide film and is set to be greater than or equal to 5% and less than or equal to 70%, preferably greater than or equal to 5% and less than or equal to 60%, further preferably greater than or equal to 5% and less than or equal to 50%, further preferably greater than or equal to 5% and less than or equal to 40%, further preferably greater than or equal to 10% and less than or equal to 40%, further preferably greater than or equal to 15% and less than or equal to 40%, further preferably greater than or equal to 20% and less than or equal to 40%, typically 30%. Alternatively, a condition where oxygen is not used as a deposition gas used at the time of forming the first metal oxide film may be employed. Although the conditions at the time of the film formation, such as pressure, temperature, and power, may vary between the first metal oxide film and the second metal oxide film, it is preferable to employ the same conditions other than the oxygen flow rate ratio, in which case the time required for the film formation steps can be shortened.

With such a structure, the transistor 620 with excellent electrical characteristics and high reliability can be achieved.

As illustrated in FIG. 15A, the transistor 620 may include the conductive layer 120*a* and the conductive layer 120*b* over the insulating layer 118. The conductive layer 120*a* functions as one of a source electrode and a drain electrode, and the conductive layer 120*b* functions as the other of the source electrode and the drain electrode. The conductive layer 120*a* and the conductive layer 120*b* are electrically connected to the regions 108*n* through an opening portion 141*a* and an opening portion 141*b*, respectively, which are provided in the insulating layer 118.

The transistor 630 is provided over a substrate 102 and includes the semiconductor layer 308, the insulating layer 135, the insulating layer 133, the conductive layer 315, the conductive layer 306, and the like. The conductive layer 315 includes a region overlapping with the semiconductor layer 308 with the insulating layer 133 therebetween. The conductive layer 306 includes a region overlapping with the semiconductor layer 308 with the insulating layer 135 therebetween.

In the transistor 630, the conductive layer 315 has a function of a first gate electrode (also referred to as a bottom gate electrode), and the conductive layer 306 has a function of a second gate electrode (also referred to as a top gate electrode). In addition, part of the insulating layer 133 functions as a first gate insulating layer, and part of the insulating layer 135 functions as a second gate insulating layer.

A portion of the semiconductor layer 308 that overlaps with at least one of the conductive layer 306 and the conductive layer 315 functions as a channel formation region. Note that for easy explanation, a portion of the semiconductor layer 308 that overlaps with the conductive layer 306 is sometimes referred to as a channel formation region in the following description; however, a channel can also be actually formed in a portion that does not overlap with the conductive layer 306 but overlaps with the conductive layer 315.

The conductive layer 306 may be electrically connected to the conductive layer 315 through an opening portion (not shown) provided in the insulating layer 135 and the insulating layer 133. In that case, the same potential can be applied to the conductive layer 306 and the conductive layer 315.

Note that a structure in which the conductive layer 306 and the conductive layer 315 are not electrically connected to each other may be employed. In that case, a constant potential may be supplied to one of the pair of gate electrodes, and a signal for driving the transistor 630 may be supplied to the other. In that case, the potential supplied to one of the gate electrodes enables control of the threshold voltage at the time of driving the transistor 630 with the other gate electrode.

As illustrated in FIG. 15A, the transistor 630 includes the conductive layer 353*a* and the conductive layer 353*b* over the insulating layer 103. The conductive layer 353*a* functions as one of a source electrode and a drain electrode, and the conductive layer 353*b* functions as the other of the source electrode and the drain electrode. The conductive layer 353*a* and the conductive layer 353*b* are electrically connected to the regions 308*n* through an opening portion 343*a* and an opening portion 343*b*, respectively, which are provided in the insulating layer 103 and the insulating layer 135.

The transistor 630 includes the conductive layer 320*a* and the conductive layer 320*b* over the insulating layer 118. The conductive layer 320*a* and the conductive layer 320*b* are, respectively, electrically connected to the conductive layer 353*a* and the conductive layer 353*b* through an opening portion 341*a* and an opening portion 341*b* which are provided in the insulating layer 118, the insulating layer 110, and the insulating layer 137.

A structure example of a transistor whose structure is partly different from that of the structure example 5-1 is described below. Note that description of the same portions as those in the structure example 5-1 is omitted below in some cases. Furthermore, in drawings that are referred to later, the same hatching pattern is applied to portions having functions similar to those in the above structure example, and the portions are not denoted by reference numerals in some cases.

Structure Example 5-2

Figure 15B:
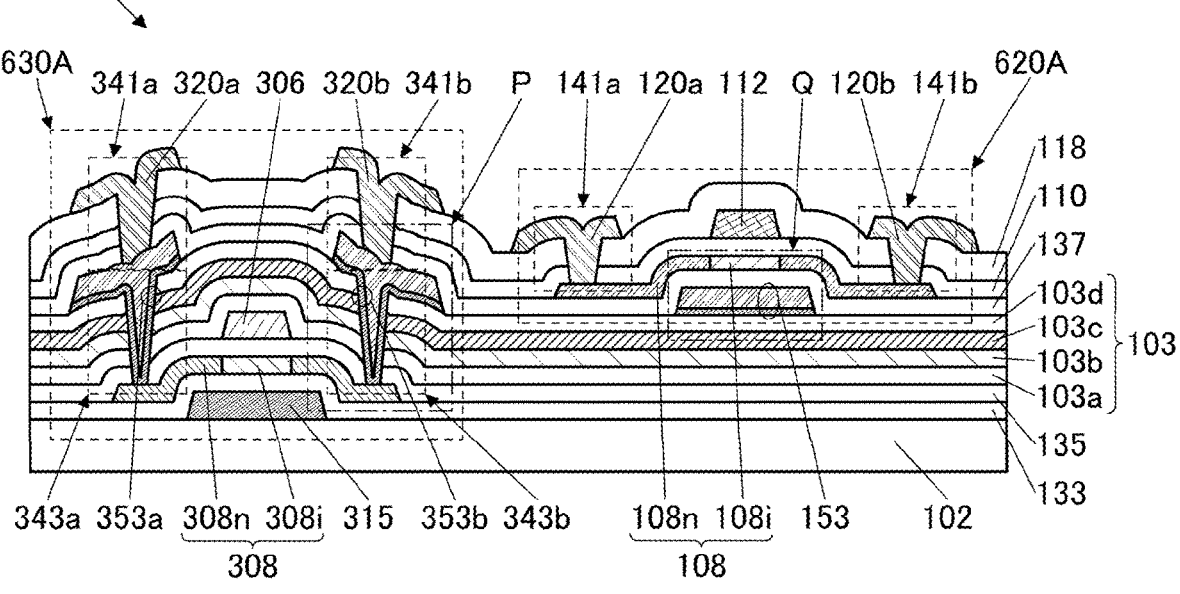

FIG. 15B illustrates a structure example different from that of the above-described semiconductor device 600. A semiconductor device 600A illustrated in FIG. 15B includes a transistor 620A and a transistor 630A. FIG. 15B illustrates a schematic cross-sectional view of the transistor 620A and the transistor 630A in the channel length direction. The semiconductor device 600A is different from the semiconductor device 600 mainly in that the conductive layer 153, the conductive layer 353*a*, and the conductive layer 353*b* have stacked-layer structures.

Figure 16A:
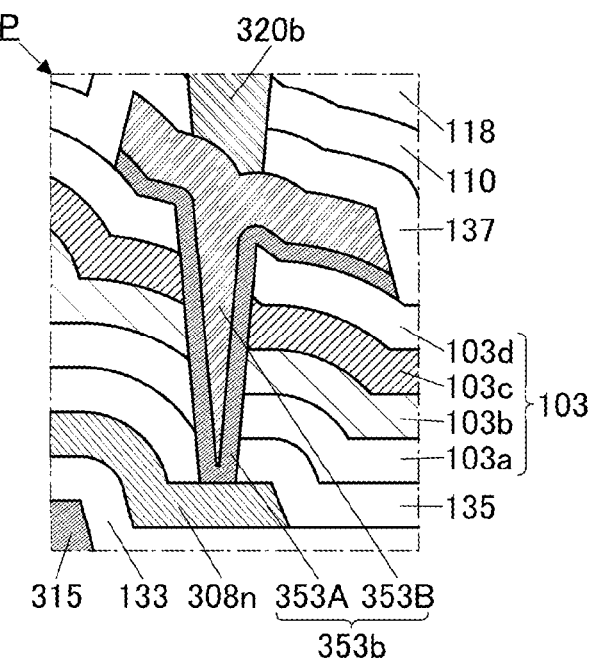
FIG. 16A and FIG. 16B are cross-sectional views illustrating the structure example of the semiconductor device.
Figure 16B:
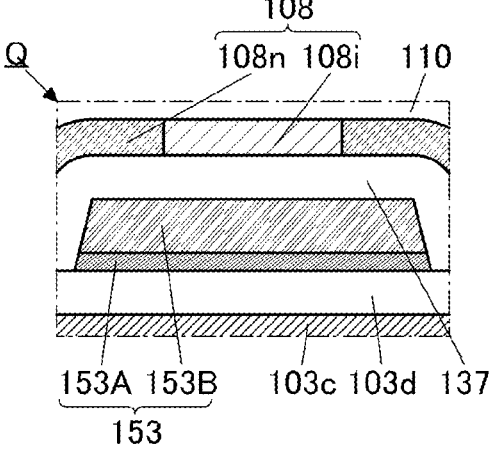

An enlarged view of a region P surrounded by a dashed-dotted line in FIG. 15B is shown in FIG. 16A. An enlarged view of a region Q surrounded by a dashed-dotted line in FIG. 15B is shown in FIG. 16B.

The conductive layer 353a and the conductive layer 353b each have a stacked-layer structure including a conductive layer 353A and a conductive layer 353B over the conductive layer 353A. The conductive layer 153 has a stacked-layer structure including a conductive layer 153A and a conductive layer 153B over the conductive layer 153A.

The conductive layer 153A and the conductive layer 353A can be formed using a material that can be used for the conductive layer 112. In the opening portion 343a and the opening portion 343b, the conductive layer 353A including a region in contact with the insulating layer 103b is particularly preferably formed using a material having a low hydrogen-transmitting property. When a material having a low hydrogen-transmitting property is used for the conductive layer 353A, hydrogen contained in the insulating layer 103b can be inhibited from diffusing into the semiconductor layer 108 through the opening portion 343a and the opening portion 343b.

The conductive layer 153B and the conductive layer 353B can be formed using a material that can be used for the conductive layer 112.

The conductive layer 153A and the conductive layer 353A are preferably formed using the same material. Furthermore, the conductive layer 153A and the conductive layer 353A are preferably formed by processing the same conductive film. The conductive layer 153B and the conductive layer 353B are preferably formed using the same material. Furthermore, the conductive layer 153B and the conductive layer 353B are preferably formed by processing the same conductive film. By the formation through processing of the same conductive films, manufacturing cost can be reduced and production yield can be increased.

Structure Example 5-3

Figure 17A:
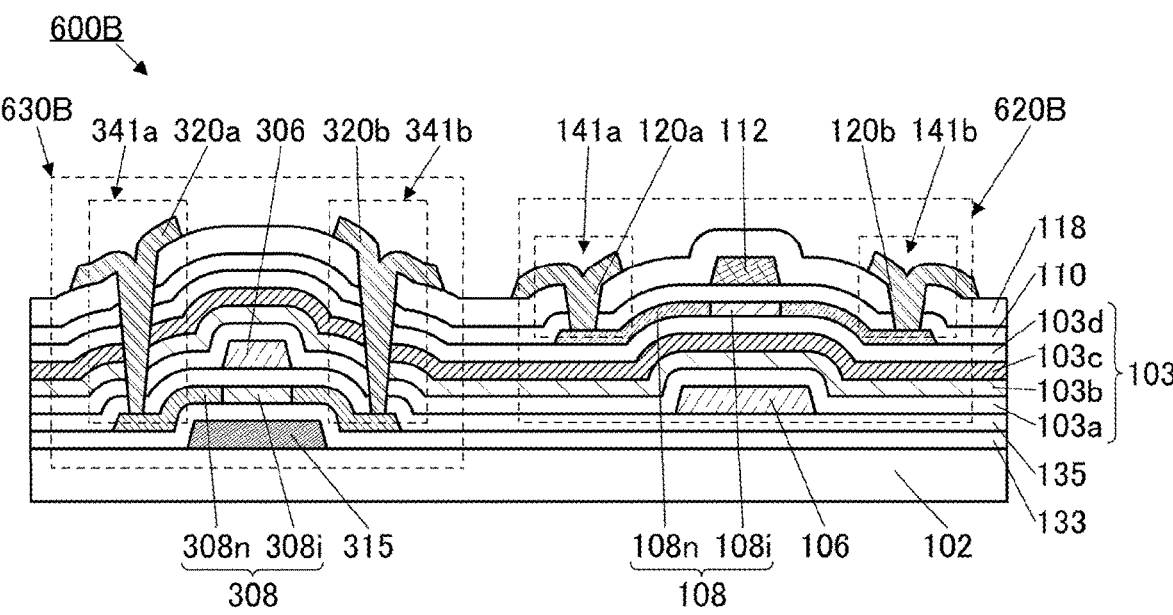
FIG. 17A and FIG. 17B are cross-sectional views illustrating structure examples of a semiconductor device.

FIG. 17A illustrates a structure example different from that of the above-described semiconductor device 600. A semiconductor device 600B illustrated in FIG. 17A includes a transistor 620B and a transistor 630B. FIG. 17A illustrates a schematic cross-sectional view of the transistor 620B and the transistor 630B in the channel length direction. The semiconductor device 600B is different from the semiconductor device 600 mainly in including the conductive layer 106 instead of the conductive layer 153 and in not including the conductive layer 353a and the conductive layer 353b. Note that the semiconductor device 600B corresponds to the semiconductor device 10H described in Embodiment 1.

The transistor 620B includes the semiconductor layer 108, the insulating layer 110, the insulating layer 103, the conductive layer 112, the conductive layer 106, the insulating layer 118, and the like. The conductive layer 106 includes a region overlapping with the semiconductor layer 108 with the insulating layer 103 therebetween. The conductive layer 112 includes a region overlapping with the semiconductor layer 108 with the insulating layer 110 therebetween.

In the transistor 620B, the conductive layer 106 has a function of a first gate electrode (bottom gate electrode), and the conductive layer 112 has a function of a second gate electrode (top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 is sometimes referred to as a channel formation region in the following description; however, a channel can also be actually formed in a portion that does not overlap with the conductive layer 112 but overlaps with the conductive layer 106.

The conductive layer 112 may be electrically connected to the conductive layer 106 through an opening portion (not shown) provided in the insulating layer 110, the insulating layer 103, and the insulating layer 135. In that case, the same potential can be applied to the conductive layer 112 and the conductive layer 106.

Note that a structure in which the conductive layer 106 and the conductive layer 112 are not electrically connected to each other may be employed. In that case, a constant potential may be supplied to one of the pair of gate electrodes, and a signal for driving the transistor 620B may be supplied to the other. In that case, the potential supplied to one of the gate electrodes enables control of the threshold voltage at the time of driving the transistor 620B with the other gate electrode.

In the transistor 630B, the conductive layer 315 has a function of a first gate electrode (bottom gate electrode), and the conductive layer 306 has a function of a second gate electrode (top gate electrode). In addition, part of the insulating layer 133 functions as a first gate insulating layer, and part of the insulating layer 135 functions as a second gate insulating layer.

A portion of the semiconductor layer 308 that overlaps with at least one of the conductive layer 306 and the conductive layer 315 functions as a channel formation region. Note that for easy explanation, a portion of the semiconductor layer 308 that overlaps with the conductive layer 306 is sometimes referred to as a channel formation region in the following description; however, a channel can also be actually formed in a portion that does not overlap with the conductive layer 306 but overlaps with the conductive layer 315.

The conductive layer 306 may be electrically connected to the conductive layer 315 through an opening portion (not shown) provided in the insulating layer 135 and the insulating layer 133. In that case, the same potential can be applied to the conductive layer 306 and the conductive layer 315.

Note that a structure in which the conductive layer 306 and the conductive layer 315 are not electrically connected to each other may be employed. In that case, a constant potential may be supplied to one of the pair of gate electrodes, and a signal for driving the transistor 630B may be supplied to the other. In that case, the potential supplied to one of the gate electrodes enables control of the threshold voltage at the time of driving the transistor 630B with the other gate electrode.

As illustrated in FIG. 17A, the transistor 630B includes the conductive layer 320a and the conductive layer 320b over the insulating layer 118. The conductive layer 320a functions as one of a source electrode and a drain electrode, and the conductive layer 320b functions as the other of the source electrode and the drain electrode. The conductive layer 320a and the conductive layer 320b are electrically connected to the regions 308n through the opening portion 341a and the opening portion 341b, respectively, which are provided in the insulating layer 118, the insulating layer 110, the insulating layer 103, and the insulating layer 135.

In the manufacturing processes of the transistor 620B and the transistor 630B in the semiconductor device that is one embodiment of the present invention, planarization treatment may be omitted. Although the conductive layer 106 and the conductive layer 306 can be formed by processing the same conductive film, the height of the conductive layer 106 may differ from that of the conductive layer 306.

Similarly, although the conductive layer 120a, the conductive layer 120b, the conductive layer 320a, and the conductive layer 320b can be formed by processing the same conductive film, the height of the conductive layer 120a and the conductive layer 120b may differ from that of the conductive layer 320a and the conductive layer 320b.

Structure Example 5-4

Figure 17B:
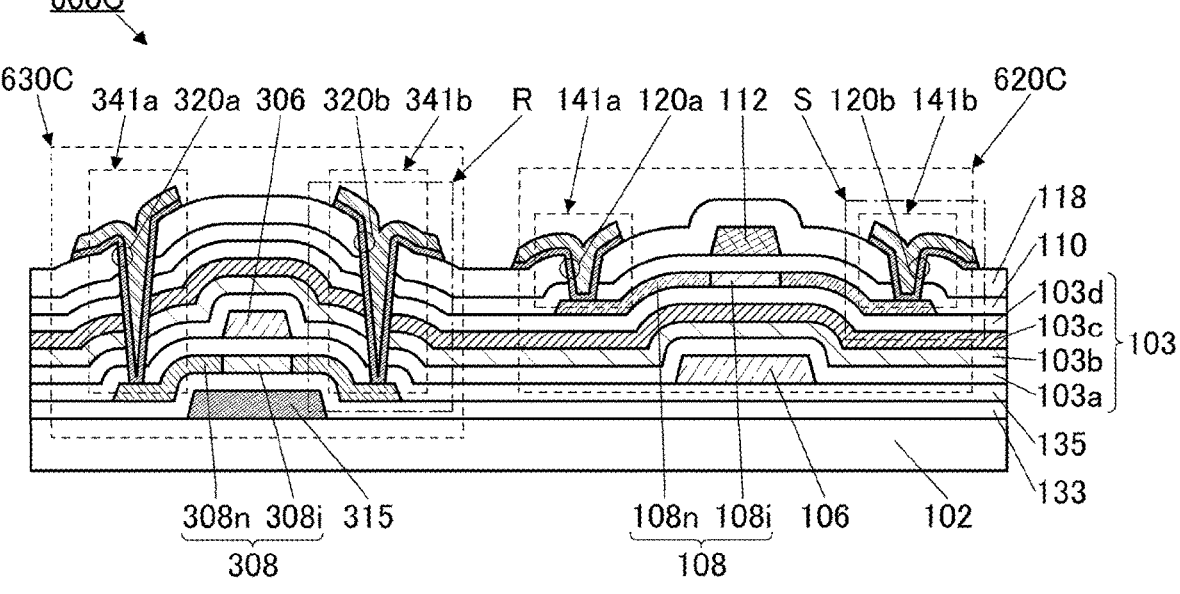

FIG. 17B illustrates a structure example different from that of the above-described semiconductor device 600B. A semiconductor device 600C illustrated in FIG. 17B includes a transistor 620C and a transistor 630C. FIG. 17B illustrates a schematic cross-sectional view of the transistor 620C and the transistor 630C in the channel length direction. The semiconductor device 600C is different from the semiconductor device 600B mainly in that the conductive layer 120a, the conductive layer 120b, the conductive layer 320a, and the conductive layer 320b have stacked-layer structures.

Figure 18A:
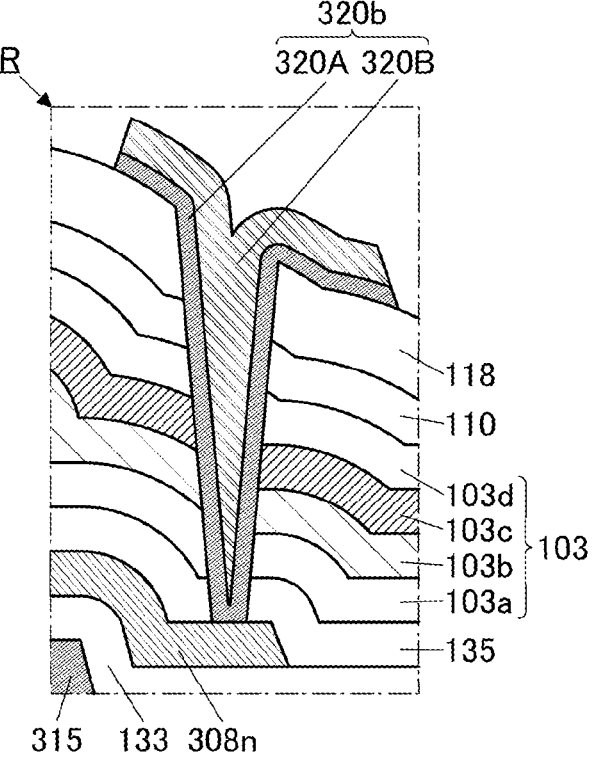
FIG. 18A and FIG. 18B are cross-sectional views illustrating the structure example of the semiconductor device.
Figure 18B:
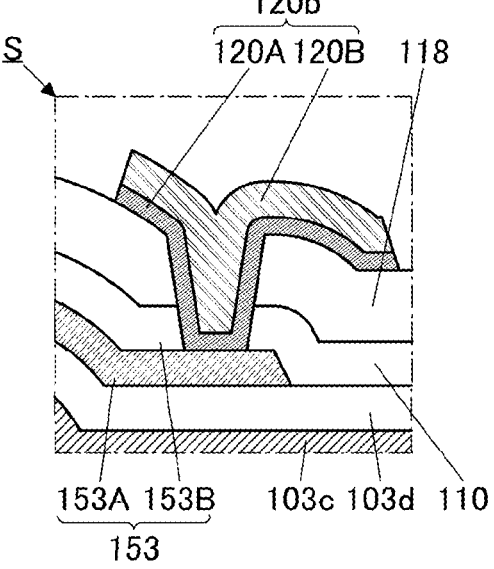

An enlarged view of a region R surrounded by a dashed-dotted line in FIG. 17B is shown in FIG. 18A. An enlarged view of a region S surrounded by a dashed-dotted line in FIG. 17B is shown in FIG. 18B.

The conductive layer 320a and the conductive layer 320b each have a stacked-layer structure including a conductive layer 320A and a conductive layer 320B over the conductive layer 320A. The conductive layer 120a and the conductive layer 120b each have a stacked-layer structure including a conductive layer 120A and a conductive layer 120B over the conductive layer 120A.

The conductive layer 120A and the conductive layer 320A can be formed using a material that can be used for the conductive layer 112. In the opening portion 341a and the opening portion 341b, the conductive layer 320A including a region in contact with the insulating layer 103b is particularly preferably formed using a material having a low hydrogen-transmitting property. For the conductive layer 320A, one or more selected from tantalum, tantalum nitride, titanium, titanium nitride, ruthenium, ruthenium oxide, and molybdenum can be suitably used for example. An alloy containing any of the above-described metal elements, an alloy containing the above-described metal elements in combination, or the like may be used for the conductive layer 320A. When a material having a low hydrogen-transmitting property is used for the conductive layer 320A, hydrogen contained in the insulating layer 103b can be inhibited from diffusing into the semiconductor layer 108 through the opening portion 341a and the opening portion 341b.

The conductive layer 120B and the conductive layer 320B can be formed using a material that can be used for the conductive layer 112.

The conductive layer 120A and the conductive layer 320A are preferably formed using the same material. The conductive layer 120B and the conductive layer 320B are preferably formed using the same material. Furthermore, the conductive layer 120A and the conductive layer 320A are preferably formed by processing the same conductive film. The conductive layer 120B and the conductive layer 320B are preferably formed by processing the same conductive film. By the formation of the conductive layer 120a, the conductive layer 120b, the conductive layer 320a, and the conductive layer 320b through processing of the same conductive films, manufacturing cost can be reduced and production yield can be increased.

Structure Example 5-5

Figure 19A:
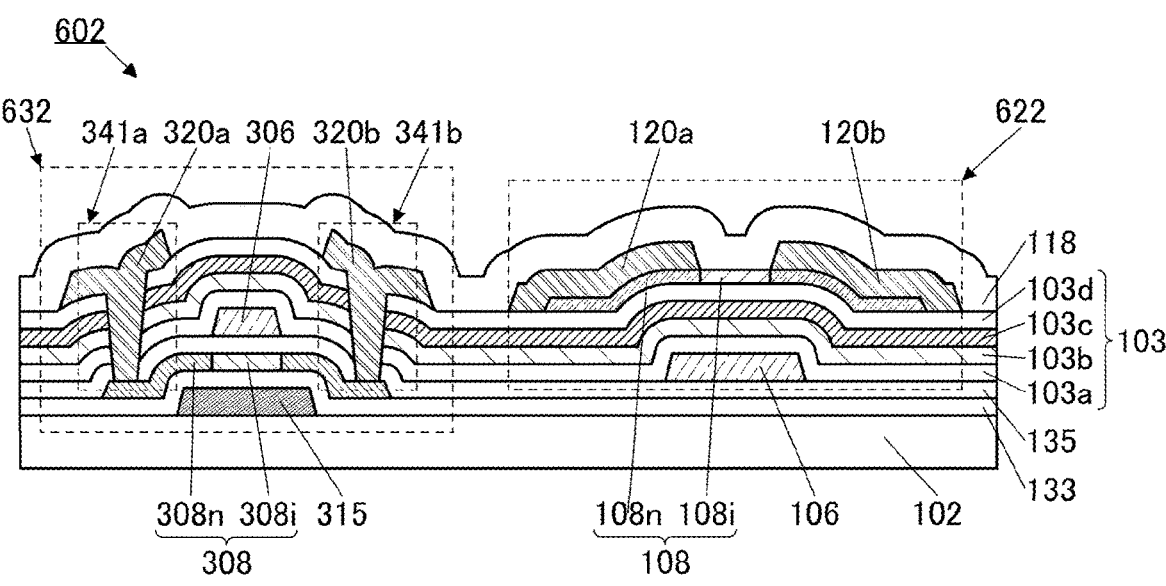
FIG. 19A and FIG. 19B are cross-sectional views illustrating structure examples of a semiconductor device.

FIG. 19A illustrates a schematic cross-sectional view of a semiconductor device 602. The semiconductor device 602 includes a bottom-gate transistor 622 and a top-gate transistor 632. FIG. 19A illustrates a schematic cross-sectional view of the transistor 622 and the transistor 632 in the channel length direction. Note that the semiconductor device 602 corresponds to the semiconductor device 12E described in Embodiment 1.

The semiconductor layer 108 can have a stacked structure including two or more layers. For example, the oxygen flow rate ratio at the time of forming an earlier-formed first metal oxide film is set lower than the oxygen flow rate ratio at the time of forming a subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of forming the conductive layer 120a and the conductive layer 120b can be inhibited.

More specifically, the oxygen flow rate ratio at the time of forming the first metal oxide film is set to be greater than or equal to 0% and less than 70%, preferably greater than or equal to 5% and less than 60%, further preferably greater than or equal to 5% and less than 50%, further preferably greater than or equal to 5% and less than 40%, further preferably greater than or equal to 5% and less than 30%, further preferably greater than or equal to 5% and less than 20%, further preferably greater than or equal to 5% and less than 15%, typically 10%. The oxygen flow rate ratio at the time of forming the second metal oxide film is higher than the oxygen flow rate ratio at the time of forming the first metal oxide film and is set to be greater than or equal to 50% and less than or equal to 100%, preferably greater than or equal to 60% and less than or equal to 100%, further preferably greater than or equal to 80% and less than or equal to 100%, further preferably greater than or equal to 90% and less than or equal to 100%, typically 100%.

Furthermore, although the conditions at the time of the film formation, such as pressure, temperature, and power, may vary between the first metal oxide film and the second metal oxide film, it is preferable to employ the same conditions other than the oxygen flow rate ratio, in which case the time required for the film formation steps can be shortened.

With such a structure, the transistor 622 with excellent electrical characteristics and high reliability can be achieved.

Structure Example 5-6

Figure 19B:
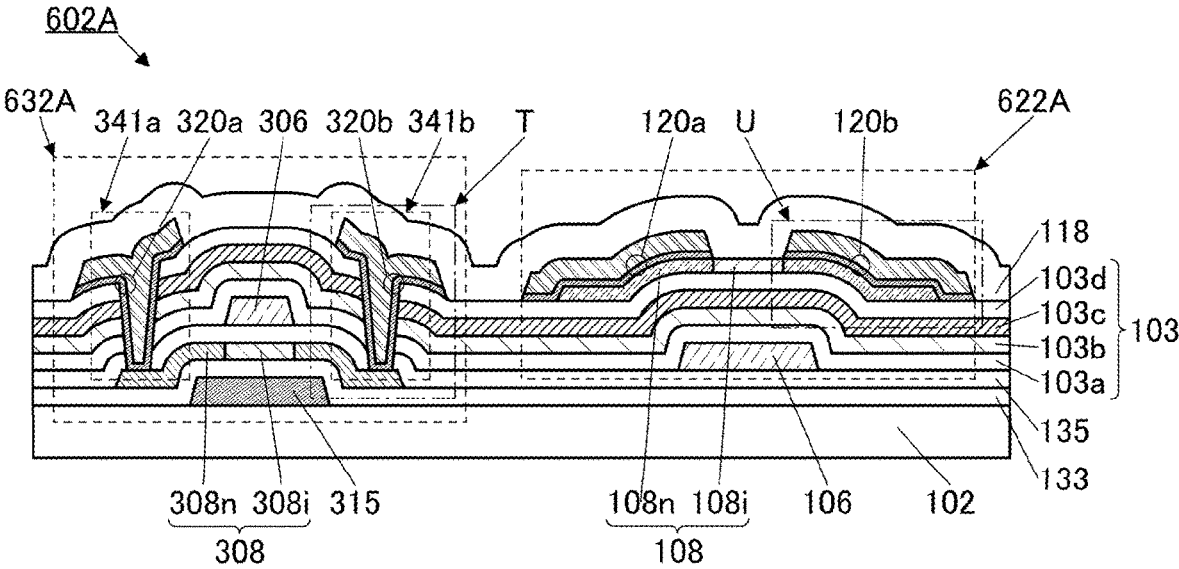

FIG. 19B illustrates a structure example different from that of the above-described semiconductor device 602. A semiconductor device 602A illustrated in FIG. 19B includes a transistor 622A and a transistor 632A. FIG. 19B illustrates a schematic cross-sectional view of the transistor 622A and the transistor 632A in the channel length direction. The semiconductor device 602A is different from the semiconductor device 602 mainly in that the conductive layer 120a, the conductive layer 120b, the conductive layer 320a, and the conductive layer 320b have stacked-layer structures.

Figure 20A:
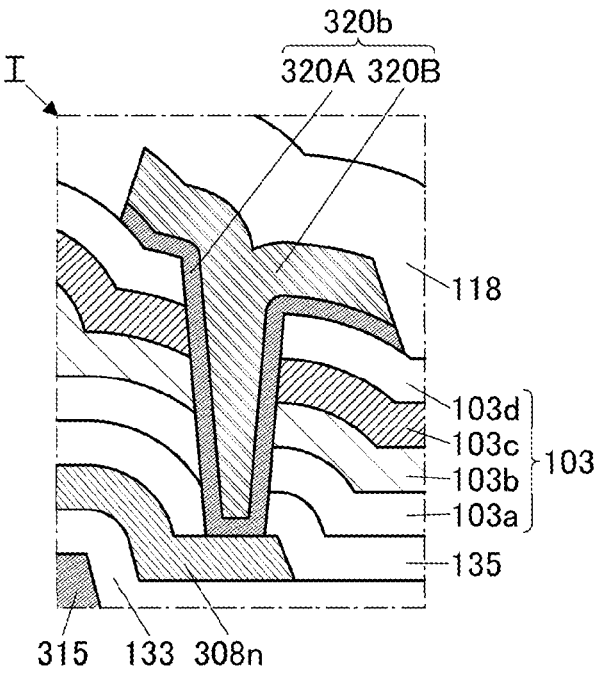
FIG. 20A and FIG. 20B are cross-sectional views illustrating the structure example of the semiconductor device.
Figure 20B:
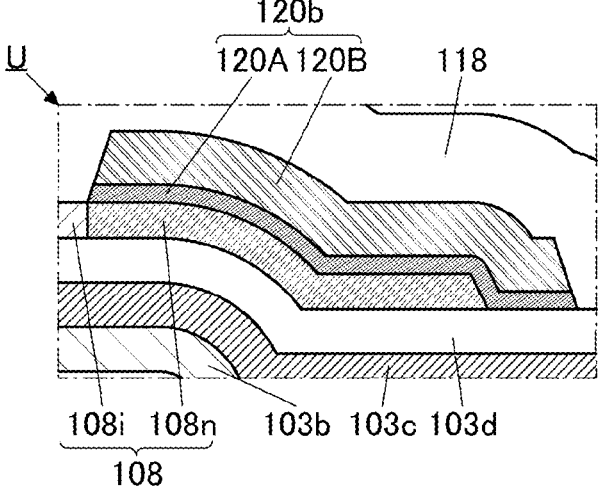

An enlarged view of a region T surrounded by a dashed-dotted line in FIG. 19B is shown in FIG. 20A. An enlarged view of a region U surrounded by a dashed-dotted line in FIG. 19B is shown in FIG. 20B.

The conductive layer 320a and the conductive layer 320b each have a stacked-layer structure including a conductive layer 320A and a conductive layer 320B over the conductive layer 320A. The conductive layer 120a and the conductive layer 120b each have a stacked-layer structure including a conductive layer 120A and a conductive layer 120B over the conductive layer 120A.

The conductive layer 120A and the conductive layer 320A can be formed using a material that can be used for the conductive layer 112. In the opening portion 341a and the opening portion 341b, the conductive layer 320A including a region in contact with the insulating layer 103b is particularly preferably formed using a material having a low hydrogen-transmitting property. When a material having a low hydrogen-transmitting property is used for the conductive layer 320A, hydrogen contained in the insulating layer 103b can be inhibited from diffusing into the semiconductor layer 108 through the opening portion 341a and the opening portion 341b.

The conductive layer 120B and the conductive layer 320B can be formed using a material that can be used for the conductive layer 112.

The conductive layer 120A and the conductive layer 320A are preferably formed using the same material. The conductive layer 120B and the conductive layer 320B are preferably formed using the same material. Furthermore, the conductive layer 120A and the conductive layer 320A are preferably formed by processing the same conductive film. The conductive layer 120B and the conductive layer 320B are preferably formed by processing the same conductive film. By the formation of the conductive layer 120a, the conductive layer 120b, the conductive layer 320a, and the conductive layer 320b through processing of the same conductive films, manufacturing cost can be reduced and production yield can be increased.

Structure Example 5-7

Figure 21A:
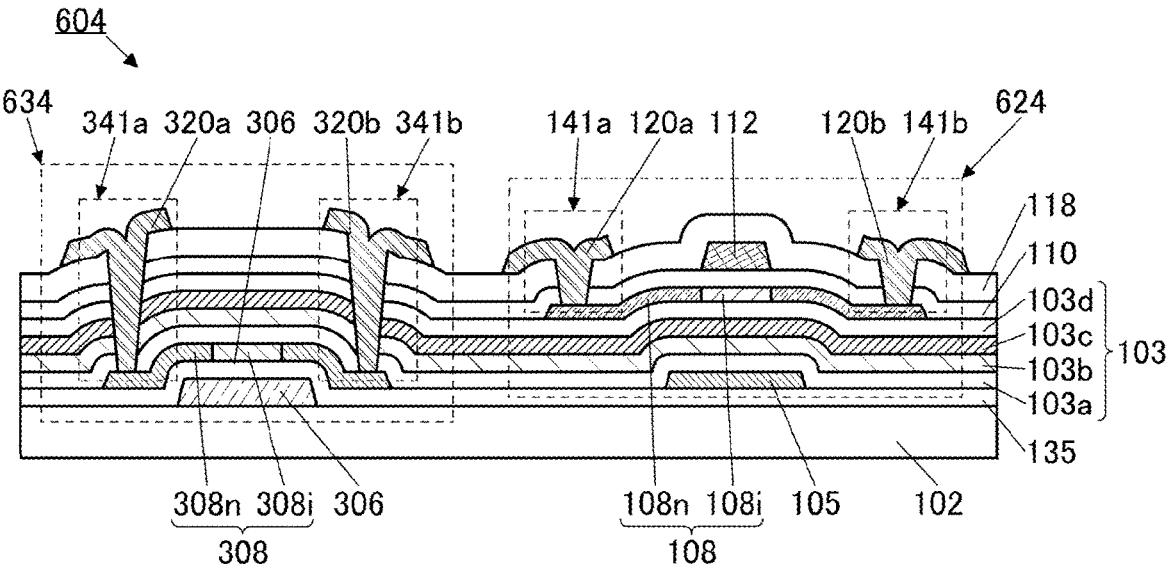
FIG. 21A and FIG. 21B are cross-sectional views illustrating structure examples of a semiconductor device.

FIG. 21A illustrates a schematic cross-sectional view of a semiconductor device 604. The semiconductor device 604 includes a top-gate transistor 624 and a bottom-gate transistor 634. FIG. 21A illustrates a schematic cross-sectional view of the transistor 624 and the transistor 634 in the channel length direction. Note that the semiconductor device 604 corresponds to the semiconductor device 14F described in Embodiment 1.

Structure Example 5-8

Figure 21B:
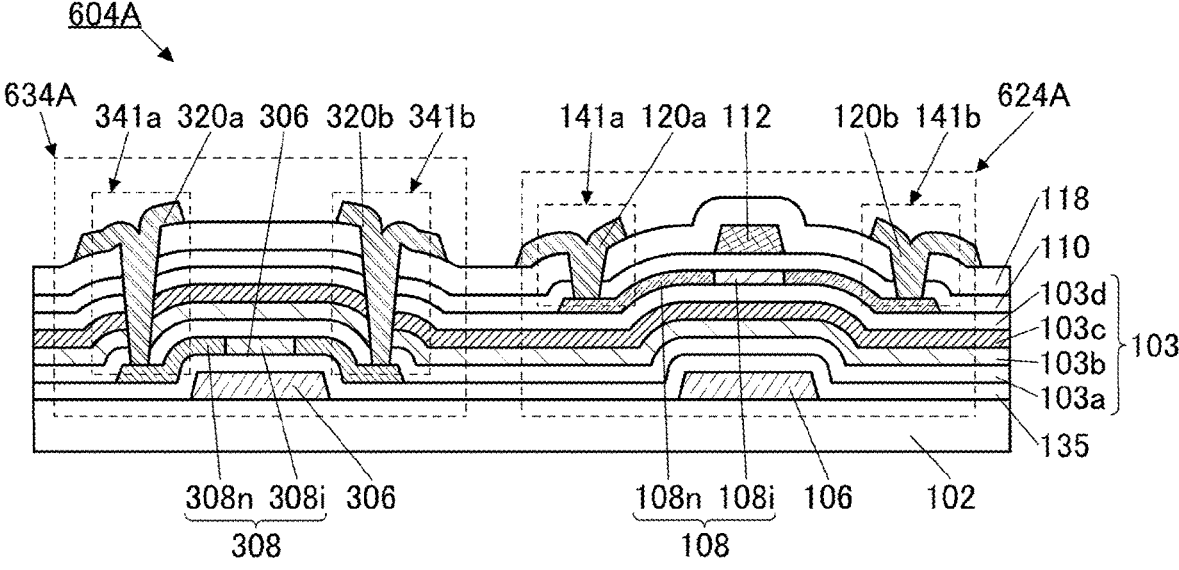

FIG. 21B illustrates a structure example different from that of the above-described semiconductor device 604. A semiconductor device 604A illustrated in FIG. 21B includes a transistor 624A and a transistor 634A. FIG. 21B illustrates a schematic cross-sectional view of the transistor 624A and the transistor 634A in the channel length direction. The semiconductor device 604A is different from the semiconductor device 604 mainly in including the conductive layer 106 instead of the conductive layer 105. Note that the semiconductor device 604A corresponds to the semiconductor device 14H described in Embodiment 1.

Manufacturing Method Example

A method for manufacturing the semiconductor device of one embodiment of the present invention is described below with reference to drawings. Here, description will be given taking, as an example, the semiconductor device 600 described above as a structure example. In the example to be described, crystalline silicon is used for the semiconductor layer 308 and a metal oxide is used for the semiconductor layer 108.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given.

The thin films that constitute the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical photolithography methods. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

Formation of Conductive Layer 315, Insulating Layer 133, and Semiconductor Layer 308

A conductive film is formed over the substrate 102 and processed by etching to form the conductive layer 315 functioning as a first gate electrode of the transistor 630. At this time, the conductive layer 315 is preferably processed to have an end portion with a tapered shape. This can improve step coverage with the insulating layer 133 to be formed in the next step. The conductive film is preferably formed by a sputtering method using a sputtering target of a metal or an alloy.

Next, the insulating layer 133 is formed to cover the substrate 102 and the conductive layer 315. The insulating layer 133 can be formed by a PECVD method, an ALD method, a sputtering method, or the like.

Figure 22A:
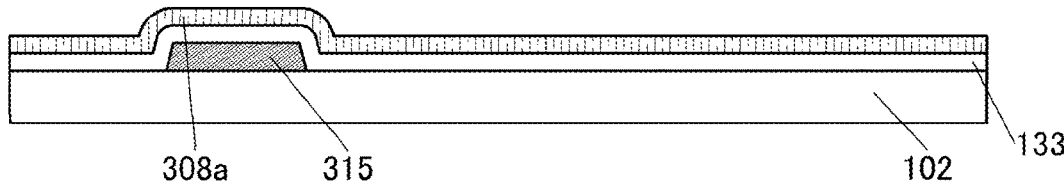
FIG. 22A, FIG. 22B, FIG. 22C, FIG. 22D, and FIG. 22E are cross-sectional views illustrating a method for manufacturing a semiconductor device.

Then, an amorphous film 308a to be the semiconductor layer 308 is formed to cover the insulating layer 133 (FIG. 22A). As the amorphous film 308a, amorphous silicon can be used, for example. The amorphous film 308a can be formed by a PECVD method, an LPCVD (Low Pressure CVD) method, a sputtering method, or the like.

Figure 22B:
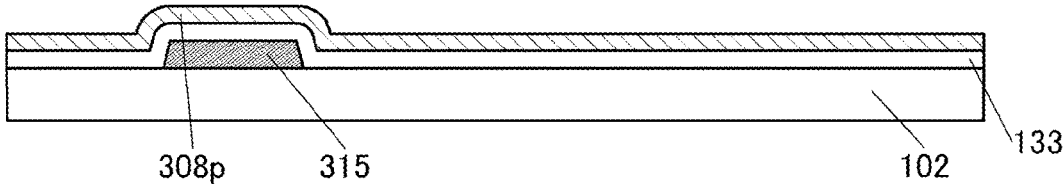

Then, the amorphous film 308a is crystallized to form a semiconductor film 308p (FIG. 22B). As a crystallization method, a solid-phase growth method, laser crystallization, or the like can be used, for example. As the solid-phase growth method, a thermal crystallization method with an electrically-heated oven, a lamp anneal crystallization method with infrared light, a crystallization method with a catalytic metal, or the like can be used. Alternatively, these methods may be used in combination. For example, after the amorphous film 308a is crystallized by a solid-phase growth method, laser light irradiation may further be performed to obtain the semiconductor film 308p with few defects and high crystallinity. As the laser light, excimer laser light using XeCl, the second harmonic or the third harmonic of a YAG laser, or the like can be used.

Although the example in which the amorphous film 308a is crystallized to form the semiconductor film 308p having crystallinity has been described here, one embodiment of the present invention is not limited thereto. The semiconductor film 308p having crystallinity may be directly formed over the insulating layer 133. Alternatively, the amorphous film 308a may be left as it is without crystallization and the process may proceed to the next step. A transistor using an amorphous semiconductor can be manufactured through a small number of steps at low manufacturing cost.

Next, channel doping by which an impurity element that imparts p-type conductivity or an impurity element that imparts n-type conductivity is added at a low concentration is performed on the semiconductor film 308p. The channel doping may be performed on the whole semiconductor film 308p or may be selectively performed on part of the semiconductor film 308p. As the impurity element that imparts p-type conductivity, one or more selected from boron, aluminum, and gallium can be used. As the impurity element that imparts n-type conductivity, one or both of phosphorus and arsenic can be used. For example, boron is used as the impurity element and added to be contained at a concentration greater than or equal to $1\times10^{16}$ atoms/cm$^3$ and less than or equal to $5\times10^{17}$ atoms/cm$^3$.

Figure 22C:
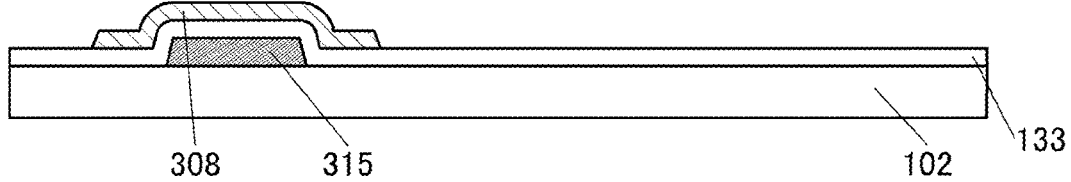

Then, the semiconductor film 308p is processed to form the island-shaped semiconductor layer 308 (FIG. 22C).

Formation of Insulating Layer 135 and Conductive Layer 306

The insulating layer 135 is formed to cover the insulating layer 133 and the semiconductor layer 108. The insulating layer 135 can be formed by a PECVD method, an ALD method, a sputtering method, or the like.

Figure 22D:
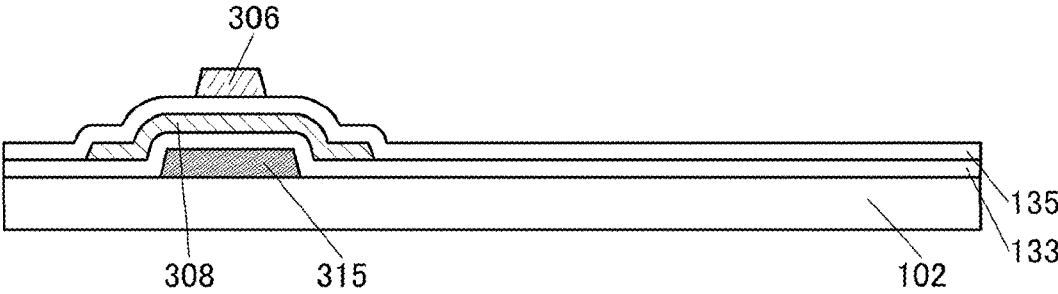

Next, a conductive film is formed over the insulating layer 135 and processed by etching, whereby the conductive layer 306 functioning as a second gate electrode of the transistor 630 is formed (FIG. 22D). At this time, the conductive layer 306 is preferably processed to have an end portion with a tapered shape. This can improve step coverage with the insulating layer 103 to be formed next. The conductive film is preferably deposited by a sputtering method using a sputtering target of a metal or an alloy.

When a conductive film containing copper is used as the conductive film to be the conductive layer 306, wiring resistance can be reduced. For example, a conductive film containing copper is preferably used in the case where the semiconductor device that is one embodiment of the present invention is used in a large display device or in the case where the semiconductor device is used in a high-definition display device. Even in the case where a conductive film containing copper is used as the conductive layer 306, diffusion of copper to the semiconductor layer 108 side can be inhibited by the insulating layer 103, whereby a highly reliable transistor can be obtained.

Figure 22E:
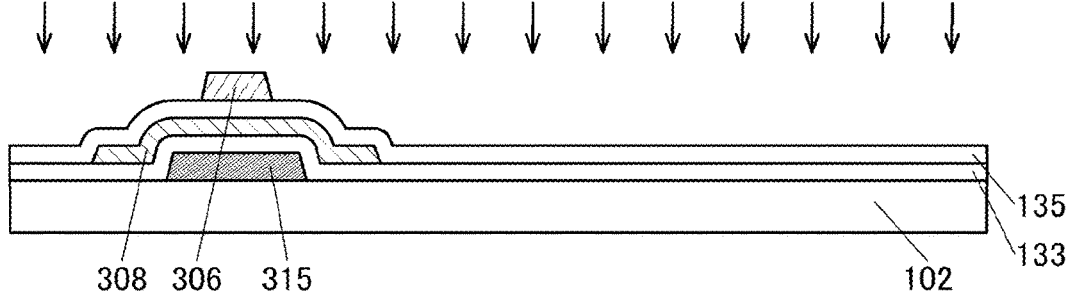
Figure 23A:
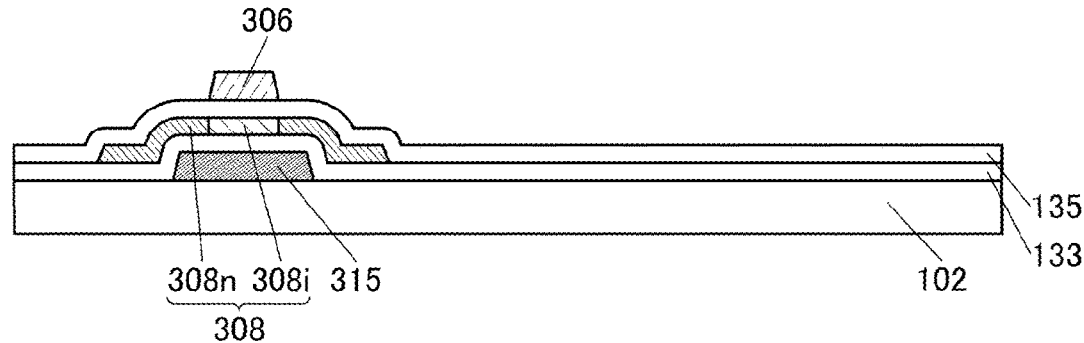
FIG. 23A, FIG. 23B, and FIG. 23C are cross-sectional views illustrating the method for manufacturing a semiconductor device.

Next, the second element is supplied to the semiconductor layer 308 (FIG. 22E). A plasma ion doping method, an ion implantation method, or the like can be used to supply the second element. In FIG. 22E, the supply of the second element is indicated by arrows. By the supply of the second element using the conductive layer 306 as a mask, the region 308i and the regions 308n can respectively be formed in the semiconductor layer 308 in the region overlapping with the conductive layer 306 and the semiconductor layer 308 in the region not overlapping with the conductive layer 306 in a self-aligned manner (FIG. 23A). Note that although the example of supplying the second element using the conductive layer 306 as a mask has been described, one embodiment of the present invention is not limited thereto. A resist mask is formed over the insulating layer 135 or over the conductive layer 306, and the resist mask may be used as a mask in supplying the second element. Furthermore, an LDD (Lightly Doped Drain) region may be formed between the region 308i and the regions 308n. The LDD region preferably has a lower concentration of the second element than the regions 308n. The provided LDD region can suppress hot-carrier degradation.

Next, heat treatment or laser light irradiation may be performed. The second element which is added to the regions 308n can be activated by the heat treatment or the laser light irradiation. Moreover, the activation treatment can repair defects or recover the crystallinity in the semiconductor layer 308 caused at the time of adding the second element.

The heat treatment can be performed in an atmosphere containing a rare gas or nitrogen. As a nitrogen-containing atmosphere or an oxygen-containing atmosphere, clean dry air (CDA) may be used. An electric furnace, a rapid thermal annealing (RTA) apparatus, or the like can be used for the heat treatment. The use of the RTA apparatus can shorten the heat treatment time. The heat treatment temperature is preferably higher than or equal to 300° C. and lower than the strain point of the substrate, further preferably higher than or equal to 350° C. and lower than or equal to 650° C., still further preferably higher than or equal to 400° C. and lower than or equal to 600° C., yet further preferably higher than or equal to 450° C. and lower than or equal to 600° C. The above-mentioned upper limits and lower limits can be combined freely. Note that the activation treatment is not necessarily performed after the addition of the second element. The activation treatment may be performed at any time after the addition of the second element. The activation treatment may also serve as heat treatment or a heat application step that is to be performed later. The activation treatment may be performed by combining heat treatment and laser light irradiation.

[Formation of Insulating Layer 103, Conductive Layer 353a, Conductive Layer 353b, and Conductive Layer 153]

Figure 23B:
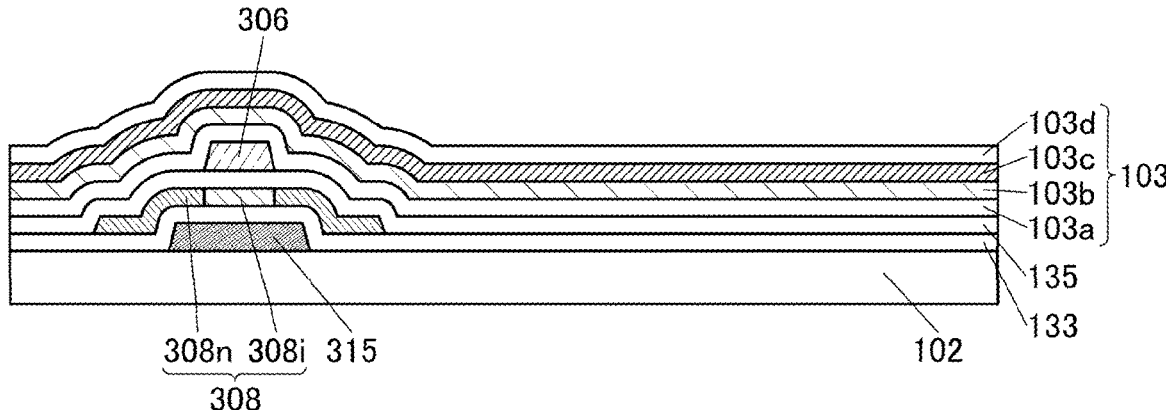

Next, the insulating layer 103 is formed to cover the insulating layer 135 and the conductive layer 306. The insulating layer 103 can be formed by a PECVD method, an ALD method, a sputtering method, or the like (FIG. 23B). Here, the insulating layer 103 is formed by stacking the insulating layer 103a, the insulating layer 103b, the insulating layer 103c, and the insulating layer 103d. In particular, each of the insulating layers included in the insulating layer 103 is preferably formed by a PECVD method. The above description can be referred to for the formation of the insulating layer 103; thus, the detailed description is omitted.

Next, heat treatment may be performed. By the heat treatment, hydrogen can be diffused from the insulating layer 103c into the semiconductor layer 308 and can terminate dangling bonds in the semiconductor layer 308 (hereinafter, also referred to as hydrogenation).

The heat treatment can be performed in an atmosphere containing hydrogen, a rare gas, or nitrogen. In particular, heat treatment is preferably performed in an atmosphere containing hydrogen. The heat treatment temperature is preferably higher than or equal to 200° C. and lower than the strain point of the substrate, further preferably higher than or equal to 250° C. and lower than or equal to 500° C., still further preferably higher than or equal to 300° C. and lower than or equal to 450° C., yet further preferably higher than or equal to 350° C. and lower than or equal to 450° C. The above-mentioned upper limits and lower limits can be combined freely. Note that the heat treatment is not necessarily performed after the addition of the second element. The heat treatment may be performed at any time after the addition of the second element. The heat treatment may also serve as heat treatment or a heat application step that is to be performed later.

Next, the insulating layer 103 and the insulating layer 135 are partly removed to form the opening portion 343a and the opening portion 343b that reach the regions 308n.

Figure 23C:
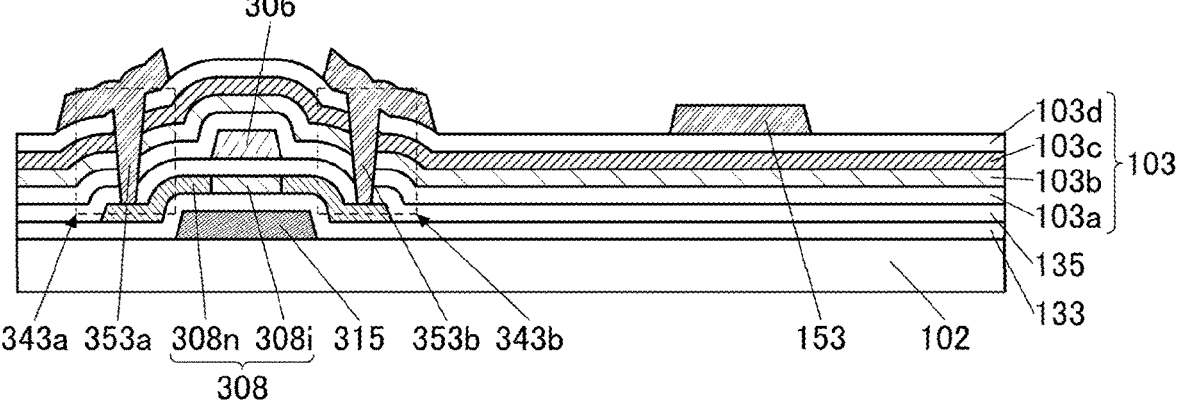

Next, a conductive film is formed over the insulating layer 103 to cover the opening portion 343a and the opening portion 343b and is processed to form the conductive layer 353a, the conductive layer 353b, and the conductive layer 153 functioning as a first gate electrode of the transistor 620 (FIG. 23C). At this time, processing is preferably performed so that end portions of the conductive layer 353a, the conductive layer 353b, and the conductive layer 153 have a tapered shape. This can improve step coverage with the insulating layer 137 to be formed next.

[Formation of Insulating Layer 137]

Figure 24A:
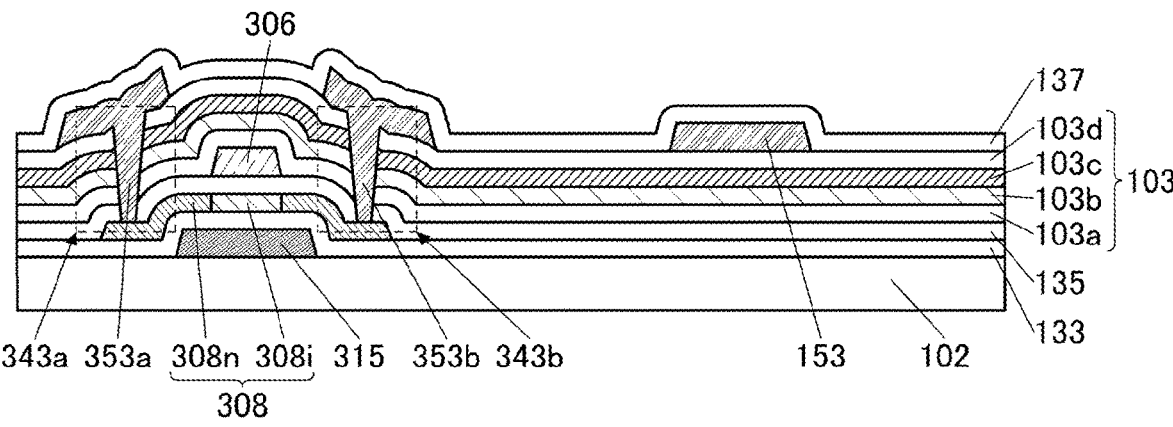
FIG. 24A, FIG. 24B, and FIG. 24C are cross-sectional views illustrating the method for manufacturing a semiconductor device.

Then, the insulating layer 137 is formed to cover the insulating layer 103, the conductive layer 353a, the conductive layer 353b, and the conductive layer 153 (FIG. 24A). The insulating layer 137 can be formed by a PECVD method, an ALD method, a sputtering method, or the like.

After the insulating layer 137 is formed, treatment for supplying oxygen to the insulating layer 137 may be performed. For example, plasma treatment, heat treatment, or the like in an oxygen atmosphere can be performed. Alternatively, oxygen may be supplied to the insulating layer 137 by a plasma ion doping method or an ion implantation method.

[Formation of Semiconductor Layer 108]

Figure 24B:
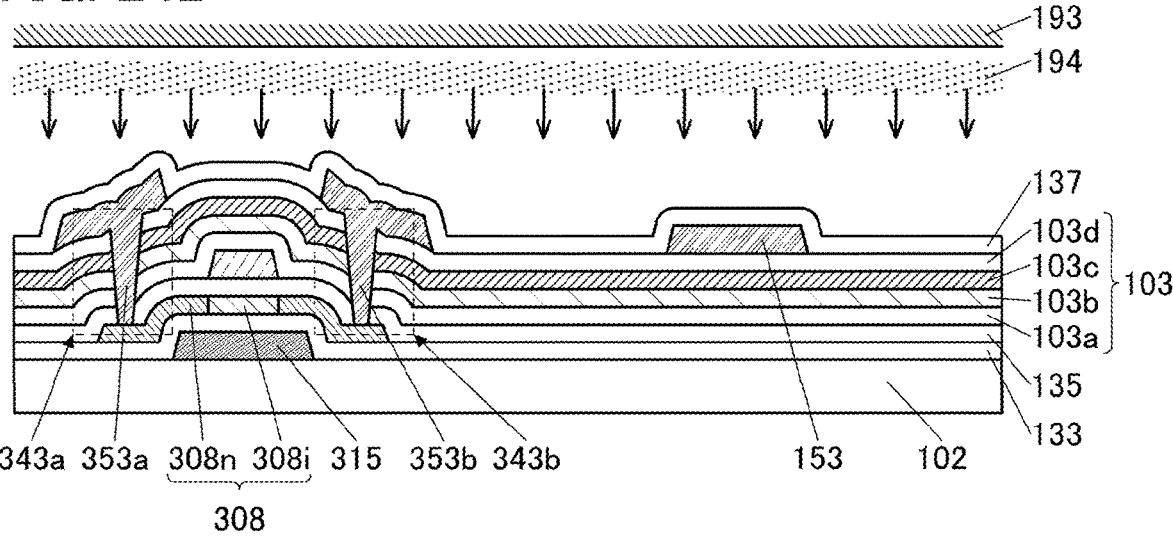
Figure 24C:
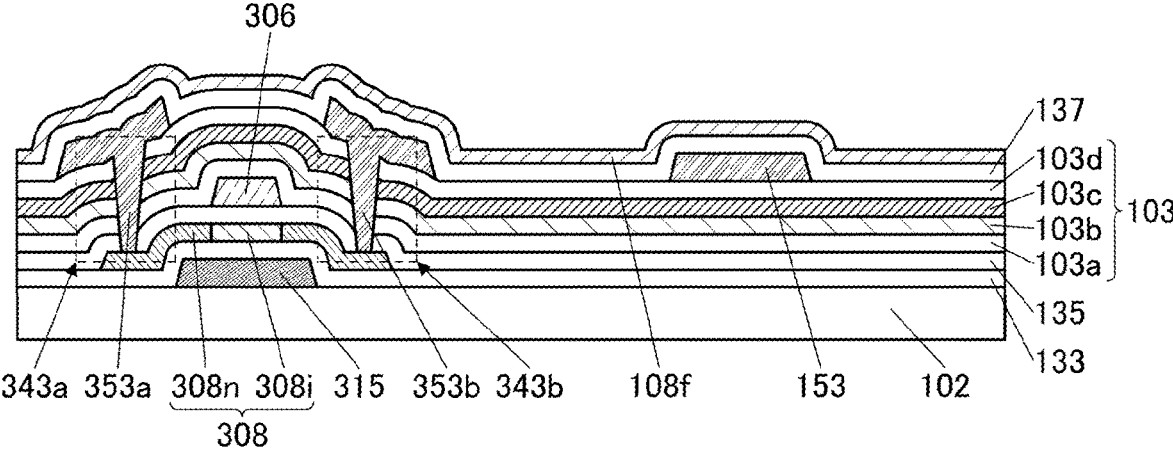

Next, a metal oxide film 108f to be the semiconductor layer 108 is formed over the insulating layer 137 (FIG. 24C).

The metal oxide film 108f is preferably formed by a sputtering method using a metal oxide target. FIG. 24B is a schematic cross-sectional view of the inside of a sputtering apparatus at the time of forming the metal oxide film 108f over the insulating layer 137. A target 193 placed inside the sputtering apparatus and plasma 194 formed under the target 193 are schematically illustrated. For example, in the case of using an oxygen gas at the time of forming the metal oxide film 108f, oxygen can be favorably supplied to the insulating layer 137. Note that oxygen supplied to the insulating layer 137 is represented by arrows in FIG. 24B.

The metal oxide film 108f is preferably a dense film with as few defects as possible. The metal oxide film 108f is preferably a highly purified film in which impurities such as hydrogen and water are reduced as much as possible. It is particularly preferable to use a metal oxide film having crystallinity as the metal oxide film 108f.

In forming the metal oxide film 108f, an oxygen gas and an inert gas (e.g., a helium gas, an argon gas, or a xenon gas) may be mixed. Note that when the proportion of an oxygen gas in the whole deposition gas (hereinafter, also referred to as oxygen flow rate ratio) at the time of forming the metal oxide film is higher, the crystallinity of the metal oxide film can be higher and a transistor with higher reliability can be obtained. By contrast, when the oxygen flow rate ratio is lower, the crystallinity of the metal oxide film is lower and a transistor with a higher on-state current can be obtained.

In the case where the semiconductor layer 108 having a stacked-layer structure is formed, successive deposition is preferably performed using the same sputtering target in the same deposition chamber to obtain a favorable interface. Although the deposition conditions such as pressure, temperature, and power at the time of the deposition may vary between the metal oxide films, it is particularly preferable to employ the same conditions except for the oxygen flow rate ratio because the time required for deposition steps can be shortened. Furthermore, in the case where metal oxide films having different compositions are stacked, successive deposition without exposure to the air is preferably performed.

The deposition conditions are preferably set such that the metal oxide film 108f becomes a metal oxide film having a CAAC structure, a metal oxide film having an nc structure, or a metal oxide film in which a CAAC structure and an nc structure are mixed. Note that the deposition conditions in which the formed metal oxide film has a CAAC structure and the deposition conditions in which the formed metal oxide film has an nc structure are different depending on the compositions of the sputtering targets to be used; therefore, the substrate temperature, the oxygen flow rate ratio, the pressure, the power, and the like are set as appropriate in accordance with the compositions.

The metal oxide film 108f is formed at a substrate temperature preferably higher than or equal to room temperature and lower than or equal to 450° C., further preferably higher than or equal to room temperature and lower than or equal to 300° C., still further preferably higher than or equal to room temperature and lower than or equal to 200° C., yet still further preferably higher than or equal to room temperature and lower than or equal to 140° C. For example, in the case where a large-sized glass substrate or a resin substrate is used as the substrate 102, the substrate temperature is preferably higher than or equal to room temperature and lower than 140° C., in which case the productivity can be increased. Furthermore, when the metal oxide film is formed with the substrate temperature set at room temperature or without heating, the crystallinity can be made low. The above-mentioned upper limits and lower limits can be combined freely.

Before formation of the metal oxide film 108*f*, it is preferable to perform treatment for desorbing water, hydrogen, an organic substance, or the like adsorbed onto a surface of the insulating layer 137 or treatment for supplying oxygen into the insulating layer 137. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed in an oxygen-containing atmosphere, e.g., in an atmosphere containing a dinitrogen monoxide gas, oxygen can be supplied to the insulating layer 137. When plasma treatment is performed in an atmosphere containing a dinitrogen monoxide gas, an organic substance on the surface of the insulating layer 137 can be suitably removed. After such treatment, the metal oxide film 108*f* is preferably formed successively without exposure of the surface of the insulating layer 137 to the air.

Figure 25A:
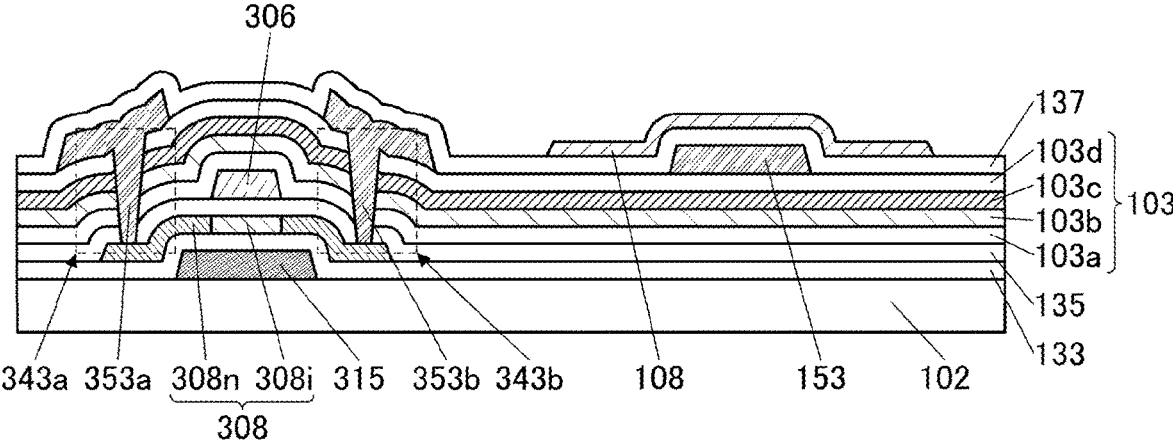
FIG. 25A, FIG. 25B, and FIG. 25C are cross-sectional views illustrating the method for manufacturing a semiconductor device.

Next, the metal oxide film 108*f* is processed, so that the island-shaped semiconductor layer 108 is formed (FIG. 25A).

For processing of the metal oxide film 108*f*, either one or both of a wet etching method and a dry etching method are used. At this time, part of the insulating layer 110 that does not overlap with the semiconductor layer 108 may be removed. When part of the insulating layer 110 is removed, the thickness of the insulating layer 110 in the region not overlapping with the semiconductor layer 108 is smaller than the thickness of the insulating layer 110 in the region overlapping with the semiconductor layer 108.

After the metal oxide film 108*f* is formed or the metal oxide film 108*f* is processed into the semiconductor layer 108, heat treatment may be performed to remove hydrogen or water in the metal oxide film 108*f* or the semiconductor layer 108. By the heat treatment, hydrogen or water contained in the metal oxide film 108*f* or the semiconductor layer 108 or adsorbed on the surface of the metal oxide film 108*f* or the semiconductor layer 108 can be removed. Furthermore, the film quality of the metal oxide film 108*f* or the semiconductor layer 108 is improved (e.g., the number of defects is reduced or crystallinity is increased) by the heat treatment in some cases.

Oxygen can be supplied from the insulating layer 137 to the metal oxide film 108*f* or the semiconductor layer 108 by heat treatment. In the case where oxygen is supplied from the insulating layer 137, it is further preferable that heat treatment be performed before processing of the semiconductor layer 108.

The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C. Note that heat treatment is not necessarily performed after the metal oxide film 108*f* is formed or the metal oxide film 108*f* is processed into the semiconductor layer 108. The heat treatment may be performed at any stage as long as it is after the formation of the metal oxide film 108*f*. The heat treatment may also serve as heat treatment or a heat application step that is to be performed later.

The heat treatment can be performed in an atmosphere containing a rare gas or nitrogen. Alternatively, heating may be performed in the atmosphere, and then heating may be performed in an oxygen-containing atmosphere. As a nitrogen-containing atmosphere or an oxygen-containing atmosphere, clean dry air (CDA) may be used. It is preferable that the atmosphere of the above-mentioned heat treatment not contain hydrogen, water, or the like. When a gas that is highly purified to have a dew point of −40° C. or lower, preferably −60° C. or lower, further preferably −100° C. or lower is used, hydrogen, water, or the like can be prevented from being taken into the semiconductor layer 108 as much as possible. An electric furnace, a rapid thermal annealing (RTA) apparatus, or the like can be used for the heat treatment. The use of the RTA apparatus can shorten the heat treatment time.

Note that an insulating layer 110 is preferably formed immediately after the formation of the semiconductor layer 108. In a state where the surface of the semiconductor layer 108 is exposed, water is adsorbed on the surface of the semiconductor layer 108 in some cases. When water is adsorbed on the surface of the semiconductor layer 108, hydrogen is diffused into the semiconductor layer 108 by later heat treatment or the like, so that $V_OH$ is formed in some cases.

Since $V_OH$ might be a carrier generation source, the amount of water adsorbed on the semiconductor layer 108 is preferably small.

[Formation of Insulating Layer 110 and Conductive Layer 112]

Figure 25B:
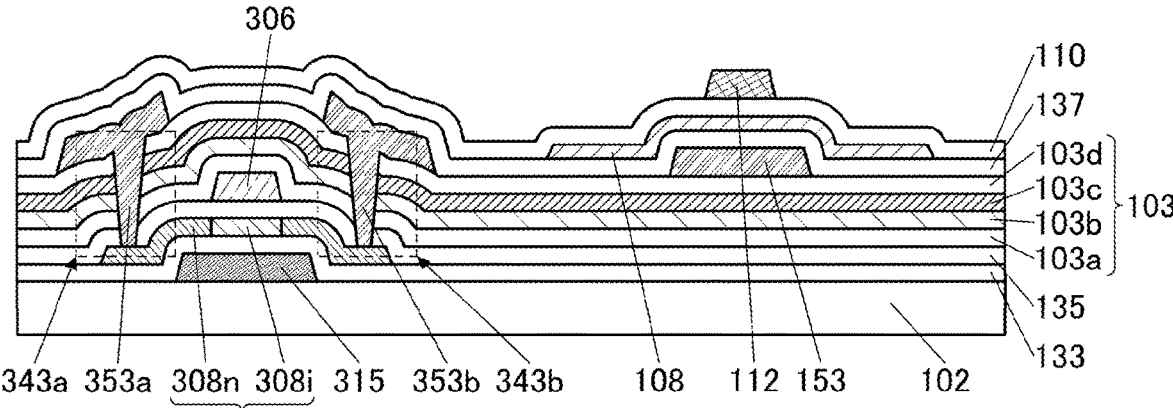

Next, the insulating layer 110 is formed to cover the insulating layer 137 and the semiconductor layer 108 (FIG. 25B). The insulating layer 110 can be formed by a PECVD method, an ALD method, a sputtering method, or the like.

It is preferable to perform plasma treatment on a surface of the semiconductor layer 108 before formation of the insulating layer 110. By the plasma treatment, impurities adsorbed onto the surface of the semiconductor layer 108, such as water, can be reduced. Thus, impurities at the interface between the semiconductor layer 108 and the insulating layer 110 can be reduced, achieving a highly reliable transistor. The plasma treatment is particularly suitable in the case where the surface of the semiconductor layer 108 is exposed to the air after the formation of the semiconductor layer 108 before the formation of the insulating layer 110. For example, the plasma treatment can be performed in an atmosphere of oxygen, ozone, nitrogen, dinitrogen monoxide, argon, or the like. The plasma treatment and the formation of the insulating layer 110 are preferably performed successively without exposure to the air.

Heat treatment may be performed after the formation of the insulating layer 110. Performing the heat treatment can remove impurities in the insulating layer 110 and adsorbed water on the surface of the insulating layer 110. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the insulating layer 110. The heat treatment may be performed at any stage as long as it is after the formation of the insulating layer 110. The heat treatment may also serve as heat treatment or a heat application step that is to be performed later.

After the insulating layer 110 is formed or after the above-mentioned heat treatment for removing hydrogen or water is performed, treatment for supplying oxygen to the insulating layer 110 may be performed. For example, plasma treatment, heat treatment, or the like can be performed in an oxygen-containing atmosphere. Alternatively, oxygen may be supplied to the insulating layer 110 by a plasma ion doping method, an ion implantation method, or the like. As the plasma treatment, a PECVD apparatus can be suitably used, for example. In the case where the insulating layer 110 is formed with a PECVD apparatus, plasma treatment is preferably performed in vacuum in succession after the formation of the insulating layer 110. By successively performing the formation of the insulating layer 110 and the plasma treatment in vacuum, the productivity can be increased.

In the case where heat treatment is performed after treatment for supplying oxygen to the insulating layer 110, the heat treatment may be performed after a film (e.g., a metal oxide film) is formed over the insulating layer 110. When the heat treatment is performed while the insulating layer 110 is exposed, oxygen supplied to the insulating layer 110 might be released to the outside from the insulating layer 110. Performing the heat treatment after the film (e.g., the metal oxide film) is formed over the insulating layer 110 can inhibit release of oxygen, which has been supplied to the insulating layer 110, to the outside from the insulating layer 110.

Next, a conductive film is formed over the insulating layer 110 and processed by etching, so that the conductive layer 112 functioning as a second gate electrode of the transistor 620 is formed. (FIG. 25B). The conductive film is preferably formed by a sputtering method using a sputtering target of a metal or an alloy.

A wet etching method can be suitably used to form the conductive layer 112. In a wet etching method, for example, an etchant containing hydrogen peroxide can be used. For example, an etchant containing one or more of phosphoric acid, acetic acid, nitric acid, hydrochloric acid, and sulfuric acid can be used. In particular, in the case where a material containing copper is used for the conductive layer 112, an etchant containing phosphoric acid, acetic acid, and nitric acid can be suitably used.

Figure 25C:
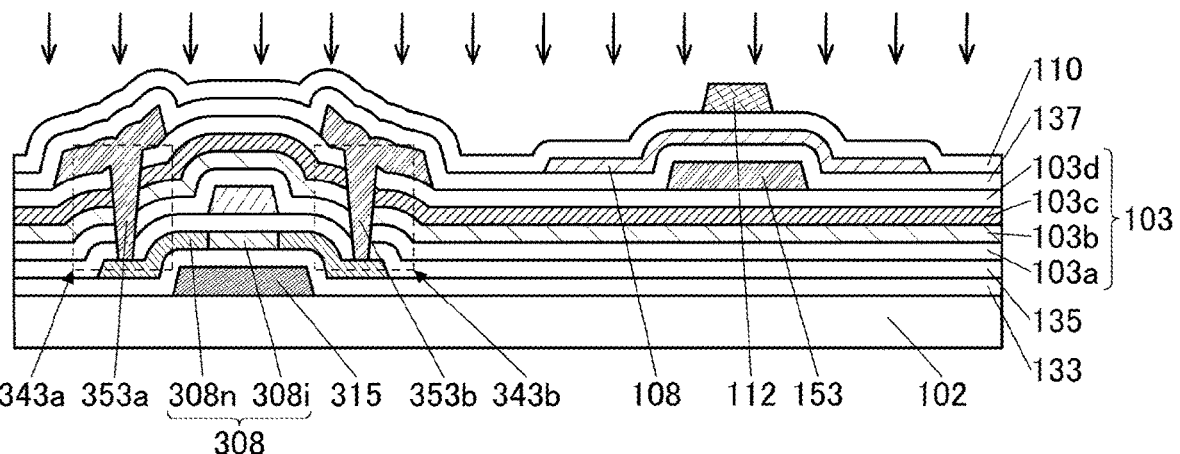
Figure 26A:
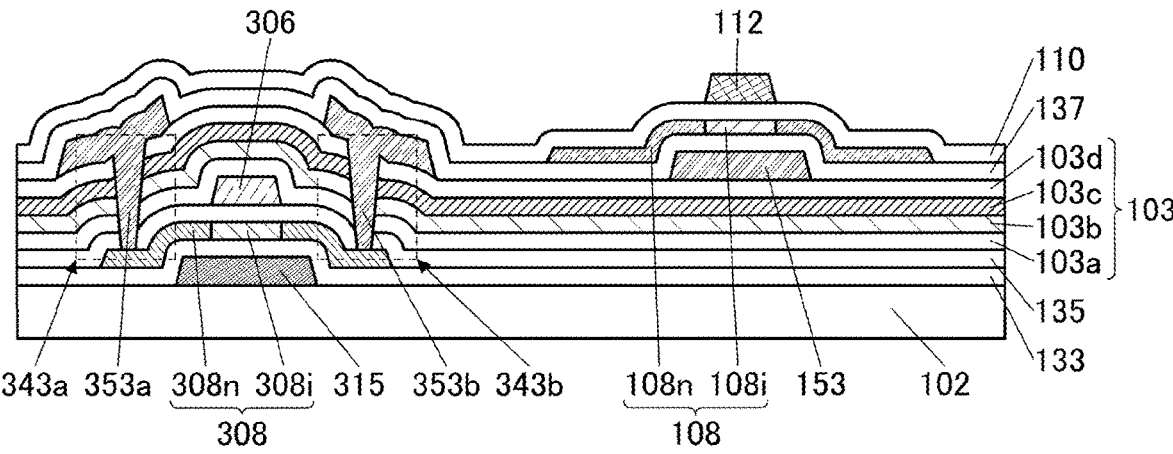
FIG. 26A and FIG. 26B are cross-sectional views illustrating the method for manufacturing a semiconductor device.

Next, using the conductive layer 112 as a mask, the first element is supplied to the semiconductor layer 108 through the insulating layer 110 (FIG. 25C). The first element can be supplied by plasma treatment, a plasma ion doping method, an ion implantation method, or the like. In FIG. 25C, the supply of the first element is indicated by arrows. By the supply of the first element using the conductive layer 112 as a mask, the region 108i and the regions 108n can respectively be formed in the semiconductor layer 108 in the region overlapping with the conductive layer 112 and the semiconductor layer 108 in the region not overlapping with the conductive layer 112 in a self-aligned manner (FIG. 26A).

In particular, plasma treatment can be suitably employed for supplying the first element. In the case of employing plasma treatment, plasma is generated in a gas atmosphere containing the first element to be supplied and plasma treatment is performed, so that the first element can be supplied. A dry etching apparatus, an ashing apparatus, a plasma CVD apparatus, a high-density plasma CVD apparatus, or the like can be used as an apparatus for generating the plasma.

After the first element is supplied, the insulating layer 118 may be successively formed without exposure to the air. For example, a plasma CVD apparatus can be used to supply the first element and form the insulating layer 118, whereby the insulating layer 118 can be successively formed after the supply of the first element without exposure to the air. By successively performing these steps, the productivity of the semiconductor device can be increased.

In the case of performing plasma treatment, a gas containing the first element can be used as a gas for supplying the first element. It is particularly preferable to use a gas containing hydrogen; supply of hydrogen to the regions 108n allows the resistance to be controlled. As the gas containing the first element, for example, hydrogen ($H_2$), ammonia ($NH_3$), or silane ($SiH_4$) can be suitably used.

The substrate temperature during the plasma treatment is preferably higher than or equal to room temperature and lower than or equal to 450° C., further preferably higher than or equal to 150° C. and lower than or equal to 400° C., still further preferably higher than or equal to 200° C. and lower than or equal to 350° C. The substrate temperature in the above-mentioned range promotes a reaction between the material included in the semiconductor layer 108 and the first element; thus, the resistance of the semiconductor layer 108 can be lowered. The above-mentioned upper limits and lower limits can be combined freely.

The pressure in a treatment chamber during the plasma treatment is preferably higher than or equal to 50 Pa and lower than or equal to 1500 Pa, further preferably higher than or equal to 100 Pa and lower than or equal to 1000 Pa, still further preferably higher than or equal to 120 Pa and lower than or equal to 500 Pa, yet further preferably higher than or equal to 150 Pa and lower than or equal to 300 Pa. With the pressure in the above-mentioned range, plasma can be stably generated. The above-mentioned upper limits and lower limits can be combined freely.

By appropriate selection of the conditions of the plasma treatment, the amount of first element supplied to the semiconductor layer 108 can be adjusted and the resistance can be controlled. Since the first element is supplied to the semiconductor layer 108 through the insulating layer 110, the thickness of the insulating layer 110 may be adjusted so that the resistance can be a desired value.

Alternatively, the first element may be supplied by treatment utilizing thermal diffusion by heating using the gas containing the first element.

Alternatively, the first element may be supplied by a plasma ion doping method or an ion implantation method. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of the first element to be supplied. As the first element, one or more of boron, phosphorus, aluminum, magnesium, and silicon can be particularly suitably used.

In the treatment for supplying the first element, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the first element at an optimal concentration can be supplied to both the semiconductor layer 108 and the insulating layer 110 in one treatment.

In the case of employing a plasma ion doping method or an ion implantation method, the gas containing the first element can be used as the gas for supplying the first element. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used. Besides, any of $CH_4$, $N_2$, $NH_3$, $A_1H_3$, $AlCl_3$, $SiH_4$, $Si_2H_6$, $F_2$, $HF$, $H_2$, $(C_5H_5)_2Mg$, a rare gas, and the like can be used as the gas for supplying the first element. An ion source is not limited to a gas, and a solid or a liquid that is vaporized by heating may be used.

Supply of the first element can be controlled by setting the conditions such as the acceleration voltage and the dosage in consideration of the compositions, densities, thicknesses, and the like of the insulating layer 110 and the semiconductor layer 108.

For example, in the case where boron ions are supplied by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dosage can be, for example, greater than or equal to $1\times10^{13}$ ions/cm$^2$ and less than or equal 15 to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

In the case where phosphorus ions are supplied by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. The dosage can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

In one embodiment of the present invention, the first element can be supplied to the semiconductor layer 108 through the insulating layer 110. Thus, even in the case where the semiconductor layer 108 has crystallinity, damage on the semiconductor layer 108 is reduced at the time of supplying the first element, and degradation of crystallinity can be inhibited. Therefore, this is suitable for the case where a reduction in crystallinity increases electric resistance.

[Formation of Insulating Layer 118]

Figure 26B:
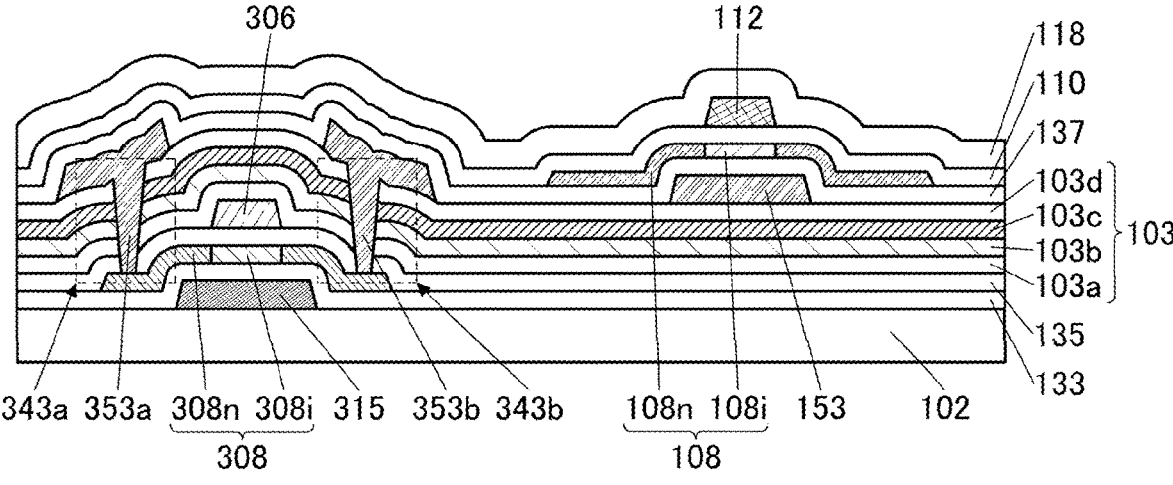

Then, the insulating layer 118 is formed to cover the insulating layer 110 and the conductive layer 112 (FIG. 26B). The insulating layer 118 can be formed by a PECVD method, an ALD method, a sputtering method, or the like.

When the insulating layer 118 is formed by a plasma CVD method at a too high deposition temperature, some impurities contained in the regions 108*n* and the like might be diffused into a peripheral portion including the region 108*i*. As a result, the resistance of the region 108*i* might be lowered, and the resistance of the regions 108*n* might be increased, for example. The deposition temperature of the insulating layer 118 is higher than or equal to 150° C. and lower than or equal to 400° C., preferably higher than or equal to 180° C. and lower than or equal to 360° C., further preferably higher than or equal to 200° C. and lower than or equal to 250° C., for example. By forming the insulating layer 118 at low temperatures, even a transistor with a short channel length can have favorable electrical characteristics.

Heat treatment may be performed after the formation of the insulating layer 118.

[Formation of Opening Portion 141*a*, Opening Portion 141*b*, Opening Portion 341*a*, and Opening Portion 341*b*]

Next, the insulating layer 118 and the insulating layer 110 are partly removed, whereby the opening portion 141*a* and the opening portion 141*b* that reach the regions 108*n* are formed. Furthermore, the insulating layer 118, the insulating layer 110, and the insulating layer 137 are partly removed, whereby the opening portion 341*a* and the opening portion 341*b* reaching the conductive layer 353*a* and the conductive layer 353*b* are formed.

[Formation of Conductive Layer 120*a*, Conductive Layer 120*b*, Conductive Layer 320*a*, and Conductive Layer 320*b*]

Subsequently, a conductive film is formed over the insulating layer 118 to cover the opening portion 141*a*, the opening portion 141*b*, the opening portion 341*a*, and the opening portion 341*b*, and the conductive film is processed, so that the conductive layer 120*a*, the conductive layer 120*b*, the conductive layer 320*a*, and the conductive layer 320*b* are formed (FIG. 15A).

Through the above-described steps, the semiconductor device 600 can be manufactured.

<Components of Semiconductor Device>

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates on which a semiconductor element is provided may be used as the substrate 102.

A flexible substrate may be used as the substrate 102, and the transistor 30 and the like may be formed directly on the flexible substrate. Alternatively, a separation layer may be provided between the substrate 102 and the transistor 30 and the like. The separation layer can be used when part or the whole of a semiconductor device completed thereover is separated from the substrate 102 and transferred onto another substrate. In that case, the transistor 30 and the like can be transferred onto a substrate having low heat resistance or a flexible substrate as well.

[Semiconductor Layer 108]

The semiconductor layer 108 is preferably formed using a metal oxide having an energy gap of 2 eV or more, preferably 2.5 eV or more. With the use of such a metal oxide having a wider energy gap than silicon, the off-state current of the transistor can be reduced.

A metal oxide with a low carrier concentration is preferably used for the semiconductor layer 108. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in the metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using a metal oxide containing much hydrogen is likely to have normally-on characteristics.

A defect that is an oxygen vacancy into which hydrogen has entered can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, hydrogen in the metal oxide is preferably reduced as much as possible. Specifically, the hydrogen concentration of the metal oxide obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

The carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited but can be, for example, $1\times10^{-9}$ cm$^{-3}$.

The semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an InGaZnO$_4$ crystal having a YbFe$_2$O$_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image obtained with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image of the nc-OS film observed with a TEM, for example, a crystal grain boundary cannot be clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the diameter of a crystal part, a peak indicating a crystal plane does not appear. Furthermore, a diffraction pattern like a halo pattern is observed when the nc-OS film is subjected to electron diffraction using an electron beam with a probe diameter (e.g., 50 nm or larger) that is larger than the diameter of a crystal part (also referred to as selected-area electron diffraction). Meanwhile, in some cases, a circular (ring-like) region with high luminance is observed and a plurality of spots are observed in the region when the nc-OS film is subjected to electron diffraction using an electron beam with a probe diameter (e.g., 1 nm or larger and 30 nm or smaller) close to or smaller than the size of a crystal part (also referred to as nanobeam electron diffraction).

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier concentration and higher electron mobility than the CAAC-OS film in some cases. Accordingly, a transistor using the nc-OS film may have high field-effect mobility.

The nc-OS film can be formed at a lower oxygen flow rate ratio in deposition than the CAAC-OS film. The nc-OS film can also be formed at a lower substrate temperature in deposition than the CAAC-OS film. For example, the nc-OS film can be formed at a relatively low substrate temperature (e.g., a temperature of 130° C. or lower) or without heating of the substrate and thus is suitable for the case of using a large-sized glass substrate, a resin substrate, or the like, and productivity can be increased.

An example of a crystal structure of a metal oxide is described. Note that a metal oxide formed by a sputtering method using an In—Ga—Zn oxide target (In:Ga:Zn=4:2: 4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated.

[Composition of Metal Oxide]

The composition of a CAC (Cloud-Aligned Composite)-OS that can be used in a transistor disclosed in one embodiment of the present invention will be described below.

Note that in this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of the components.

<Laser Processing Apparatus>

Next, a laser processing apparatus that can be used in a manufacturing process of the semiconductor device of one embodiment of the present invention is described. The laser processing apparatus can irradiate a process object with laser light that is shaped into a linear beam.

The laser processing apparatus can be used to irradiate an amorphous film provided over a substrate with laser light and crystallize the amorphous film, for example.

The laser processing apparatus described here can also be used to separate a substrate by irradiating a structure object formed over the substrate with a resin layer therebetween with laser light or for a technique where a substrate is peeled by irradiating a structure object formed over the substrate with a resin layer therebetween with laser light, for example. Specifically, the laser light is made to pass through the substrate and delivered to the resin layer or a layer in the vicinity of the resin layer (e.g. an amorphous silicon layer or a metal layer).

For example, a resin layer of polyimide or the like is provided over a substrate and a structure object is formed over the resin layer. Then, laser light having passed through the substrate is made to be delivered to the resin layer or the vicinity of the resin layer, so that the bonding force between the substrate and the resin layer is weakened and the substrate can be separated.

Figure 27A:
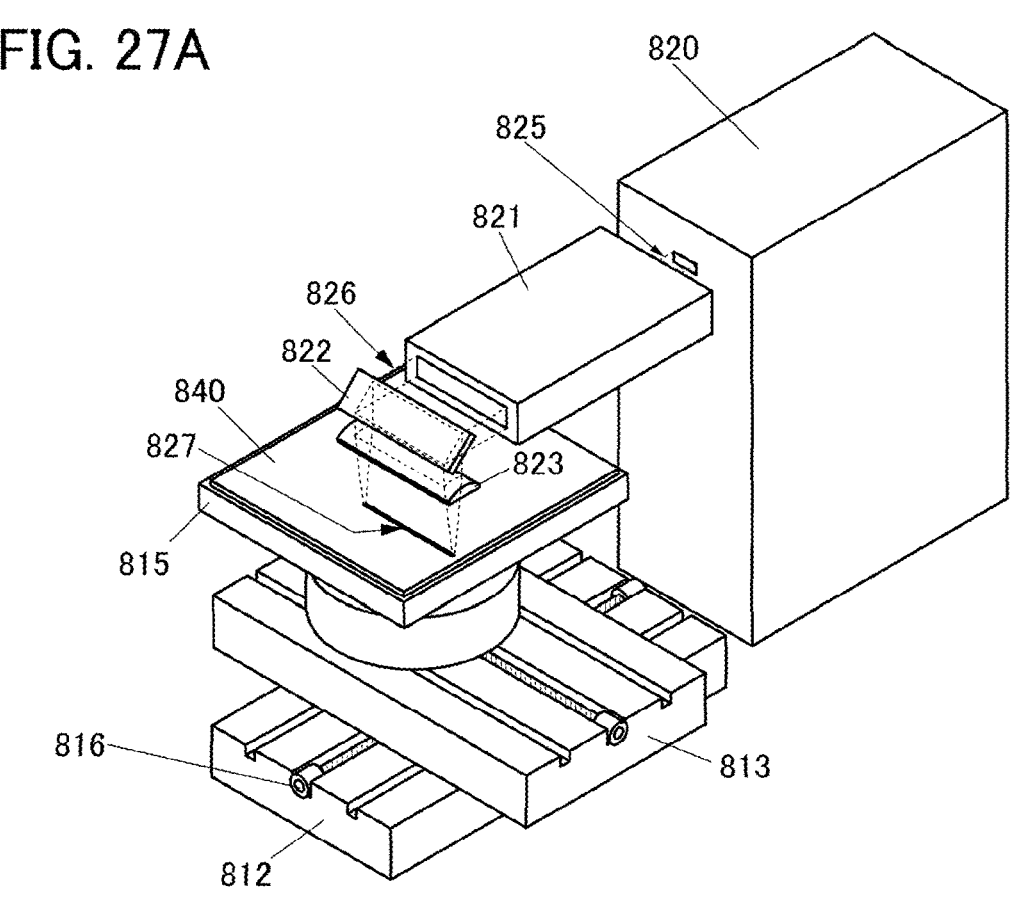
FIG. 27A is a diagram illustrating a laser processing apparatus.

FIG. 27A is a perspective view illustrating a main structure of a laser processing apparatus. The laser processing apparatus includes a moving mechanism 812, a moving mechanism 813, and a stage 815 which are components of an X-Y stage. A laser oscillator 820, an optical system unit 821, a mirror 822, a condenser lens 823, and the like for shaping a linear beam 827 are also included.

The moving mechanism 812 and the moving mechanism 813 have a function of performing reciprocating linear motion in the horizontal direction. As a mechanism for powering the moving mechanism 812 and the moving mechanism 813, a ball screw mechanism 816 or the like driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The laser oscillator 820 is preferably a pulsed laser, but may be a CW laser (Continuous wave laser) as long as it outputs light with a wavelength and intensity suitable for the purpose of processing. Typically, an excimer laser capable of emitting ultraviolet light with a wavelength of 351-353 nm (XeF), 308 nm (XeCl), or the like can be used. Alternatively, a second harmonic wavelength (515 nm, 532 nm, or the like) or a third harmonic wavelength (343 nm, 355 nm, or the like) of a solid-state laser (such as a YAG laser or a fiber laser) may be used. A plurality of laser oscillators 820 may be provided.

The optical system unit 821 includes a beam expander, a beam homogenizer, a cylindrical lens, and the like, for example, and can expand laser light 825 while homogenizing the energy in-plane distribution of the laser light 825 output from the laser oscillator 820.

As the mirror 822, a dielectric multilayer mirror can be used, for example, and is provided so that the incident angle of the laser light is substantially 45°. As the condenser lens 823, for example, a cylindrical lens can be used.

First, the laser light 825 output from the laser oscillator 820 enters the optical system unit 821. Laser light 826 after expansion into a rectangular shape by the optical system unit 821 enters the mirror 822.

The laser light 826 reflected by the mirror 822 enters the condenser lens 823, and thus the linear beam 827 is formed at a desired position (height) of a process object 840. The stage 815 is moved in the horizontal direction in a state where the process object 840 is irradiated with the linear beam 827 as described above, whereby a desired region of the process object 840 can be subjected to laser processing.

Next, the process object 840 and a processing method are described.

Figure 27B:
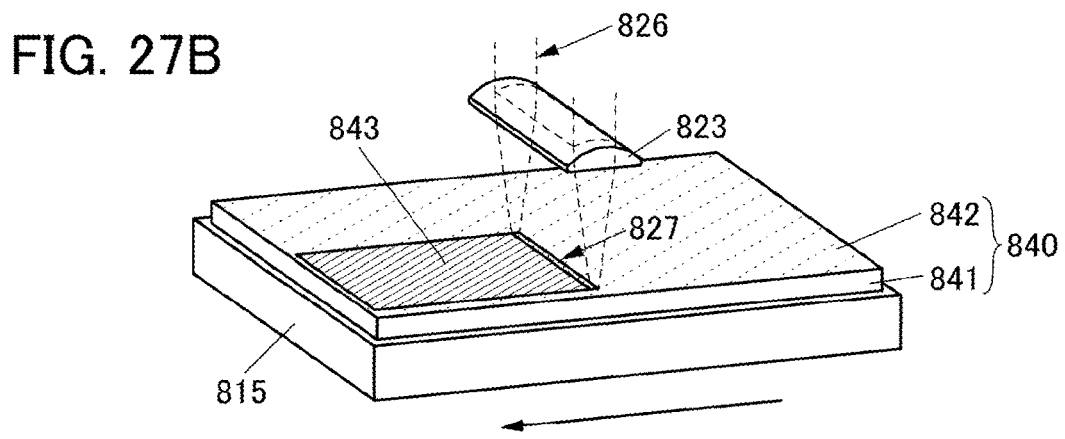
FIG. 27B and FIG. 27C are diagrams illustrating an irradiation method with the laser processing apparatus.

FIG. 27B is a diagram illustrating a method for crystallizing an amorphous film by irradiating the amorphous film with a linear beam. In FIG. 27B, a glass substrate 841 and an amorphous silicon layer 842 provided over the glass substrate 841 are illustrated as the process object 840.

The glass substrate 841 side is placed on the stage 815, and the amorphous silicon layer 842 side is a top surface. The height of the stage, the optical system, and the like are adjusted so that the laser light 826 incident on the condenser lens 823 can form the linear beam 827 on the surface where the amorphous silicon layer 842 is formed or the vicinity thereof.

The output of the laser oscillator 820 is set so as to obtain an appropriate energy density of the linear beam 827. By moving the stage in the direction indicated by an arrow while emitting the laser light, a polycrystalline silicon layer 843 can be formed.

Figure 27C:
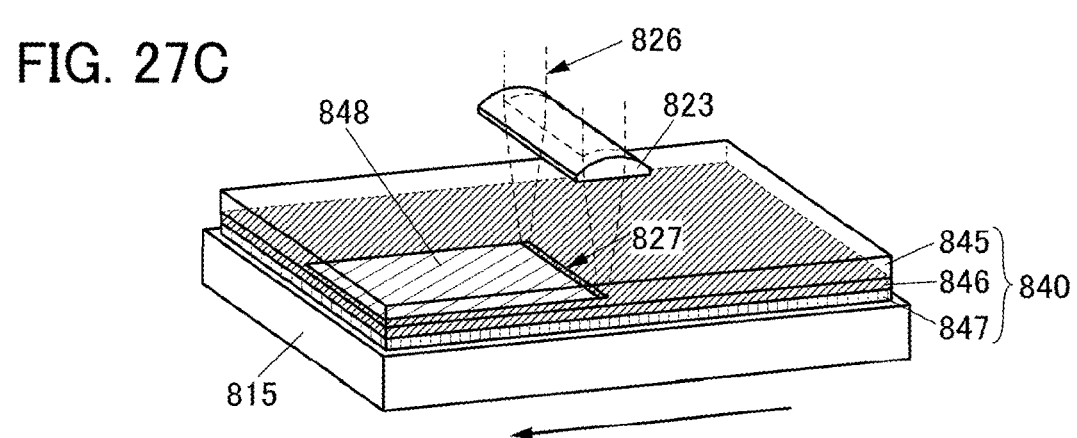

FIG. 27C is a drawing illustrating a method for separating a resin layer and a substrate from each other by irradiating the resin layer with a linear beam through the substrate. In FIG. 27C, a stack of a glass substrate 845, a resin layer 846, and a structure object 847 is illustrated as the process object 840.

The structure object 847 side is placed on the stage 815, and the glass substrate 845 side is a top surface. The height of the stage, the optical system, and the like are adjusted so that the laser light 826 incident on the condenser lens 823 can form the linear beam 827 on the interface between the glass substrate 845 and the resin layer 846 or the vicinity thereof through the glass substrate 845.

Since the laser light is delivered to the processing position through the glass substrate 845, the laser light is preferably short-wavelength laser light with a relatively high transmittance of the glass substrate. For example, laser light with a wavelength range from 300 nm to 400 nm is preferably used.

The output of the laser oscillator 820 is set so as to obtain an appropriate energy density of the linear beam 827. By moving the stage in the direction indicated by an arrow while emitting the laser light, a processed region 848 can be formed.

Here, the processed region 848 is in a state where a change in quality, decomposition, or the like of the resin layer 846 is caused by light or heat at the interface between the resin layer 846 and the glass substrate 845 or in the vicinity of the interface. With that phenomenon, the bonding force between the resin layer 846 and the glass substrate 845 is brought into a weakened state, so that the resin layer 846 and the glass substrate 845 can be separated from each other. Note that part of the resin layer 846 remains on the glass substrate 845 side at the separation plane, in some cases.

In the case where the structure object includes a display portion or the like, a flexible substrate or the like may be further attached, whereby a display device having flexibility can be formed.

Although two uses of the linear beam have been described above, the laser processing apparatus described in this embodiment can also be used for the other purposes. A linear beam can irradiate a large area by relatively moving in a uniaxial direction. Accordingly, the process object can be processed at high throughput.

At least part of this embodiment can be implemented in appropriate combination with the other embodiments described in this specification.

Embodiment 3

In this embodiment, an example of a display device that includes the transistor exemplified in the above embodiment will be described.

Structure Example

FIG. 28A is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 28B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 28B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 28B. When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

A display device 700B illustrated in FIG. 28C is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

Meanwhile, the gate driver circuit portions 722 are provided over the first substrate 701. Thus, an electronic device with a narrow bezel can be provided.

With such a structure, a large-size and high-definition display device can be provided. For example, a display device with a diagonal screen size of 30 inches or more, 40 inches or more, 50 inches or more, or 60 inches or more can be obtained. Furthermore, a display device with extremely high definition such as 4K2K or 8K4K can be provided.

Cross-Sectional Structure Example

Figure 29:
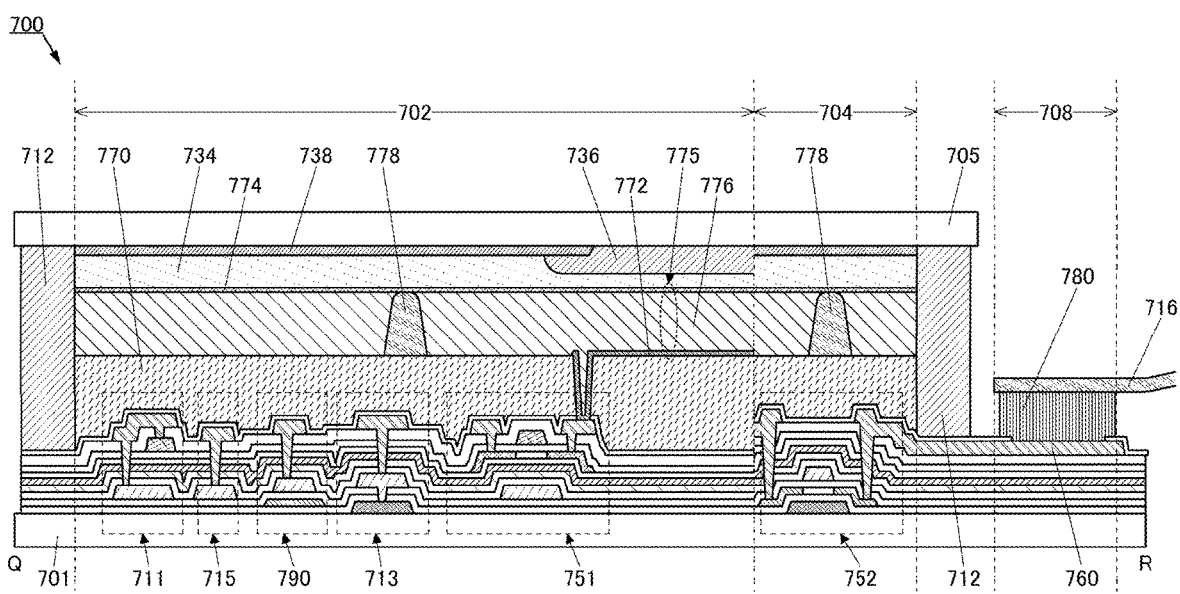
FIG. 29 is a cross-sectional view of a display device.
Figure 30:
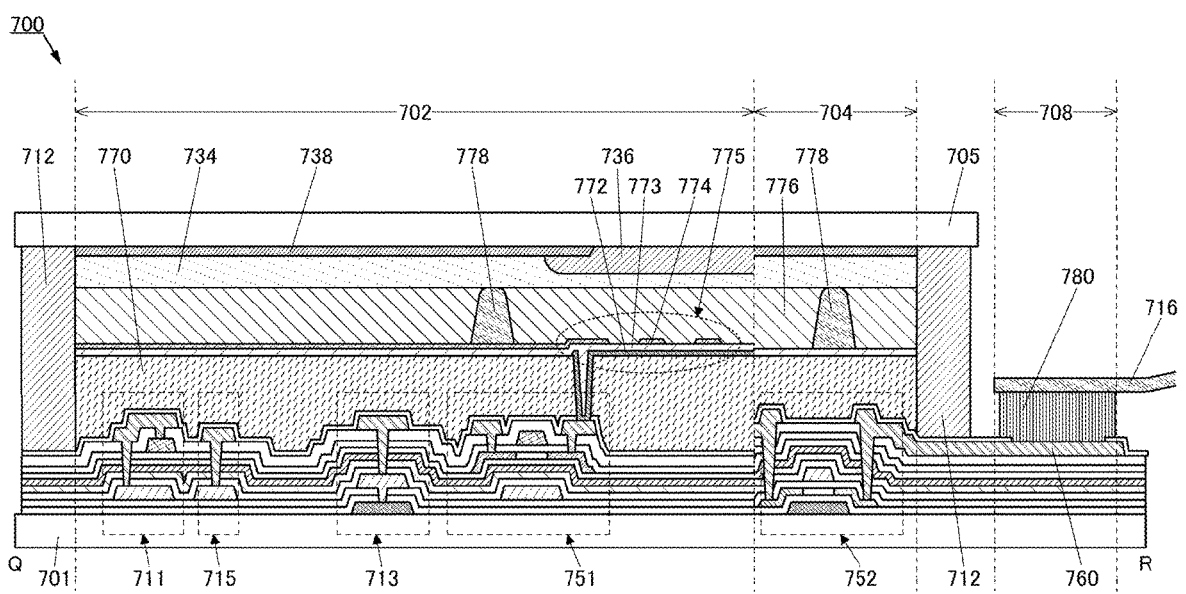
FIG. 30 is a cross-sectional view of a display device.

Structures using a liquid crystal element as a display element and structures using an EL element as a display element will be described below with reference to FIG. 29 to FIG. 33. Note that FIG. 29 to FIG. 32 are cross-sectional views along the dashed-dotted line Q-R in FIG. 28A. FIG. 33 is a cross-sectional view along the dashed-dotted line S-T in the display device 700A illustrated in FIG. 28B. FIG. 29 and FIG. 30 each illustrate a structure using a liquid crystal element as a display element, and FIG. 32 and FIG. 33 each illustrate a structure using an EL element.

[Description of Common Portions in Display Devices]

Display devices in FIG. 29 to FIG. 33 each include the pixel portion 702, the source driver circuit portion 704, and the FPC terminal portion 708. The pixel portion 702 includes a transistor 751 and a capacitor 790. The pixel portion 702 included in the display devices illustrated in FIG. 32 and FIG. 33 further includes a transistor 750. The source driver circuit portion 704 includes a transistor 752. FIG. 30 illustrates a case where the capacitor 790 is not provided.

As the transistor 750, the transistor 751, and the transistor 752, any of the transistors described in Embodiment 1 as examples can be used. For example, an OS transistor is preferably used as the transistor 751, and Si transistors are preferably used as the transistor 750 and the transistor 752.

The OS transistor used in this embodiment includes a highly purified oxide semiconductor film in which formation of oxygen vacancies is suppressed. The OS transistor can have a low off-state current. Accordingly, an electrical signal such as an image signal can be held for a longer period, and the interval between writes of an image signal or the like can be set longer. Thus, the frequency of refresh operation can be reduced, which leads to lower power consumption.

The Si transistor used in this embodiment can have relatively high field-effect mobility and thus is capable of high-speed operation. For example, with such a Si transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the Si transistor capable of high-speed operation also in the pixel portion can provide a high-quality image.

The capacitor 790 illustrated in FIG. 29, FIG. 31, FIG. 32, and FIG. 33 includes a lower electrode formed through the same step as a low-resistance region of a semiconductor layer included in the transistor 752 and an upper electrode formed through the same step as a second gate electrode. Part of an insulating film functioning as a second gate insulating layer of the transistor 752 is provided between the lower electrode and the upper electrode. That is, the capacitor 790 has a stacked-layer structure in which an insulating film functioning as a dielectric film is positioned between a pair of electrodes. A wiring obtained by processing the same film as that used for a source electrode and a drain electrode of the transistor 752 is connected to the upper electrode.

Note that the structure of the capacitor that can be used in one embodiment of the present invention is not limited to the structure of the capacitor 790. Layers having any conductivity can be used in combination as the lower electrode and the upper electrode. Furthermore, one or more layers having conductivity may be provided as an electrode between the upper electrode and the lower electrode, and an insulating film may be provided between the electrodes.

A planarization insulating film 770 is provided over the transistor 751, the transistor 752, and the capacitor 790.

The transistor 751 in the pixel portion 702 and the transistor 752 in the source driver circuit portion 704 may have different structures. For example, a top-gate transistor may be used as one of the transistors 751 and 752, and a bottom-gate transistor may be used as the other. Note that the same can be said for the gate driver circuit portion 706, as the source driver circuit portion 704.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as that used for the source electrode, the drain electrode, and the like of the transistor 752.

FIG. 29 to FIG. 33 illustrate a connection portion 711, a connection portion 713, and a connection portion 715.

In the connection portion 711, a first wiring which is formed by processing the same conductive film as that used for a first gate electrode of the transistor 751 and a second wiring formed by processing the same conductive film as that used for a second gate electrode are electrically connected to each other through a wiring formed by processing the same conductive film as that used for the source electrode and the drain electrode. The first wiring may be electrically connected to the first gate electrode of the transistor 751. The second wiring may be electrically connected to the second gate electrode of the transistor 751.

In the connection portion 713, a third wiring formed by processing the same conductive film as that used for a first gate electrode of the transistor 752, a fourth wiring formed by processing the same conductive film as that used for a second gate electrode, and a wiring formed by processing the same conductive film as that used for the source electrode and the drain electrode are electrically connected to each other. The third wiring may be electrically connected to the first gate electrode of the transistor 750. The fourth wiring may be electrically connected to the second gate electrode of the transistor 750.

In the connection portion 715, a fifth wiring formed by processing the same conductive film as that used for a second gate electrode of the transistor 752 and a wiring formed by processing the same conductive film as that used for the source electrode and the drain electrode are electrically connected to each other. The fifth wiring may be electrically connected to the second gate electrode of the transistor 751.

Note that the connection portions that can be used in one embodiment of the present invention are not limited to the structures of the connection portion 711, the connection portion 713, and the connection portion 715. Layers having any conductivity can be combined to form a connection portion.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 752, for example.

A light-blocking layer 738, a coloring layer 736, and an insulating layer 734 in contact with these layers are provided on the second substrate 705 side.

[Structure Example of Display Device Using Liquid Crystal Element]

The display device 700 illustrated in FIG. 29 includes a liquid crystal element 775 and a spacer 778. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 751. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. Meanwhile, when a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided such that the liquid crystal element is placed therebetween.

The display device 700 in FIG. 30 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 30, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 29 and FIG. 30, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. At this time, monochrome image display may be performed without the coloring layer 736, or color display may be performed using the coloring layer 736.

As a method for driving the liquid crystal element, a time-division display method (also referred to as a field-sequential driving method) in which color display is performed on the basis of a successive additive color mixing method may be employed. In that case, a structure in which the coloring layer 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

Figure 31:
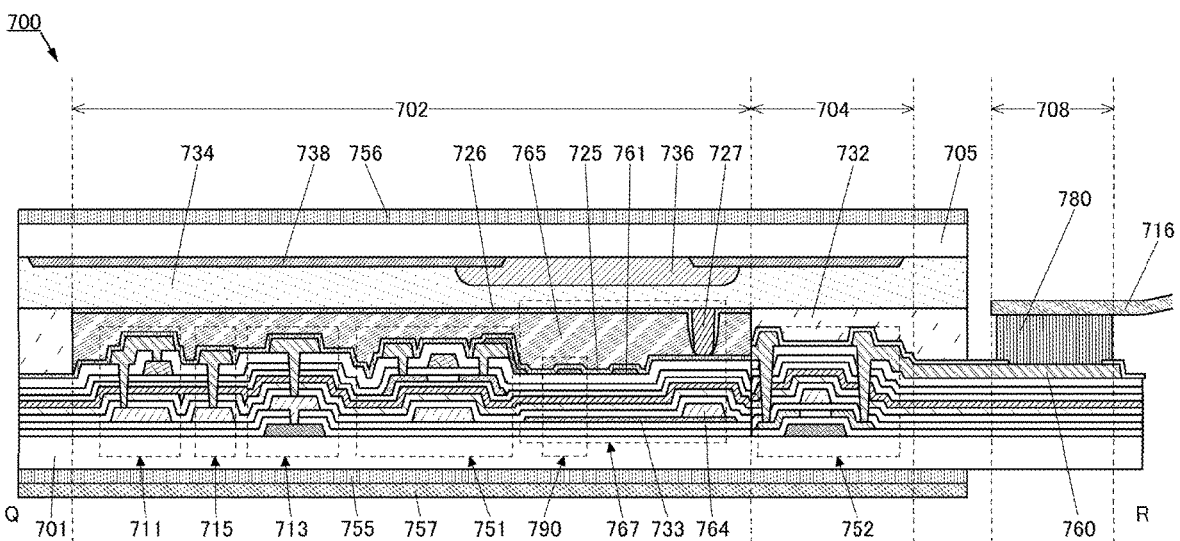
FIG. 31 is a cross-sectional view of a display device.

FIG. 31 illustrates an example of employing the liquid crystal element 775 of a horizontal electric field mode (e.g., an FFS mode), which is different from that in the display device 700 in FIG. 30.

The display device 700 illustrated in FIG. 31 includes the transistor 751, the transistor 752, a liquid crystal element 767, and the like between the first substrate 701 and the second substrate 705. The first substrate 701 and the second substrate 705 are attached to each other with a sealing layer 732.

The liquid crystal element 767 includes a conductive layer 761, a liquid crystal layer 765, and a conductive layer 733. The conductive layer 733 is provided over the first substrate 701. One or more insulating layers are provided over the conductive layer 733, and the conductive layer 761 is provided over the insulating layer(s). Furthermore, the liquid crystal layer 765 is positioned between the conductive layer 761 and the second substrate 705. The conductive layer 733 is electrically connected to a wiring 764 and functions as a common electrode. The conductive layer 761 is electrically connected to the transistor 751 and functions as a pixel electrode. A common potential is applied to the wiring 764.

The liquid crystal element 767 illustrated in FIG. 31 is a liquid crystal element to which a horizontal electric field mode (for example, an FFS mode) is applied. The conductive layer 761 has a comb-like top surface shape or a top surface shape including a slit. In the liquid crystal element 767, the alignment state of the liquid crystal layer 765 is controlled by an electric field generated between the conductive layer 761 and the conductive layer 733.

The capacitor 790 functioning as a storage capacitor is formed of a stacked-layer structure of the conductive layer 761, the conductive layer 733, and one or more insulating layers sandwiched therebetween. Thus, another capacitor need not be provided, and thus the aperture ratio can be increased.

A material that transmits visible light or a material that reflects visible light can be used for the conductive layer 761 and the conductive layer 733. As a light-transmitting material, for example, an oxide material containing indium, zinc, tin, or the like is preferably used. As a reflective material, for example, a material containing aluminum, silver, or the like is preferably used.

When a reflective material is used for one or both of the conductive layer 761 and the conductive layer 733, the display device 700 is a reflective liquid crystal display device. Meanwhile, when a light-transmitting material is used for both of the conductive layer 761 and the conductive layer 733, the display device 700 is a transmissive liquid crystal display device. For a reflective liquid crystal display device, a polarizing plate is provided on the viewer side. By contrast, for a transmissive liquid crystal display device, a pair of polarizing plates is provided such that the liquid crystal element is placed therebetween.

FIG. 31 illustrates an example of a transmissive liquid crystal display device. A polarizing plate 755 and a light source 757 are provided on the outer side of the first substrate 701, and a polarizing plate 756 is provided on the outer side of the second substrate 705. The light source 757 functions as a backlight.

The light-blocking layer 738 and the coloring layer 736 are provided on a surface of the second substrate 705 that is on the first substrate 701 side. The insulating layer 734 functioning as a planarization layer is provided to cover the light-blocking layer 738 and the coloring layer 736. A spacer 727 is provided on a surface of the insulating layer 734 that is on the first substrate 701 side.

The liquid crystal layer 765 is positioned between an alignment film 725 covering the conductive layer 761 and an alignment film 726 covering the insulating layer 734. Note that the alignment film 725 and the alignment film 726 are not necessarily provided when not needed.

Although not illustrated in FIG. 31, an optical member (optical film) such as a retardation film or an anti-reflection film, a protective film, an antifouling film, or the like can be provided on the outer side of the second substrate 705 as appropriate. Examples of the anti-reflection film include an AG (Anti Glare) film and an AR (Anti Reflection) film.

For the liquid crystal layer 765, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be used.

A scattering liquid crystal employing a polymer dispersed liquid crystal, a polymer network liquid crystal, or the like can be used for the liquid crystal layer 765. In this case, monochrome image display may be performed without providing the coloring layer 736, or color display may be performed using the coloring layer 736.

As a method for driving the liquid crystal element, a time-division display method (also referred to as a field-sequential driving method) by which color display is performed by a successive additive color mixing method may be used. In that case, a structure in which the coloring layer 736 is not provided can be employed. In the case where the time-division display method is employed, advantages such as an increase in the aperture ratio of pixels and an increase in resolution can be obtained because it is not necessary to provide subpixels that emit light of, for example, R (red), G (green), and B (blue).

The display device 700 illustrated in FIG. 31 has a structure in which an organic insulating film functioning as a planarization layer is not provided on a surface on which the conductive layer 761 functioning as a pixel electrode or the conductive layer 733 functioning as a common electrode is formed. Moreover, the wiring 764 and the like can be formed with steps common to the manufacturing steps of the transistors, the liquid crystal element, and the like without special steps. With such a structure, the manufacturing cost can be reduced and the manufacturing yield can be increased, so that a display device having high reliability can be provided at low cost.

[Display Device Using Light-Emitting Element]

Figure 32:
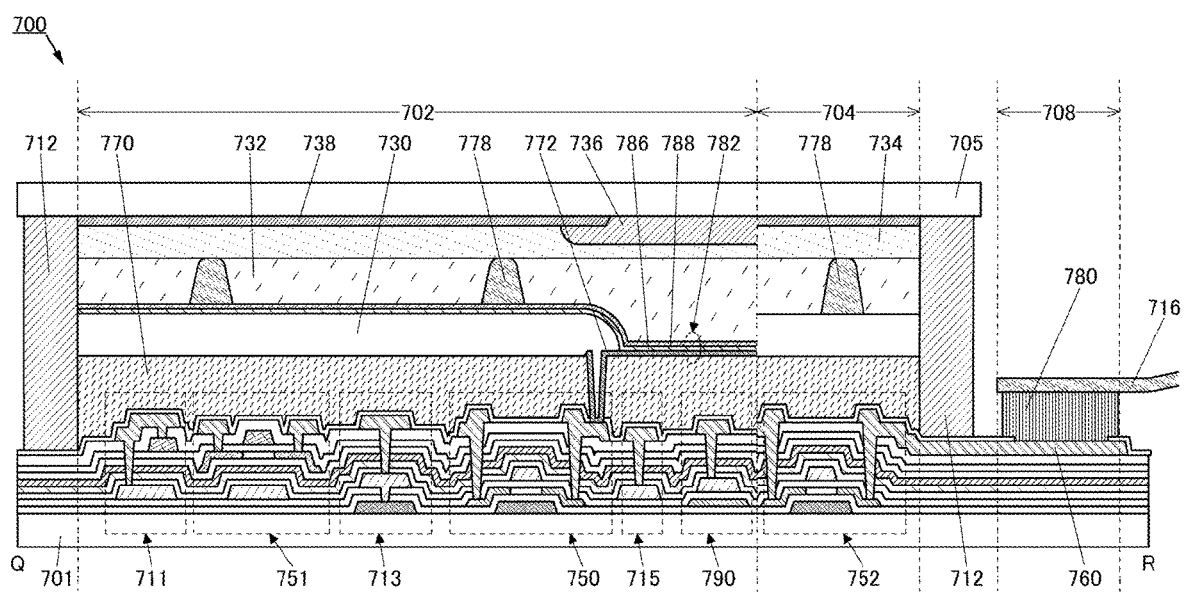
FIG. 32 is a cross-sectional view of a display device.
Figure 33:
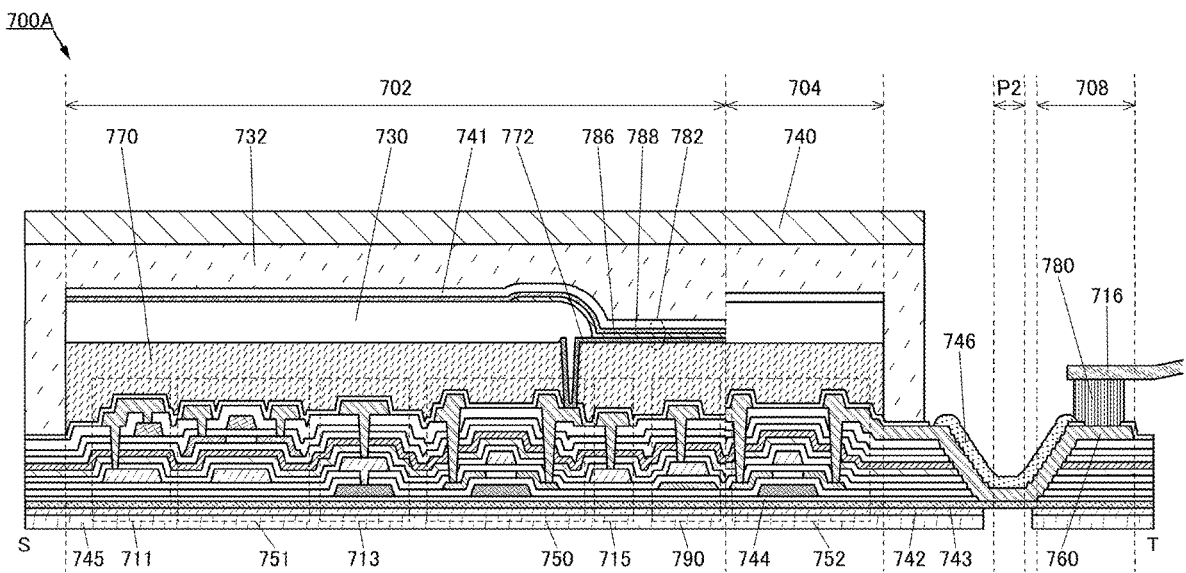
FIG. 33 is a cross-sectional view of a display device.

In the display device 700 illustrated in FIG. 32, the pixel portion 702 includes the transistor 750, the transistor 751, and the capacitor 790. The source driver circuit portion 704 includes the transistor 752.

As the transistor 750, the transistor 751, and the transistor 752, any of the transistors described in Embodiment 1 as examples can be used. For example, an OS transistor is preferably used as the transistor 751, and Si transistors are preferably used as the transistor 750 and the transistor 752.

The display device 700 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 32, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring layer 736 is provided in a position overlapping with the light-emitting element 782, and the light-blocking layer 738 is provided in the source driver circuit portion 704 and a position overlapping with the insulating film 730. The coloring layer 736 and the light-blocking layer 738 are covered with the insulating layer 734. A space between the light-emitting element 782 and the insulating layer 734 is filled with the sealing layer 732. Note that a structure in which the coloring layer 736 is not provided may be employed when the EL layer 786 is formed into an island shape for each pixel or into a stripe shape for each pixel column, i.e., the EL layer 786 is formed by separate coloring.

FIG. 33 illustrates a structure of a display device suitably applicable to a flexible display. FIG. 33 is a cross-sectional view along the dashed-dotted line S-T in the display device 700A in FIG. 28B.

The display device 700A in FIG. 33 has a structure in which a support substrate 745, a bonding layer 742, the resin layer 743, and an insulating layer 744 are stacked instead of the first substrate 701 in FIG. 32. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 33 includes a protective insulating layer 740 instead of the second substrate 705 in FIG. 32. The protective insulating layer 740 is attached to the sealing layer 732. A glass substrate, a resin film, or the like can be used as the protective insulating layer 740. Alternatively, as the protective insulating layer 740, an optical member such as a polarizing plate or a scattering plate, an input device such as a touch sensor panel, or a structure in which two or more of the above are stacked may be employed.

The EL layer 786 included in the light-emitting element 782 is provided in an island shape over the insulating film 730 and the conductive layer 772. The EL layers 786 are formed separately so that respective subpixels emit light of different colors, whereby color display can be performed without use of the coloring layer 736. A protective insulating layer 741 is provided to cover the light-emitting element 782. The protective insulating layer 741 has a function of preventing diffusion of impurities such as water into the light-emitting element 782. The protective insulating layer 741 is preferably formed using an inorganic insulating film. The protective insulating layer 741 further preferably has a stacked-layer structure including one or more inorganic insulating films and one or more organic insulating films.

FIG. 33 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

[Structure Example of Display Device Provided with Input Device]

An input device may be provided in the display device illustrated in FIG. 29 to FIG. 33. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is provided between a pair of substrates, what is called an on-cell touch panel in which an input device is formed over the display device, and what is called an out-cell touch panel in which an input device is attached to the display device.

At least part of the structure examples, the drawings corresponding thereto, and the like described in this embodiment can be implemented in combination with the other structure examples, the other drawings, and the like as appropriate.

At least part of this embodiment can be implemented in combination with any of the other embodiments described in this specification as appropriate.

Embodiment 4

In this embodiment, a display device that includes the semiconductor device of one embodiment of the present invention will be described with reference to FIG. 34.

A display device illustrated in FIG. 34A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. The source driver 504b is configured using a plurality of analog switches, for example. Alternatively, the source driver 504b may be configured using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 34A is connected to a variety of wirings such as the gate lines GL_1 to GL_X that are wirings between the gate driver 504a and the pixel circuits 501 and the data lines DL_1 to DL_Y that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

The plurality of pixel circuits 501 illustrated in FIG. 34A can have a structure illustrated in FIG. 34B or FIG. 34C, for example.

The pixel circuit 501 illustrated in FIG. 34B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set as appropriate in accordance with the specifications of the pixel circuit 501. The alignment state in the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 34C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that a high power supply potential (VDD) is supplied to one of the potential supply line VL_a and the potential supply line VL_b, and a low power supply potential (VS S) is supplied to the other. The current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in appropriate combination with the other embodiments described in this specification.

Embodiment 5

A pixel circuit including a memory for correcting gray levels displayed by pixels and a display device including the pixel circuit will be described below. The transistor described in Embodiment 1 can be used as a transistor used in the pixel circuit described below.

<Circuit Structure>

FIG. 35A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node that connects the transistor M1 and the capacitor C1 is denoted as a node N1, and a node that connects the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Operation Method Example

Next, an example of a method for operating the pixel circuit 400 is described with reference to FIG. 35B. FIG.

35B is a timing chart of the operation of the pixel circuit 400. Note that for simplification of description, the influence of various kinds of resistance such as wiring resistance, parasitic capacitance of a transistor, a wiring, and the like, the threshold voltage of the transistor, and the like is not taken into account here.

In the operation illustrated in FIG. 35B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential V w is supplied to the wiring S2.

The potential $V_{ref}$ is supplied from the wiring S1 to the node N1 through the transistor M1. The first data potential V w is supplied from the wiring S2 to the node N2 through the transistor M2. Thus, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 by a potential dV in accordance with the second data potential $V_{data}$. That is, a potential that is the sum of the first data potential V w and the potential dV is input to the circuit 401. Note that although dV is illustrated as a positive value in FIG. 35B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high dynamic range (HDR) display or the like can be performed. In the case of using a liquid crystal element, overdriving or the like can be achieved.

APPLICATION EXAMPLES

[Example Using Liquid Crystal Element]

A pixel circuit 400LC illustrated in FIG. 35C includes a circuit 401LC. The circuit 401LC includes a liquid crystal element LC and a capacitor C2.

In the liquid crystal element LC, one electrode is connected to the other electrode of the capacitor C1, the other of the source and the drain of the transistor M2, and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

A pixel circuit 400EL illustrated in FIG. 35D includes a circuit 401EL. The circuit 401EL includes a light-emitting element EL, a transistor M3, and the capacitor C2.

In the transistor M3, a gate is connected to one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, variations in the electrical characteristics of the transistor M3 and the light-emitting element EL can be corrected by supply of a correction signal to the wiring S1 or the wiring S2.

Note that the structure is not limited to the circuits illustrated in FIG. 35C and FIG. 35D, and a structure to which a transistor, a capacitor, or the like is further added may be employed.

At least part of this embodiment can be implemented in appropriate combination with the other embodiments described in this specification.

Embodiment 6

In this embodiment, a display module that can be fabricated using one embodiment of the present invention will be described.

Figure 36A:
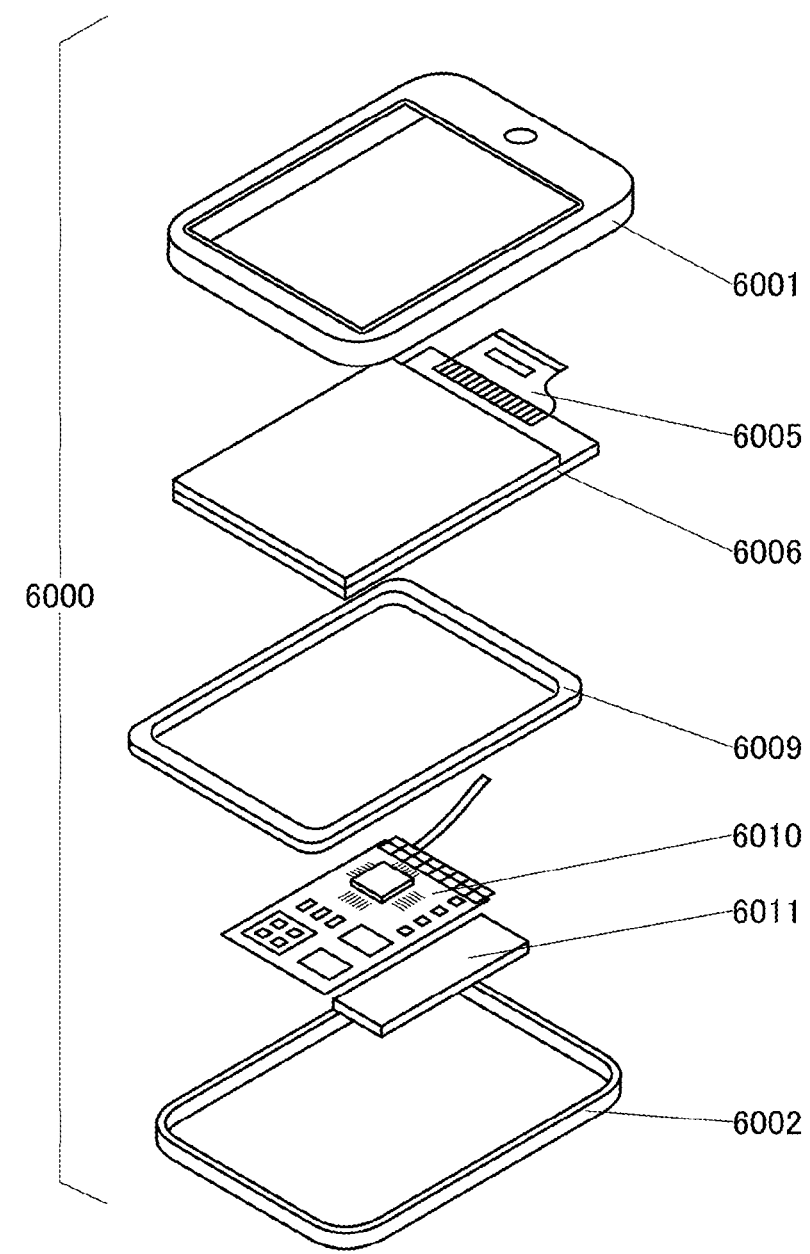
FIG. 36A is a diagram illustrating a structure example of a display module.

In a display module 6000 illustrated in FIG. 36A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 36B:
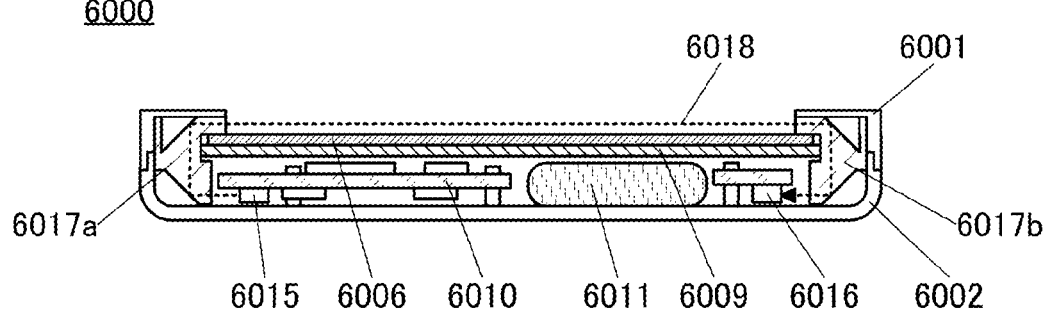
FIG. 36B is a schematic cross-sectional view of the display module.

FIG. 36B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) is provided in a region surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b that transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used, a malfunction of the touch sensor can be more effectively inhibited.

At least part of this embodiment can be implemented in appropriate combination with the other embodiments described in this specification.

Embodiment 7

In this embodiment, an example of an electronic device in which the display device of one embodiment of the present invention can be used will be described.

Figure 37A:
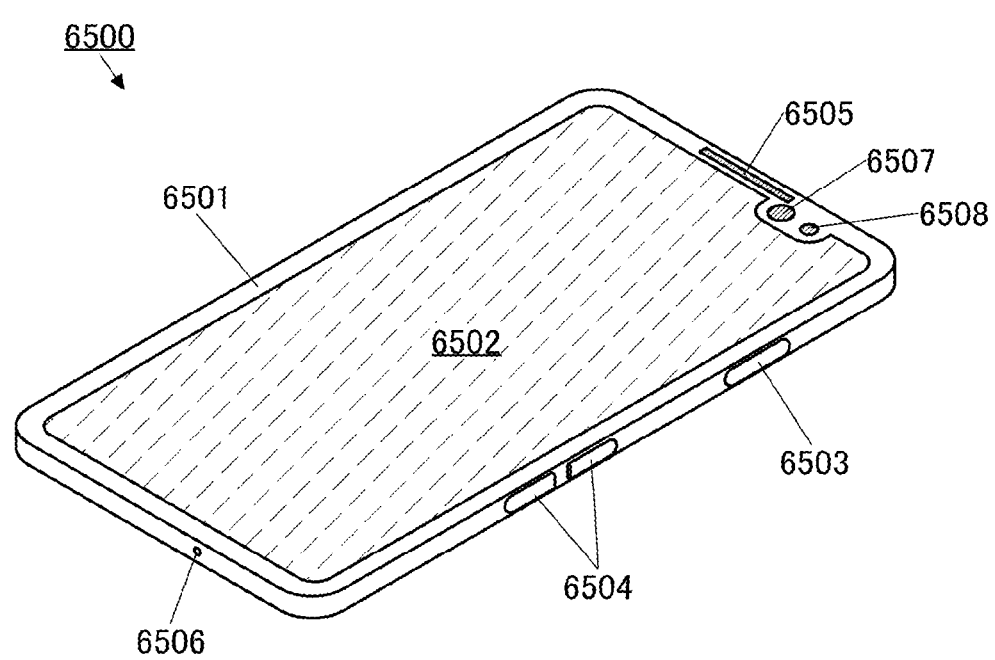
FIG. 37A is a diagram illustrating a structure example of an electronic device.

An electronic device 6500 illustrated in FIG. 37A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 37B:
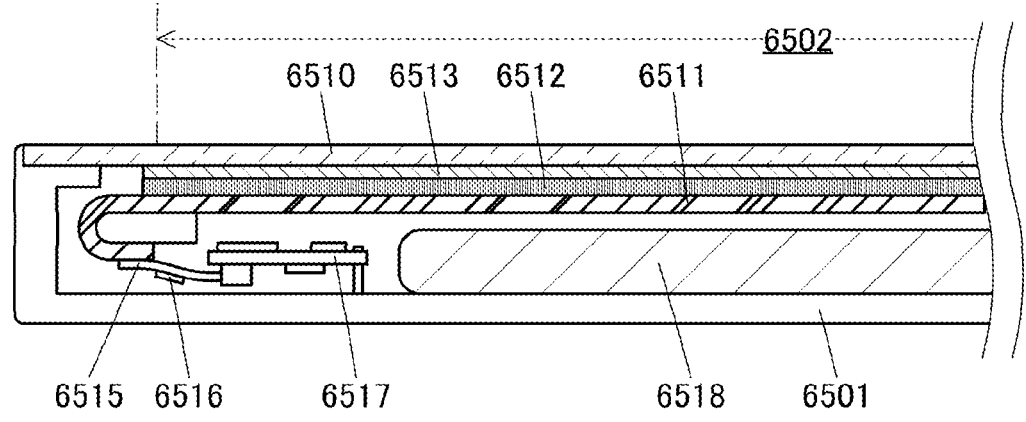
FIG. 37B is a schematic cross-sectional view of the electronic device.

FIG. 37B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided on the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. An electronic device with a narrow frame can be obtained when part of the display panel 6511 is bent back so that the portion connected to the FPC 6515 is positioned on the back side of a pixel portion.

At least part of this embodiment can be implemented in appropriate combination with the other embodiments described in this specification.

Embodiment 8

In this embodiment, electronic devices each including a display device manufactured using one embodiment of the present invention will be described.

Electronic devices exemplified below include the display device of one embodiment of the present invention in a display portion. Thus, the electronic devices achieve high definition. In addition, the electronic devices can achieve both high definition and a large screen.

The display portion of the electronic device of one embodiment of the present invention can display a video with a definition of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

FIG. 38A is a diagram illustrating the appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video and the like received from the camera 8000 on the display portion 8102.

The button 8103 has a function of a power button or the like.

The display device of one embodiment of the present invention can be used in the display portion 8002 of the camera 8000 and the display portion 8102 of the finder 8100. Note that a finder may be incorporated in the camera 8000.

FIG. 38B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and information on the movement of the user's eyeball and eyelid can be used as an input means.

The mounting portion 8201 may include a plurality of electrodes capable of sensing a current flowing in response to the movement of the user's eyeball in a position in contact with the user, to have a function of recognizing the user's line of sight. A function of monitoring the user's pulse with the use of a current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used in the display portion 8204.

FIG. 38C, FIG. 38D, and FIG. 38E are diagrams illustrating the appearance of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that the display portion 8302 is preferably placed to be curved, in which case the user can feel a high realistic sensation. When another image displayed in a different region of the display portion 8302 is viewed through the lenses 8305, three-dimensional display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has extremely high resolution; thus, even when a video is magnified using the lenses 8305 as in FIG. 38E, the user does not perceive pixels, and a more realistic video can be displayed.

Electronic devices illustrated in FIG. 39A to FIG. 39G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 39A to FIG. 39G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 39A to FIG. 39G are described below.

FIG. 39A is a perspective view illustrating a television device 9100. The television device 9100 can include the display portion 9001 having a large screen size of, for example, 50 inches or more, or 100 inches or more.

FIG. 39B is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters and image information on its plurality of surfaces. FIG. 39B illustrates an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed at the position where the information 9051 is displayed.

FIG. 39C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 39D is a perspective view illustrating a watch-type portable information terminal 9200. The portable information terminal 9200 can be used as a smartwatch (registered trademark), for example. A display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIG. 39E, FIG. 39F, and FIG. 39G are perspective views illustrating a foldable portable information terminal 9201. FIG. 39E is a perspective view of an opened state of the portable information terminal 9201, FIG. 39G is a perspective view of a folded state thereof, and FIG. 39F is a perspective view of a state in the middle of change from one of FIG. 39E and FIG. 39G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figures 40A, 40B, 40C, 40D:
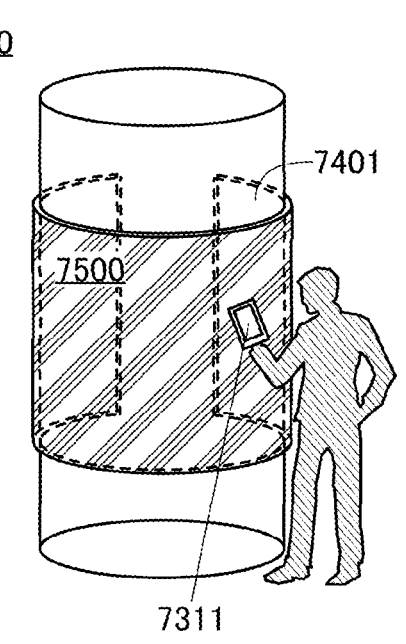
FIG. 40A, FIG. 40B, FIG. 40C, and FIG. 40D are diagrams illustrating structure examples of electronic devices.

FIG. 40A illustrates an example of a television device. In a television device 7100, a display portion 7500 is incorporated in a housing 7101. Here, a structure in which the housing 7101 is supported by a stand 7103 is illustrated.

The television device 7100 illustrated in FIG. 40A can be operated with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for network connection.

FIG. 40B illustrates a laptop personal computer 7200. The laptop personal computer 7200 includes a housing 7211, a keyboard 7212, a pointing device 7213, an external connection port 7214, and the like. The display portion 7500 is incorporated into the housing 7211.

FIG. 40C and FIG. 40D illustrate examples of digital signage.

Digital signage 7300 illustrated in FIG. 40C includes a housing 7301, the display portion 7500, a speaker 7303, and the like. Furthermore, an LED lamp, operation keys (including a power switch or an operation switch), a connection terminal, a variety of sensors, a microphone, and the like can be included.

FIG. 40D illustrates digital signage 7400 attached to a cylindrical pillar 7401. The digital signage 7400 includes the display portion 7500 provided along a curved surface of the pillar 7401.

A larger display portion 7500 can increase the amount of information that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIG. 40C and FIG. 40D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or the display on the display portion 7500 can be switched by an operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIG. 40A to FIG. 40D.

The electronic devices of this embodiment each include a display portion; however, one embodiment of the present invention can also be used in an electronic device without a display portion.

At least part of this embodiment can be implemented in appropriate combination with the other embodiments described in this specification.

REFERENCE NUMERALS

C1: capacitor, C2: capacitor, DL_n: data line, DL_Y: data line, DL_1: data line, EL: light-emitting element, G1: wiring, G2: wiring, GL_m: gate line, GL_X: gate line, GL_1: gate line, LC: liquid crystal element, M1: transistor, M2: transistor, M3: transistor, N1: node, N2: node, P1: region, P2: region, S1: wiring, S2: wiring, T1: period, T2: period, 10: semiconductor device, 10A: semiconductor device, 10B: semiconductor device, 10C: semiconductor device, 10D: semiconductor device, 10E: semiconductor device, 10F: semiconductor device, 10G: semiconductor device, 10H: semiconductor device, 10I: semiconductor device, 10J: semiconductor device, 12: semiconductor device, 12A: semiconductor device, 12B: semiconductor device, 12C: semiconductor device, 12D: semiconductor device, 12E: semiconductor device, 12F: semiconductor device, 14: semiconductor device, 14A: semiconductor device, 14B: semiconductor device, 14C: semiconductor device, 14D: semiconductor device, 14E: semiconductor device, 14F: semiconductor device, 14G: semiconductor device, 14H: semiconductor device, 16: semiconductor device, 16A: semiconductor device, 16B: semiconductor device, 16C: semiconductor device, 16D: semiconductor device, 16E: semiconductor device, 16F: semiconductor device, 20: transistor, 20A: transistor, 20B: transistor, 20C: transistor, 20D: transistor, 20E: transistor, 20F: transistor, 22: transistor, 22A: transistor, 22B: transistor, 22C: transistor, 24: transistor, 24A: transistor, 26: transistor, 26A: transistor, 26B: transistor, 30: transistor, 30A: transistor, 30B: transistor, 34: transistor, 34A: transistor, 102: substrate, 103: insulating layer, 103a: insulating layer, 103b: insulating layer, 103c: insulating layer, 103d: insulating layer, 105: conductive layer, 106: conductive layer, 107: conductive layer, 108: semiconductor layer, 108f: metal oxide film, 108i: region, 108n: region, 109: conductive layer, 110: insulating layer, 110a: insulating layer, 112: conductive layer, 118: insulating layer, 120a: conductive layer, 120A: conductive layer, 120b: conductive layer, 120B: conductive layer, 133: insulating layer, 135: insulating layer, 137: insulating layer, 141a: opening portion, 141b: opening portion, 151a: conductive layer, 151b: conductive layer, 153: conductive layer, 153A: conductive layer, 153B: conductive layer, 193: target, 194: plasma, 306: conductive layer, 308: semiconductor layer, 308a: amorphous film, 308i: region, 308n: region, 308p: semiconductor film, 312a: conductive layer, 312b: conductive layer, 315: conductive layer, 317a: conductive layer, 317b: conductive layer, 320a: conductive layer, 320A: conductive layer, 320b: conductive layer, 320B: conductive layer, 341a: opening portion, 341b: opening portion, 343a: opening portion, 343b: opening portion, 351a: conductive layer, 351b: conductive layer, 353a: conductive layer, 353A: conductive layer, 353b: conductive layer, 353B: conductive layer, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 600: semiconductor device, 600A: semiconductor device, 600B: semiconductor device, 600C: semiconductor device, 602: semiconductor device, 602A: semiconductor device, 604: semiconductor device, 604A: semiconductor device, 620: transistor, 620A: transistor, 620B: transistor, 620C: transistor, 622: transistor, 622A: transistor, 624: transistor, 624A: transistor, 630: transistor, 630A: transistor, 630B: transistor, 630C: transistor, 632: transistor, 632A: transistor, 634: transistor, 634A: transistor, 700: display device, 700A: display device, 700B: display device, 701: first substrate, 702: pixel portion, 704: source driver circuit portion, 705: second substrate, 706: gate driver circuit portion, 708: FPC terminal portion, 710: signal line, 711: connection portion, 712: sealant, 713: connection portion, 715: connection portion, 716: FPC, 717: IC, 721: source driver IC, 722: gate driver circuit portion, 723: FPC, 724: printed circuit board, 725: alignment film, 726: alignment film, 727: spacer, 730: insulating film, 732: sealing layer, 733: conductive layer, 734: insulating layer, 736: coloring layer, 738: light-blocking layer, 740: protective insulating layer, 741: protective insulating layer, 742: bonding layer, 743: resin layer, 744: insulating layer, 745: support substrate, 746: resin layer, 750: transistor, 751: transistor, 752: transistor, 755: polarizing plate, 756: polarizing plate, 757: light source, 760: wiring, 761: conductive layer, 764: wiring, 765: liquid crystal layer, 767: liquid crystal element, 770: planarization insulating film, 772: conductive layer, 773: insulating layer, 774: conductive layer, 775: liquid crystal element, 776: liquid crystal layer, 778: spacer, 780: anisotropic conductive film, 782: light-emitting element, 786: EL layer, 788: conductive film, 790: capacitor, 812: moving mechanism, 813: moving mechanism, 815: stage, 816: ball screw mechanism, 820: laser oscillator, 821: optical system unit, 822: mirror, 823: condenser lens, 825: laser light, 826: laser light, 827: linear beam, 840: process object, 841: glass substrate, 842:

amorphous silicon layer, 843: polycrystalline silicon layer, 845: glass substrate, 846: resin layer, 847: structure object, 848: processed region, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: buttons, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lenses, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal This application is based on Japanese Patent Application Serial No. 2020-050364 filed on Mar. 20, 2020, the entire contents are hereby incorporated herein by reference.

The invention claimed is:

1. A semiconductor device comprising:
   a first semiconductor layer, a second semiconductor layer, a first conductive layer, a second conductive layer, a first insulating layer, a second insulating layer, a third insulating layer, and a fourth insulating layer,
   wherein the first semiconductor layer comprises a metal oxide,
   wherein the second semiconductor layer comprises crystalline silicon,
   wherein, in a first region, the second conductive layer and the second semiconductor layer overlap with each other with the fourth insulating layer therebetween,
   wherein the first insulating layer is positioned over the second semiconductor layer,
   wherein the second insulating layer is positioned over the first insulating layer,
   wherein the first semiconductor layer is positioned over the second insulating layer,
   wherein, in a second region, the first conductive layer and the first semiconductor layer overlap with each other with the third insulating layer therebetween, and
   wherein the second insulating layer has a lower hydrogen concentration than the first insulating layer.

2. The semiconductor device according to claim 1,
   wherein the hydrogen concentration is obtained by secondary ion mass spectrometry.

3. The semiconductor device according to claim 1,
wherein, in the second region, the first semiconductor
layer includes a channel formation region, and
wherein a sheet resistance of the channel formation region
is higher than or equal to $1\times10^7$ $\Omega$/square.

4. The semiconductor device according to claim 1,
wherein the first semiconductor layer comprises indium
and zinc.

5. The semiconductor device according to claim 1,
wherein, in a third region, the first conductive layer and
the first semiconductor layer do not overlap with each
other, and
wherein, in the third region, the first semiconductor layer
comprises at least one of hydrogen, boron, carbon,
nitrogen, fluorine, phosphorus, sulfur, arsenic, alumi-
num, magnesium, helium, neon, argon, krypton, and
xenon.

6. The semiconductor device according to claim 1,
wherein the second insulating layer comprises nitrogen.

7. A semiconductor device comprising:
a first semiconductor layer, a second semiconductor layer,
a first conductive layer, a second conductive layer, a
third conductive layer, a first insulating layer, a second
insulating layer, a third insulating layer, and a fourth
insulating layer,
wherein the first semiconductor layer comprises a metal
oxide,
wherein the second semiconductor layer comprises crys-
talline silicon,
wherein the second conductive layer is positioned over
the second semiconductor layer,
wherein, in a first region, the second conductive layer and
the second semiconductor layer overlap with each other
with the fourth insulating layer therebetween,
wherein the first semiconductor layer is positioned over
the third conductive layer,
wherein the third conductive layer and the first semicon-
ductor layer overlap with each other,
wherein the first insulating layer is positioned over the
second semiconductor layer,
wherein the second insulating layer is positioned over the
first insulating layer,
wherein the first semiconductor layer is positioned over
the second insulating layer,
wherein, in a second region, the first conductive layer and
the first semiconductor layer overlap with each other
with the third insulating layer therebetween, and
wherein the second insulating layer has a lower hydrogen
concentration than the first insulating layer.

8. The semiconductor device according to claim 7,
wherein the hydrogen concentration is obtained by sec-
ondary ion mass spectrometry.

9. The semiconductor device according to claim 7,
wherein, in the second region, the first semiconductor
layer includes a channel formation region, and
wherein a sheet resistance of the channel formation region
is higher than or equal to $1\times10^7$ $\Omega$/square.

10. The semiconductor device according to claim 7,
wherein the first semiconductor layer comprises indium
and zinc.

11. The semiconductor device according to claim 7,
wherein, in a third region, the first conductive layer and
the first semiconductor layer do not overlap with each
other, and
wherein, in the third region, the first semiconductor layer
comprises at least one of hydrogen, boron, carbon, nitrogen, fluorine, phosphorus, sulfur, arsenic, alumi-
num, magnesium, helium, neon, argon, krypton, and
xenon.

12. The semiconductor device according to claim 7,
wherein the second insulating layer comprises nitrogen.

13. A semiconductor device comprising:
a first semiconductor layer, a second semiconductor layer,
a first conductive layer, a second conductive layer, a
third conductive layer, a first insulating layer, a second
insulating layer, a third insulating layer, and a fourth
insulating layer,
wherein the first semiconductor layer comprises a metal
oxide,
wherein the second semiconductor layer comprises crys-
talline silicon,
wherein the second conductive layer is positioned over
the second semiconductor layer,
wherein, in a first region, the second conductive layer and
the second semiconductor layer overlap with each other
with the fourth insulating layer therebetween,
wherein the first semiconductor layer is positioned over
the third conductive layer,
wherein the third conductive layer and the first semicon-
ductor layer overlap with each other,
wherein the first insulating layer is positioned over the
second semiconductor layer,
wherein the second insulating layer is positioned over the
first insulating layer,
wherein the first semiconductor layer is positioned over
the second insulating layer,
wherein, in a second region, the first conductive layer and
the first semiconductor layer overlap with each other
with the third insulating layer therebetween,
wherein the second conductive layer and the third con-
ductive layer are in contact with a top surface of the
fourth insulating layer, and
wherein the second insulating layer has a lower hydrogen
concentration than the first insulating layer.

14. The semiconductor device according to claim 13,
wherein the hydrogen concentration is obtained by sec-
ondary ion mass spectrometry.

15. The semiconductor device according to claim 13,
wherein, in the second region, the first semiconductor
layer includes a channel formation region, and
wherein a sheet resistance of the channel formation region
is higher than or equal to $1\times10^7$ $\Omega$/square.

16. The semiconductor device according to claim 13,
wherein the first semiconductor layer comprises indium
and zinc.

17. The semiconductor device according to claim 13,
wherein, in a third region, the first conductive layer and
the first semiconductor layer do not overlap with each
other, and
wherein, in the third region, the first semiconductor layer
comprises at least one of hydrogen, boron, carbon,
nitrogen, fluorine, phosphorus, sulfur, arsenic, alumi-
num, magnesium, helium, neon, argon, krypton, and
xenon.

18. The semiconductor device according to claim 13,
wherein the second insulating layer comprises nitrogen.

* * * * *